(12) United States Patent
Kodama et al.

(10) Patent No.: US 6,927,009 B2
(45) Date of Patent: *Aug. 9, 2005

(54) POSITIVE PHOTOSENSITIVE COMPOSITION

(75) Inventors: Kunihiko Kodama, Shizuoka (JP); Kenichiro Sato, Shizuoka (JP); Toru Fujimori, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 75 days.

This patent is subject to a terminal disclaimer.

(21) Appl. No.: 10/150,967

(22) Filed: May 21, 2002

(65) Prior Publication Data

US 2003/0077540 A1 Apr. 24, 2003

(30) Foreign Application Priority Data

| May 22, 2001 | (JP) | ........................... P. 2001-152587 |
| May 24, 2001 | (JP) | ........................... P. 2001-155897 |
| May 28, 2001 | (JP) | ........................... P. 2001-159060 |

(51) Int. Cl.$^7$ ............................................. G03F 7/004
(52) U.S. Cl. .................... 430/270.1; 430/910; 430/914; 430/921; 430/922
(58) Field of Search .............................. 430/270.1, 910, 430/914, 921, 920

(56) References Cited

U.S. PATENT DOCUMENTS

| 6,054,254 A | | 4/2000 | Sate et al. | |
| 6,114,086 A | * | 9/2000 | Kobayashi et al. | ...... 430/270.1 |
| 6,159,656 A | * | 12/2000 | Kawabe et al. | .......... 430/270.1 |

FOREIGN PATENT DOCUMENTS

| EP | 0 846 681 A1 | | 6/1998 | |
| EP | 1 041 422 A1 | | 10/2000 | |
| JP | 2000-275845 A | | 10/2000 | |
| JP | 2000-292917 A | | 10/2000 | |
| JP | 2001-109154 A | | 4/2001 | |
| JP | 100 54 550 A1 | | 5/2001 | |
| JP | 2001-294570 | * | 10/2001 | ........... G03F/7/004 |
| JP | 2002-146333 A | | 5/2002 | |

OTHER PUBLICATIONS

English language machine translation of JP 2001–294570.*
European Search Report dated Aug. 23, 2002.

* cited by examiner

*Primary Examiner*—Amanda Walke
(74) *Attorney, Agent, or Firm*—Sughrue Mion, PLLC

(57) ABSTRACT

A positive photosensitive composition comprising (A) a specific acid generator that generates an acid upon irradiation of an actinic ray or radiation, and (B) a resin that has a monocyclic or polycyclic alicyclic hydrocarbon structure and is decomposed by the action of an acid to increase solubility in an alkali developing solution.

14 Claims, No Drawings

POSITIVE PHOTOSENSITIVE COMPOSITION

FIELD OF THE INVENTION

The present invention relates to a positive photosensitive composition used in the production process of semiconductor devices, for example, IC, in the production of circuit substrates for liquid crystals or thermal heads, in an ultramicrolithography process, for example, the production of VLSI and high capacity microtips, and in other photofabrication processes. More specifically, the present invention pertains to a positive photosensitive composition suitable for use a far ultraviolet ray of not more than 250 nm as a light source for exposure.

BACKGROUND OF THE INVENTION

The degree of integration of integrated circuits has recently become much higher, and the processing of superfine patterns having a line width of a half micron or below is required in the production of semiconductor substrate for VSLI. In order to meet such a requirement, a wavelength of light source used in an exposure apparatus for photolithography becomes shorter, and nowadays the use of an excimer laser beam (e.g., XeCl, KrF or ArF) in a short wavelength region of a far ultraviolet ray is investigated.

As a resist for use in the pattern formation by the photolithography in such a wavelength region, a chemically amplified resist is known.

A chemically amplified positive resist composition is a pattern formation material in which an acid is generated in the exposed area upon irradiation of radiation, for example, a far ultraviolet ray, and solubility in a developer between the exposed area and unexposed area is differentiated by a reaction using the acid as a catalyst, whereby a pattern is formed on a substrate.

In general, the chemically amplified resist is roughly divided into three types, the so-called two-component, two point five-component and three-component types. The chemically amplified resist of two-component type comprises a combination of a compound (hereinafter referred to as a "photo-acid generator" sometimes) capable of generating an acid by photolysis with a binder resin. The binder resin combined with the photo-acid generator is a resin having in its molecule, a group (hereinafter referred to as an "acid-decomposable group" sometimes) capable of being decomposed by the action of an acid to increase the solubility of resin in an alkali developing solution. The resist of two point five-component type further contains a low molecular weight compound having an acid-decomposable group in addition to the above described two components. The resist of three-component type contains a photo-acid generator, an alkali-soluble resin and the low molecular weight compound described above.

Although the chemically amplified resist described above is a photoresist suitable for exposure to an ultraviolet ray or a far ultraviolet ray, it is still necessary for the resist to meet requirements for characteristics from the standpoint of practical use.

Since the composition is mainly composed of a resin having as a basic skeleton, poly(hydroxystyrene) that has a small absorption in a region of 248 nm, a good pattern with high sensitivity and high resolution is formed, when a KrF excimer laser is used as a light source for exposure. Thus, the composition is superior to a conventional resist composition using a naphthoquinonediazide/novolac resin.

When a light source having a shorter wavelength, e.g., an ArF excimer laser (193 nm) is used for exposure, on the other hand, since an aromatic group-containing compound essentially has a large absorption in a region of 193 nm, the above-described chemically amplified composition is still insufficient.

The use of poly(meth)acrylate as a polymer having a small absorption in a wavelength range of 193 nm is described in *J. Vac. Sci. Technol.*, B9, 3357(1991). The polymer has, however, a problem in that resistance to dry etching ordinarily performed in a semiconductor production process is low in comparison with conventional phenolic resins having an aromatic group.

Further, as a photoresist composition for an ArF light source, a resin into which an alicyclic hydrocarbon moiety is proposed for the purpose of improving dry etching resistance. However, the introduction of alicyclic hydrocarbon moiety is accompanied with a problem in that a system including the resin becomes extremely hydrophobic, and it is difficult to perform development with an aqueous solution of tetramethylammonium hydroxide (hereinafter referred to as TMAH sometimes), which has hitherto been widely employed as a developer for resist. Also, a phenomenon of releasing the resist film from a substrate during the development is observed.

In response to the increase in the hydrophobic property of resist, an attempt has been made that an organic solvent, for example, isopropyl alcohol is added to the developer. Although the good result is recognized to a certain extent, other problems, for example, fear of swelling the resist film and complexity of the process arise. Thus, the problem is not always solved. As to an approach to improvement in the resist, many attempts of compensation for the various hydrophobic alicyclic hydrocarbon moieties by the introduction of hydrophilic groups have been made.

An energy-susceptive resist material containing a polymer obtained by polymerization of a monomer having an alicyclic structure, for example, a norbornene ring in the main chain, maleic anhydride and a monomer having a carboxylic acid is described in JP-A-10-10739 (the term "JP-A" as used herein means an "unexamined published Japanese patent application"). A radiation-sensitive resin composition containing a resin having an alicyclic skeleton in the main chain and a radiation-sensitive acid generator is described in JP-A-10-111569. A radiation-sensitive material comprising a resin having an alicyclic functional group containing a polar group and an acid-decomposable group is described in JP-A-11-109632.

A photoresist composition containing a copolymer obtained by polymerization of a (meth)acrylate derivative having a lactone structure with another polymerizable compound is described in Japanese Patent 3,042,618.

As described above, a resin having an acid-decomposable group, which is used in a photoresist for exposure to a far ultraviolet ray, ordinarily has also an aliphatic cyclic hydrocarbon group in the molecule. As a result, the resin becomes hydrophobic and the problems resulting from the hydrophilicity occur. Although the various methods described above have been investigated in order to solve these problems, the results obtained by these methods are still insufficient and further improvement is desired.

Also, a triarylsulfonium salt acid generator and a phenacylsulfonium salt acid generator are known as acid generators for chemically amplified positive resist composition. However, these acid generators are low in sensitivity, since the triarylsulfonium salt acid generator has a large absorption at a wavelength of 193 nm and the phenacylsulfonium salt acid generator is inferior in the acid-generating property.

Further, an acid generator mixture of a specific sulfonium salt (an anion having from 1 to 15 carbon atoms) and a triarylsulfonium salt is described in JP-A-2000-292917, a combination of a triphenylsulfonium salt of a perfluoroalkanesulfonic acid having from 4 to 8 carbon atoms and a 2-alkyl-2-adamantyl(meth)acrylate is described in JP-A-2000-275845, and an acid generator mixture of a specific sulfonium salt (an anion having from 1 to 8 carbon atoms) and a triphenylsulfonium salt or iodonium salt of a perfluoroalkanesulfonic acid having from 4 to 8 carbon atoms is described in EP 11041,442A.

It is the common practice to use modified illumination or a phase shift mask in order to satisfy a further miniaturization tendency of patterns. Annular illumination has been used for the formation of line and space patterns, while a halftone phase shift mask has been used for the formation of contact holes.

When the annular illumination is used, high resolution and a broad defocus latitude are requested. The term "broad defocus latitude" means that fluctuation in line width due to defocus is small.

When the halftone phase shift mask is used, the pattern portions are dissolved by slight transmitted light, thereby causing a problem of sidelobe. It is also desired to solve the problem of sidelobe.

According to the request on the miniaturization of semiconductor chips in recent years, patterns of semiconductor reach to a fine range of from 0.13 to 0.35 μm. However, conventional resist compositions have a problem in that the resolution of pattern is poor owing to factors, for example, edge roughness of line pattern. The term "line edge roughness" used herein means unevenness of edge which results from irregular fluctuation of an edge of top portion and an edge of bottom portion in the direction vertical to the line due to the characteristics of resist, when the pattern is observed from just above.

Moreover, there are other problems of hole pitch dependency, exposure margin and fluctuation of sensitivity during preservation with the lapse of time. Also, a problem in that PED stability with the lapse of time in or out of an exposure apparatus degrades and the pattern size is changed occurs. The term "PED stability" used herein means stability of a coated film when the coated film is allowed to stand after the exposure in or out of the exposure apparatus until conducting a heat treatment.

A positive photoresist composition containing an acid-decomposable resin having a specific lactone structure is described in JP-A-2001-109154. The positive photoresist composition has high sensitivity and high resolution and is excellent in the edge roughness of pattern. However, when it is used together with a photo-acid generator conventionally used, exposure margin and development defect are poor, and further improvement has been desired.

SUMMARY OF THE INVENTION

Therefore, an object of the present invention is to provide a positive photosensitive composition that has high sensitivity and a broad defocus latitude in case of the pattern formation using an annular illumination, and hardly causes the sidelobe in case of the pattern formation using a halftone phase shift mask.

Another object of the present invention is to provide a positive photosensitive composition that has high sensitivity and is improved in the edge roughness of pattern.

A further object of the present invention is to provide a positive photosensitive composition that is excellent in the exposure margin and development defect.

Other objects of the present invention will become apparent from the following description.

The above-described objects of the present invention are accomplished by the positive photosensitive compositions described below.

1. A positive photosensitive composition comprising (A) an acid generator, which generates an acid upon irradiation of an actinic ray or radiation, represented by formula (I) shown below, and (B) a resin that has a monocyclic or polycyclic alicyclic hydrocarbon structure and is decomposed by the action of an acid to increase a solubility rate in an alkali developing solution.

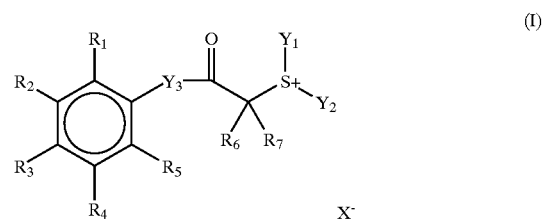

(I)

In formula (I), $R_1$ to $R_5$, which may be the same or different, each represent a hydrogen atom, an alkyl group, an alkoxy group, a nitro group, a halogen atom, an alkoxycarbonyl group or an aryl group, or at least two of $R_1$ to $R_5$ may be combined with each other to form a ring structure; $R_6$ and $R_7$, which may be the same or different, each represent a hydrogen atom, an alkyl group, a cyano group or an aryl group; $Y_1$ and $Y_2$, which may be the same or different, each represent an alkyl group, an aryl group, an aralkyl group or an aromatic group containing a hetero atom, or $Y_1$ and $Y_2$ may be combined with each other to form a ring; $Y_3$ represents a single bond or a divalent connecting group; and $X^-$ represents a non-nucleophilic anion; provided that at least one of $R_1$ to $R_5$ and at least one of $Y_1$ and $Y_2$ are combined with each other to form a ring or at least one of $R_1$ to $R_5$ and at least one of $R_6$ and $R_7$ are combined with each other to form a ring; and any of $R_1$ to $R_7$ and $Y_1$ to $Y_2$ may be bonded through a connecting group to form a compound having two or more structures represented by formula (I).

2. The positive photosensitive composition as described in item (1) above, wherein the acid generator of component (A) is a compound represented by the following formula (IA) or (IB):

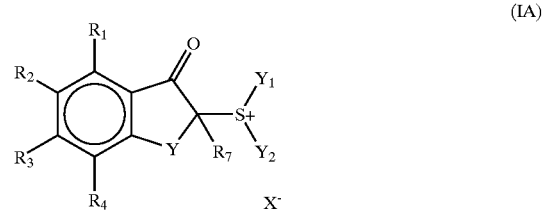

(IA)

-continued

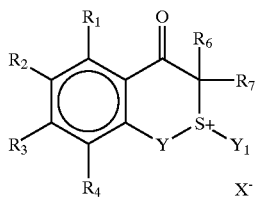
(IB)

In formulae (IA) and (IB) $R_1$ to $R_4$, $R_6$, $R_7$, $Y_1$, $Y_2$ and $X^-$ have the same meanings as defined in formula (I), respectively; and Y represents a single bond or a divalent connecting group.

3. The positive photosensitive composition as described in item (1) above, wherein the positive photosensitive composition further comprises (C) a basic compound.

4. The positive photosensitive composition as described in item (3) above, wherein the basic compound of component (C) is a compound having a structure selected from an imidazole structure, a diazabicyclo structure, an onium hydroxide structure and an onium carboxylate structure.

5. The positive photosensitive composition as described in item (3) above, wherein the basic compound of component (C) is a compound selected from a primary aliphatic amine, a secondary aliphatic amine, a tertiary aliphatic amine, a primary oxygen-containing aliphatic amine, a secondary oxygen-containing aliphatic amine, a tertiary oxygen-containing aliphatic amine, an alcoholic nitrogen-containing compound and a substituted aniline.

6. The positive photosensitive composition as described in item (1) above, wherein the resin of component (B) contains an aliphatic cyclic hydrocarbon group and a repeating unit having a group represented by any one of the following formulae (V-1) to (V-4);

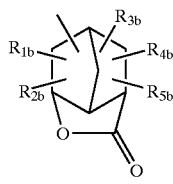
(V-1)

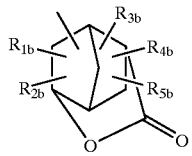
(V-2)

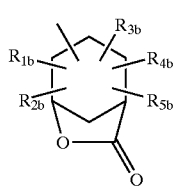
(V-3)

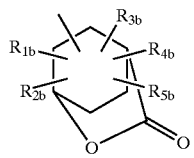
(V-4)

In formulae (V-1) to (V-4), $R_{1b}$, $R_{2b}$, $R_{3b}$, $R_{4b}$ and $R_{5b}$, which may be the same or different, each represent a hydrogen atom, an alkyl group which may be substituted, a cycloalkyl group which may be substituted or an alkenyl group which may be substituted, or two of $R_{1b}$, $R_{2b}$, $R_{3b}$, $R_{4b}$ and $R_{5b}$ may be combined with each other to form a ring.

7. The positive photosensitive composition as described in item (6) above, wherein the resin of component (B) contains at least one repeating unit selected from a repeating unit having a partial structure including an alicyclic hydrocarbon represented by the following formula (pI), (pII), (pIII), (pIV), (pV) or (pVI):

(pI)

(pII)

(pIII)

(pIV)

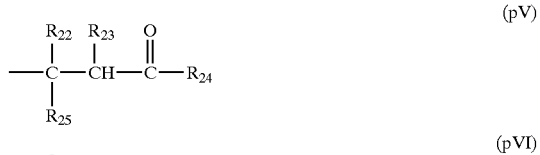
(pV)

(pVI)

In the above formulae, $R_{11}$ represents a methyl group, an ethyl group, an n-propyl group, an isopropyl group, an n-butyl group, an isobutyl group or a sec-butyl group; Z represents an atomic group necessary for forming an alicyclic hydrocarbon group together with the carbon atom: $R_{12}$ to $R_{16}$ each independently represent a straight chain or branched alkyl group having from 1 to 4 carbon atoms or an alicyclic hydrocarbon group, provided that at least one of $R_{12}$ to $R_{14}$, and either $R_{15}$ or $R_{16}$ represents an alicyclic hydrocarbon group; $R_{17}$ to $R_{21}$ each independently represent a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms or an alicyclic hydrocarbon group; and $R_{22}$ to $R_{25}$ each independently represent a straight chain or branched alkyl group having from 1 to 4 carbon atoms or an alicyclic hydrocarbon group, provided that at least one of $R_{22}$ to $R_{25}$ represents an alicyclic hydrocarbon group, or $R_{23}$ and $R_{24}$ may be combined with each other to form a ring.

8. The positive photosensitive composition as described in item (1) above, wherein the positive photosensitive composition further comprises (D) a fluorine-based and/or silicon-based surface active agent.

9. The positive photosensitive composition as described in item (1) above, wherein the positive photosensitive composition further comprises (F) a dissolution inhibiting low molecular weight compound having a group capable of being decomposed by the action of an acid to increase solubility in an alkali developing solution and having a molecular weight of not more than 3,000.

10. The positive photosensitive composition as described in item (1) above, wherein the positive photosensitive composition further comprises a mixed solvent composed of a solvent containing a hydroxy group and a solvent containing no hydroxy group.

11. The positive photosensitive composition as described in item (1) above, wherein the resin of component (B) contains a repeating unit having a group represented by the following formula (VII):

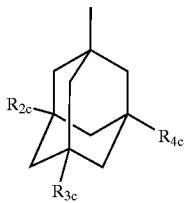
(VII)

In formula (VII), $R_{2c}$, $R_{3c}$ and $R_{4c}$, which may be the same or different, each independently represent a hydrogen atom or a hydroxy group, provided that at least one of $R_{2c}$, $R_{3c}$, and $R_{4c}$, represents a hydroxy group.

12. The positive photosensitive composition as described in item (1) above, wherein the resin of component (B) contains a repeating unit having an alicyclic hydrocarbon group and a repeating unit having Ma group represented by any one of formulae (V-1) to (V-4) shown below and a repeating unit having a group represented by formula (VII) shown below.

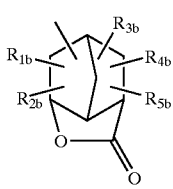
(V-1)

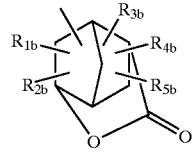
(V-2)

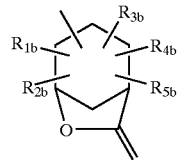
(V-3)

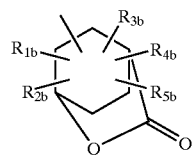
(V-4)

In formulae (V-1) to (V-4), $R_{1b}$, $R_{2b}$, $R_{3b}$, $R_{4b}$ and $R_{5b}$, which may be the same or different, each represent a hydrogen atom, an alkyl group which may be substituted, a cycloalkyl group which may be substituted or an alkenyl group which may be substituted, or two of $R_{1b}$, $R_{2b}$, $R_{3b}$, $R_{4b}$ and $R_{5b}$ may be combined with each other to form a ring,

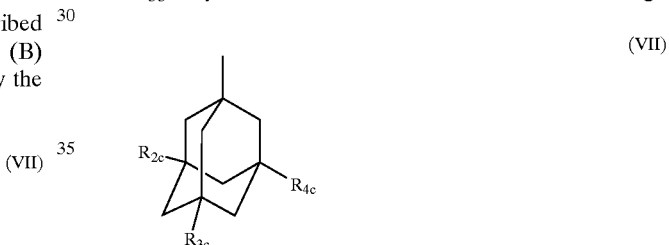
(VII)

In formula (VII), $R_{2c}$, $R_{3c}$ and $R_{4c}$, which may be the same or different, each represent a hydrogen atom or a hydroxy group, provided that at least one of $R_{2c}$, $R_{3c}$ and $R_{4c}$ represents a hydroxy group.

13. The positive photosensitive composition as described in item (10) above, wherein the solvent containing a hydroxy group is selected from propylene glycol monomethyl ether and ethyl lactate.

14. The positive photosensitive composition as described in item (10) above, wherein the solvent containing no hydroxy group is selected from propylene glycol monomethyl ether acetate, ethyl ethoxypropionate and 2-heptanone.

DETAILED DESCRIPTION OF THE INVENTION

The positive photosensitive composition according to the present invention will be described in more detail below.

<<(A) Acid Generator>>

The acid generator of component (A) for use in the present invention is a compound, which generates an acid upon irradiation of an actinic ray or radiation, represented by formula (I) described above. Compounds represented by formulae (IA) and (IB) are preferably used.

In formula (I), $R_1$ to $R_5$, which may be the same or different, each represent a hydrogen atom, an alkyl group, an alkoxy group, a nitro group, a halogen atom, an alkoxycarbonyl group or an aryl group, or at least two of $R_1$ to $R_5$ may be combined with each other to form a ring structure, $R_6$ and $R_7$, which may be the same or different, each represent a hydrogen atom, an alkyl group, a cyano group or an aryl group, $Y_1$ and $Y_2$, which may be the same or different, each represent an alkyl group, an aryl group, an aralkyl group or an aromatic group containing a hetero atom, or $Y_1$ and $Y_2$ may be combined with each other to form a ring, $Y_3$ represents a single bond or a divalent connecting group, $X_-$ represents a non-nucleophilic anion, provided that at least one of $R_1$ to $R_5$ and at least one of $Y_1$ and $Y_2$ are combined with each other to form a ring or at least one of $R_1$ to $R_5$ and at least one of $R_6$ and $R_7$ are combined with each other to form a ring.

Any of $R_1$ to $R_7$ and $Y_1$ to $Y_2$ may be bonded through a connecting group to form a compound having two or more structures represented by formula (I).

The alkyl group represented by any one of $R_1$ to $R_7$ is a substituted or unsubstituted alkyl group, and preferably an alkyl group having from 1 to 5 carbon atoms. Examples of the unsubstituted alkyl group include methyl, ethyl, propyl, n-butyl, sec-butyl and tert-butyl groups.

The alkoxy group represented by any one of $R_1$ to $R_5$ or the alkoxy group in the alkoxycarbonyl group represented by any one of $R_1$ to $R_5$ is a substituted or unsubstituted alkoxy group, and preferably an alkoxy group having from 1 to 5 carbon atoms. Examples of the unsubstituted alkoxy group include methoxy, ethoxy, propoxy and butoxy groups.

The aryl group represented by any one of $R_1$ to $R_7$, $Y_1$ and $Y_2$ is a substituted or unsubstituted aryl group, and preferably an aryl group having from 6 to 14 carbon atoms. Examples of the unsubstituted aryl group include phenyl, tolyl and naphthyl groups.

The halogen atom represented by any one of $R_1$ to $R_5$ includes, for example, fluorine, chlorine, bromine and iodine atoms.

The alkyl group represented by $Y_1$ or $Y_2$ is a substituted or unsubstituted alkyl group, and preferably an alkyl group having from 1 to 30 carbon atoms. Examples of the unsubstituted alkyl group include a straight chain or branched alkyl group, e.g., methyl, ethyl, propyl, n-butyl, sec-butyl or tert-butyl group and a cyclic alkyl group, e.g., cyclopropyl, cyclopentyl, cyclohexyl, adamantly, norbornyl or bornyl group.

The aralkyl group represented by $Y_1$ or $Y_2$ is a substituted or unsubstituted aralkyl group, and preferably an aralkyl group having from 7 to 12 carbon atoms. Examples of the unsubstituted aralkyl group include benzyl, phenethyl and cumyl groups.

The aromatic group containing a hetero atom represented by $Y_1$ or $Y_2$ is an aromatic group, for example, an aryl group having from 4 to 14 carbon atoms, containing a hetero atom, for example, a nitrogen atom, an oxygen atom or a sulfur atom, and includes a substituted or unsubstituted aromatic group containing a hetero atom. Examples of the unsubstituted aromatic group containing a hetero atom include a heterocyclic aromatic hydrocarbon group, e.g., furyl, thiophenyl, pyrolyl, pyridyl or indolyl group.

$Y_1$ and $Y_2$ may be combined with each other to form a ring together with So in formula (I).

In such a case, the group formed by connecting $Y_1$ and $Y_2$ is an alkylene group having from 4 to 10 carbon atoms, preferably butylene, pentylene or hexylene group, and particularly preferably butylene or pentylene group.

The ring formed by connecting $Y_1$ and $Y_2$ together with $S^+$ in formula (I) may contain a hetero atom.

The alkyl group, alkoxy group, alkoxycarbonyl group, aryl group and aralkyl group may be substituted, for example, with a nitro group, a halogen atom, a carboxy group, a hydroxy group, an amino group, a cyano group or an alkoxy group (preferably an alkoxy group having from 1 to 5 carbon atoms), respectively. Further, the aryl group and aralkyl group may be substituted with an alkyl group (preferably an alkyl group having from 1 to 5 carbon atoms).

The substituent for the alkyl group is preferably a halogen atom.

$Y_3$ represents a single bond or a divalent connecting group. The divalent connecting group is preferably an alkylene group which may be substituted, an alkenylene group which may be substituted, —O—, —S—, —CO—, —CONR— (wherein R represents a hydrogen atom, an alkyl group or an acyl group) or a connecting group formed by combination of two or more of these groups.

The non-nucleophilic anion represented by $X^-$ includes, for example, a sulfonic acid anion and a carboxylic acid anion.

The non-nucleophilic anion means an anion having an extremely low ability for causing a nucleophilic reaction and an anion capable of controlling decomposition with the lapse of time by an intramolecular nucleophilic reaction. By means of the non-nucleophilic anion, preservation stability of the photosensitive composition is improved.

Examples of the sulfonic acid anion include an alkylsulfonic acid anion, an arylsulfonic acid anion and camphorsulfonic acid anion.

Examples of the carboxylic acid anion include an alkylcarboxylic acid anion, an arylcarboxylic acid anion and an aralkylcarboxylic acid anion.

The alkyl group in the alkylsulfonic acid anion is preferably an alkyl group having from 1 to 30 carbon atoms, for example, methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl, eicosyl, cyclopropyl, cyclopentyl, cyclohexyl, adamantly, norbornyl or bornyl group.

The aryl group in the arylsulfonic acid anion is preferably an aryl group having from 6 to 14 carbon atoms, for example, phenyl, tolyl or naphthyl group.

The alkyl group and aryl group in the alkylsulfonic acid anion and arylsulfonic acid anion may have a substituent. Examples of the substituent include a halogen atom, an alkyl group, an alkoxy group and an alkylthio group.

The halogen atom includes, for example, chlorine, bromine, fluorine or iodine atoms.

The alkyl group (preferably an alkyl group having from 1 to 15 carbon atoms) includes, for example, methyl, ethyl, propyl, isopropyl, n-butyl, isobutyl, sec-butyl, pentyl, neopentyl, hexyl, heptyl, octyl, nonyl, decyl, undecyl, dodecyl, tridecyl, tetradecyl, pentadecyl, hexadecyl, heptadecyl, octadecyl, nonadecyl and eicosyl groups.

The alkoxy group (preferably an alkoxy group having from 1 to 5 carbon atoms) includes, for example, methoxy, ethoxy, propoxy and butoxy groups.

The alkylthio group (preferably an alkylthio group having from 1 to 15 carbon atoms) includes, for example, methylthio, ethylthio, propylthio, isopropylthio, n-butylthio, isobutylthio, sec-butylthio, pentylthio, neopentylthio, hexylthio, heptylthio, octylthio, nonylthio, decylthio, undecylthio, dodecylthio, tridecylthio, tetradecylthio, pentadecylthio, hexadecylthio, heptadecylthio, octadecylthio, nonadecylthio and eicosylthio groups.

The alkyl group, alkoxy group and alkylthio group may be substituted with a halogen atom (preferably a fluorine atom).

The alkyl group in the alkylcarboxylic acid anion is same as that in the alkylsulfonic acid anion.

The aryl group in the arylcarboxylic acid anion is same as that in the arylsulfonic acid anion.

The aralkyl group in the aralkylcarboxylic acid anion is preferably an aralkyl group having from 7 to 12 carbon atoms, for example, benzyl, phenetyl, naphthylmethyl or naththylethyl group.

The alkyl group, aryl group and aralkyl group in the alkylcarboxylic acid anion, arylcarboxylic acid anion and aralkylcarboxylic acid anion may have a substituent. Examples of the substituent include those described for the arylsulfonic acid anion, for example, a halogen atom, an alkyl group, an alkoxy group or an alkylthio group.

Other examples of the non-nucleophilic anion include phosphorus fluoride, boron fluoride and antimony fluoride.

In the compound represented by formula (I), at least one of $R_1$ to $R_5$ and at least one of $Y_1$ and $Y_2$ are combined with each other to form a ring or at least one of $R_1$ to $R_5$ and at least one of $R_6$ and $R_7$ are combined with each other to form a ring.

By the formation of ring in the compound represented by formula (I), the steric configuration of compound is fixed and the photolysis efficiency of the compound increases.

Further, any of $R_1$ to $R_7$ and $Y_1$ to $Y_2$ may be bonded through a connecting group to form a compound having two or more structures represented by formula (I).

Of the compounds represented by formula (I) according to the present invention, those represented by formulae (IA) and (IB) described above are preferred.

In formula (IA), $R_1$ to $R_4$, $R_7$, $Y_1$, $Y_2$ and $X^-$ have the same meanings as defined in formula (I), and Y represents a single bond or a divalent connecting group In formula (IB), $R_1$ to $R_4$, $R_6$, $R_7$, $Y_1$ and $X^-$ have the same meanings as defined in formula (I), and Y represents a single bond or a divalent connecting group.

Y represents a single bond or a divalent connecting group. The divalent connecting group is preferably an alkylene group which may be substituted, an alkenylene group which may be substituted, —O—, —S—, —CO—, —CONR— (wherein R represents a hydrogen atom, an alkyl group or an acyl group) or a connecting group formed by combination of two or more of these groups.

In formula (IA), Y preferably represents an alkylene group, an alkylene group containing an oxygen atom or an alkylene group containing a sulfur atom, for example, an ethylene group, a propylene group, —CH$_2$—O— or —CH$_2$—S—, and most preferably represents a connecting group for forming a 6-membered ring, for example, an ethylene group, —CH$_2$—O— or —CH$_2$—S—. By the formation of 6-membered ring in the compound, an angle between the carbonyl plane and the C—S$^+$ sigma bond comes up to perpendicularity, and due to the orbital interaction the photolysis efficiency of the compound increases.

Specific examples of the compound represented by formula (I) for use in the present invention are set forth below, but the present invention should not be construed as being limited thereto.

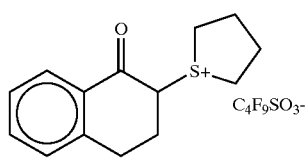

(IA-1)

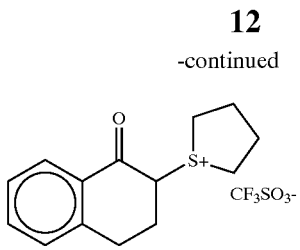

(IA-2)

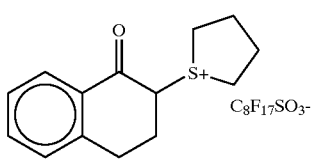

(IA-3)

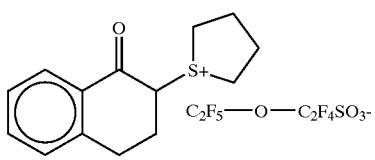

(IA-4)

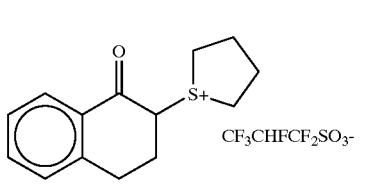

(IA-5)

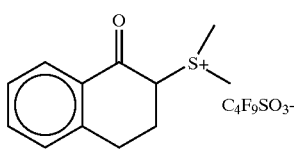

(IA-6)

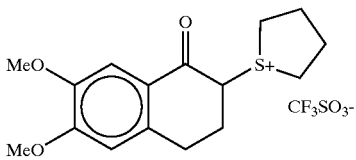

(IA-7)

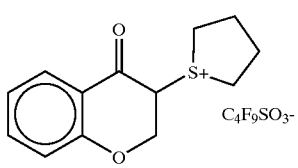

(IA-8)

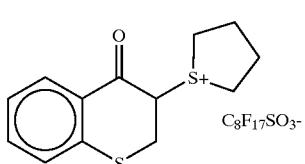

(IA-9)

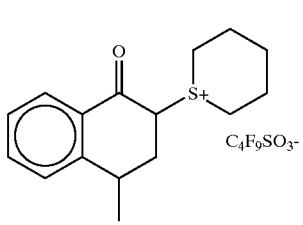

(IA-10)

-continued (1A-11)
(1A-12)
(IA-13)
(IA-14)
(IA-15)
(IA-16)
(IA-17)
(IA-18)

-continued (IA-19)
(IA-20)
(IA-21)
(IA-22)
(IA-23)
(IA-24)
(IA-25)
(IA-26)
(IA-27)

(IA-28)
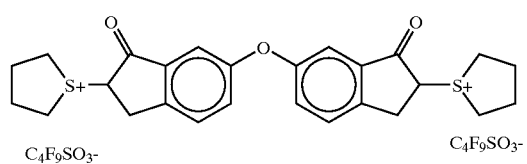
C₄F₉SO₃⁻    C₄F₉SO₃⁻
(IA-29)
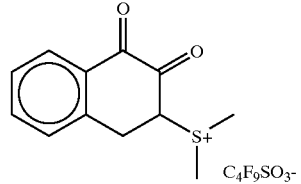
C₄F₉SO₃⁻
(IA-30)
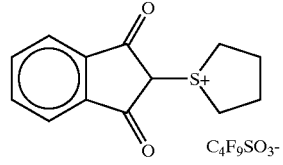
C₄F₉SO₃⁻
(IA-31)
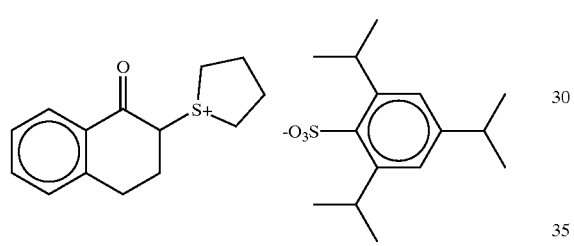
(IA-32)
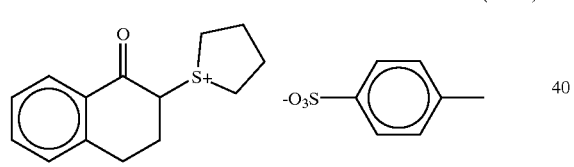
(IA-33)
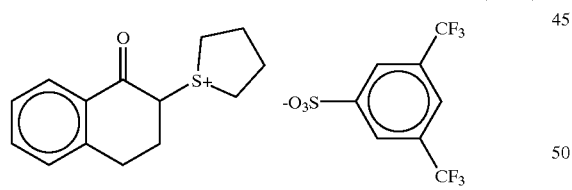
(IA-34)
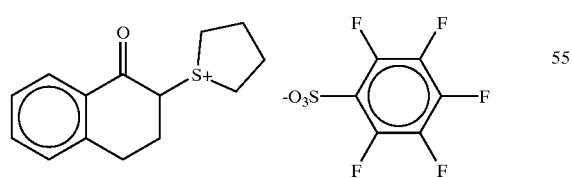
(IA-35)
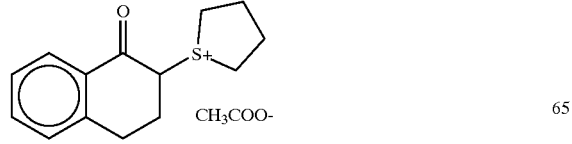
CH₃COO⁻
(IA-36)
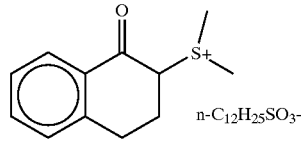
n-C₁₂H₂₅SO₃⁻
(IA-37)
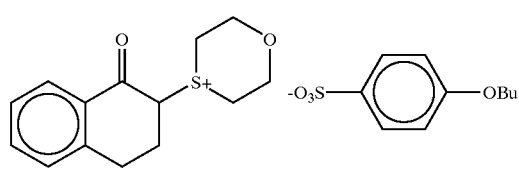
(IA-38)
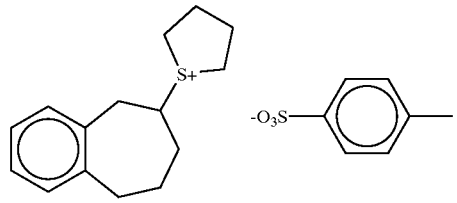
(IA-39)
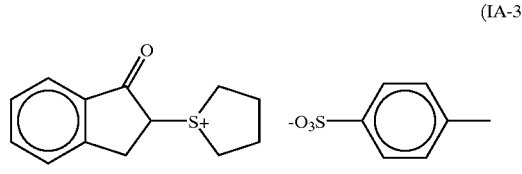
(IA-40)
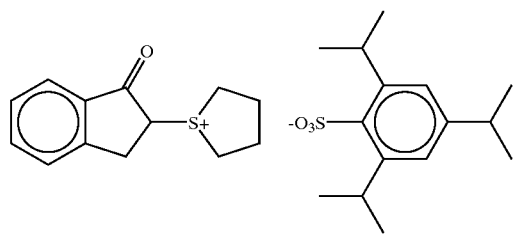
(IA-41)
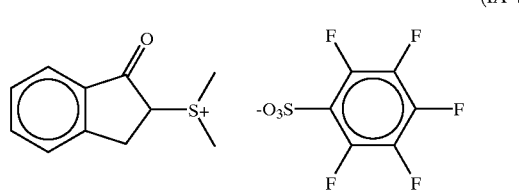
(IA-42)
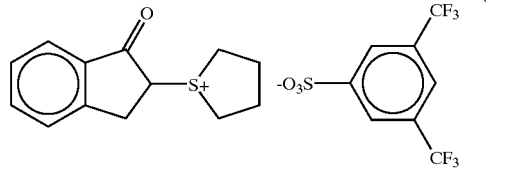
(IA-43)
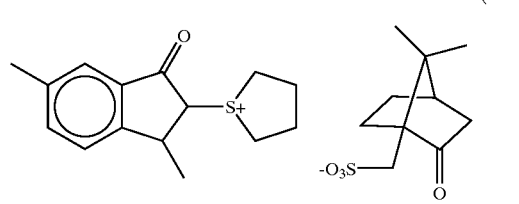

-continued
(IA-44)
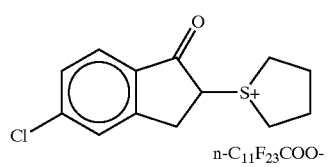
(IA-45)
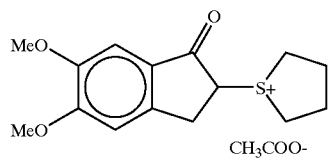
(IA-46)
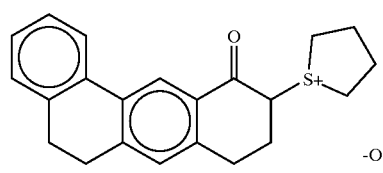
(IA-47)
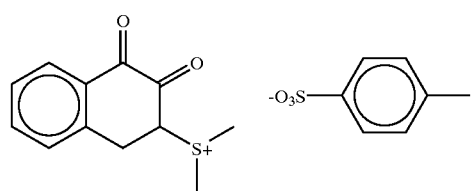
(IA-48)
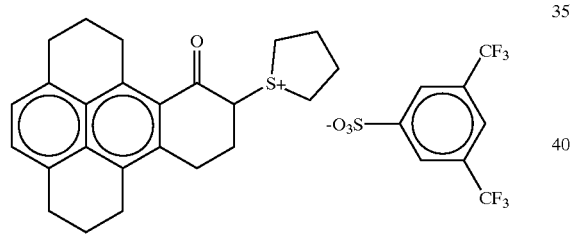
(IA-49)
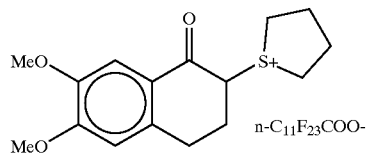
(IA-50)
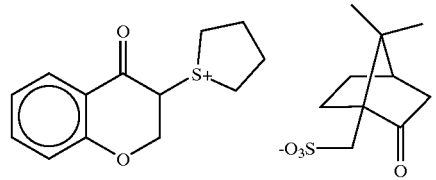
(IA-51)
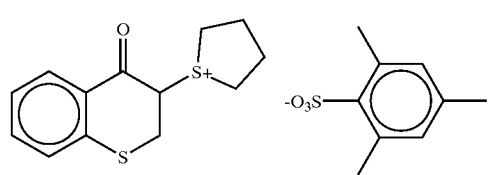
-continued
(IA-52)
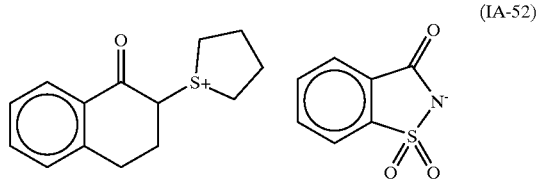
(IA-53)
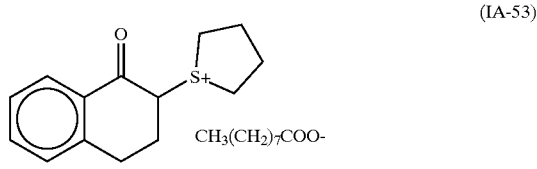
(IA-54)
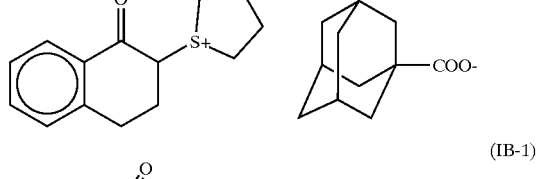
(IB-1)
(IB-2)
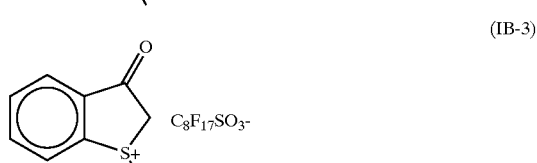
(IB-3)
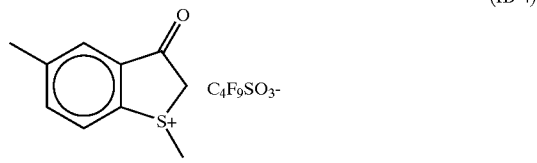
(IB-4)
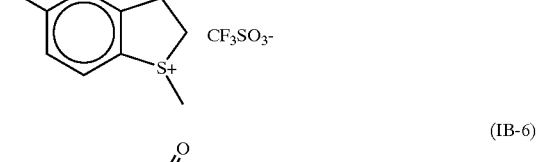
(IB-5)
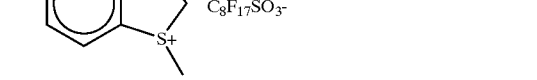
(IB-6)

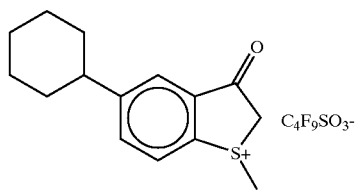 (IB-7)
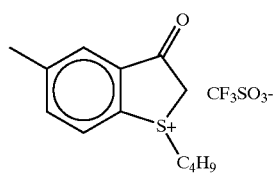 (IB-8)
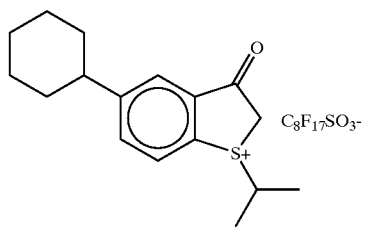 (IB-9)
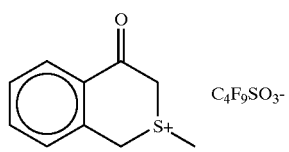 (IB-10)
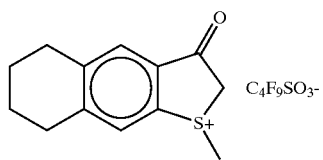 (IB-11)
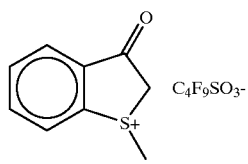 (IB-12)
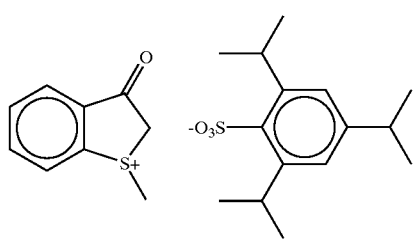 (IB-13)
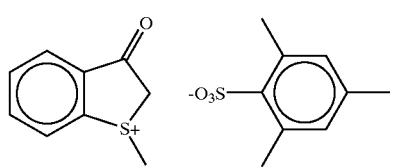 (IB-14)
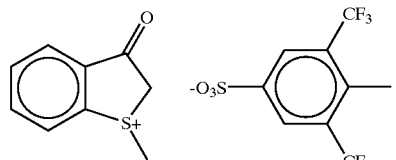 (IB-15)
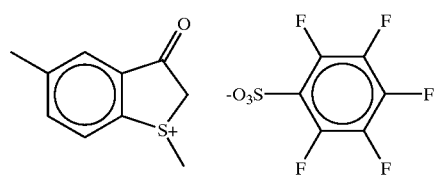 (IB-16)
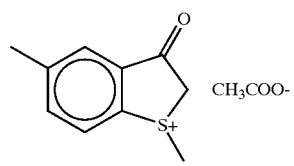 (IB-17)
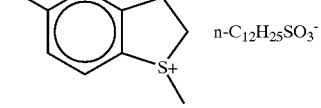 (IB-18)
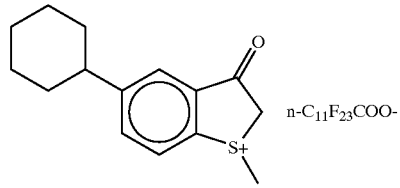 (IB-19)
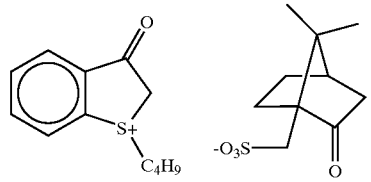 (IB-20)
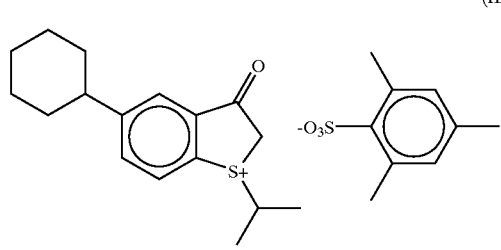 (IB-21)
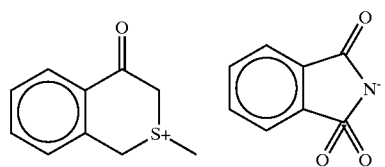 (IB-22)

-continued

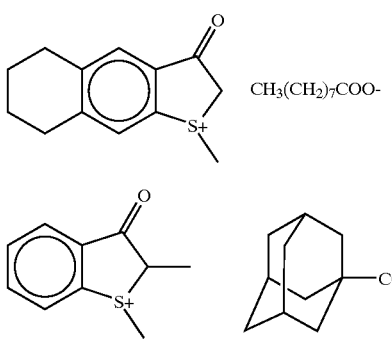

Of specific examples of the acid generator of component (A) described above, (IA-1) to (IA-30) and (IB-1) to (IB-12) are more preferred.

The compounds represented by formula (I) may be used individually or in combination of two or more thereof.

The compound represented by formula (IA) can be obtained by a method of reacting a corresponding α-halo cyclic ketone with a sulfide compound or a method of converting a corresponding cyclic ketone to a silyl enol ether and reacting the latter with sulfoxide. The compound represented by formula (IB) can be obtained by a method of reacting an aryl alkyl sulfide with an α- or β-halogenated halide.

The content of the compound of component (A) is preferably from 0.1 to 20% by weight, more preferably from 0.5 to 10% by weight, and still more preferably from 1 to 7% by weight, based on the solid content of the positive photosensitive composition of the present invention.

Acid-generating Compound Used Together with the Compound of Component (A)

A compound (hereinafter also referred to as a "photo-acid generator") that decomposes upon irradiation of an actinic ray or radiation to generate an acid other than the compound of component (A) may be used together in the positive photosensitive composition of the present invention.

An amount of the photo-acid generator used together with the compound of component (A) according to the present invention is ordinarily from 100/0 to 20/80, preferably from 100/0 to 40/60, and more preferably from 100/0 to 50/50, in terms of a molar ratio of the compound of component (A)/other photo-acid generator.

Such a photo-acid generator used together with the compound of component (A) can be appropriately selected from photoinitiators for photo-cationic polymerization, photoinitiators for photo-radical polymerization, photo-achromatic agents for dyes, photo-discoloring agents, compounds generating an acid upon irradiation of known light used for a microresist (an ultraviolet ray or far ultraviolet ray of from 400 to 200 nm, particularly preferably, a g-line, h-line, i-line or KrF excimer laser beam), an ArF excimer laser beam, an electron beam, an X ray, a molecular beam or an ion beam, and mixtures thereof.

Examples of such photo-acid generators include an onium salt, for example, a diazonium salt, an ammonium salt, a phosphonium salt, an iodonium salt, a sulfonium salt, a selenonium salt or an arsonium salt, an organic halogeno compound, an organo-metal/organic halide, a photo-acid generator having an o-nitrobenzyl type protective group, a compound generating a sulfonic acid upon photolysis, which is represented by an iminosulfonate, a disulfone compound, a diazoketosulfone compound and a diazodisulfone compound.

Also, polymer compounds in which a group or compound generating an acid upon irradiation of an actinic ray or radiation is introduced into the main chain or side chain thereof, for example, compounds as described, for example, in U.S. Pat. No. 3,849,137, West German Patent 3,914,407, JP-A-63-26653, JP-A-55-164824, JP-A-62-69263, JP-A-63-146038, JP-A-63-163452, JP-A-62-153853 and JP-A-63-146029 may be used.

Further, compounds generating an acid with light as described, for example, in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,719,778 and European Patent 126,712 may be used.

Of the compounds decomposing upon irradiation of an actinic ray or radiation to generate an acid used together with the compound of component (A) as described above, those which can be particularly effectively used are described below.

(1) Oxazole derivative substituted with trihalomethyl group represented by formula (PAG1) shown below or s-triazine derivative substituted with trihalomethyl group represented by formula (PAG2) shown below:

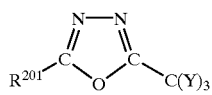

(PAG1)

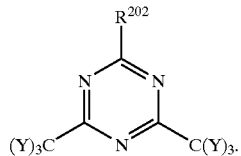

(PAG2)

In formulae (PAG1) and (PAG2), $R^{201}$ represents a substituted or unsubstituted aryl group or a substituted or unsubstituted alkenyl group; $R^{202}$ represents a substituted or unsubstituted aryl group, a substituted or unsubstituted alkenyl group, a substituted or unsubstituted alkyl group or —C(Y)$_3$; and Y represents a chlorine atom or a bromine atom.

Specific examples of such compounds are set forth below, but the present invention should not be construed as being limited thereto.

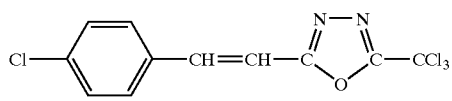

(PAG1-1)

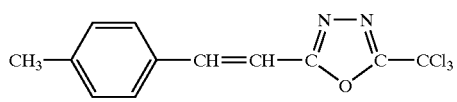

(PAG1-2)

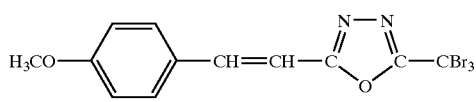

(PAG1-3)

-continued
(PAG1-4)
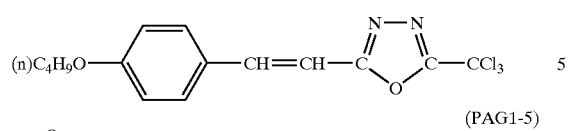
(PAG1-5)
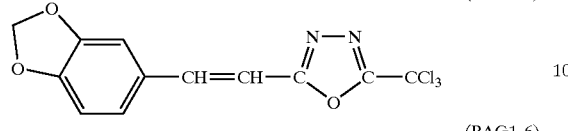
(PAG1-6)
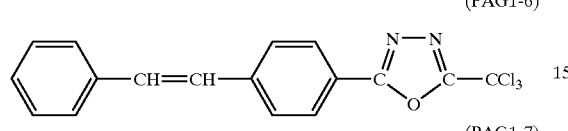
(PAG1-7)
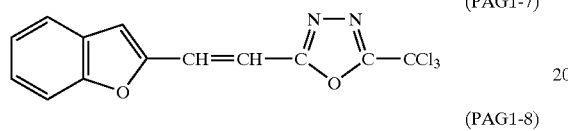
(PAG1-8)
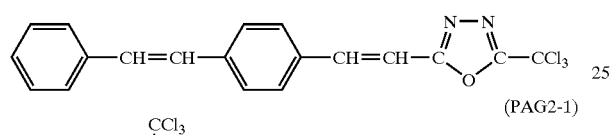
(PAG2-1)
(PAG2-2)
(PAG2-3)
(PAG2-4)
-continued
(PAG2-5)
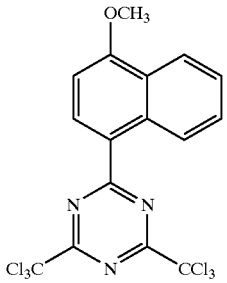
(PAG2-6)
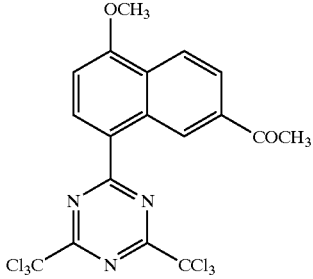
(PAG2-7)
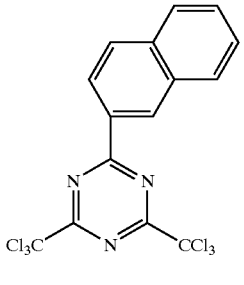
(PAG2-8)
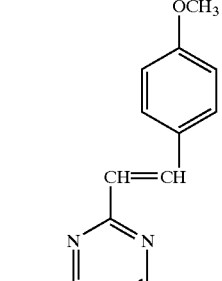
(PAG2-9)
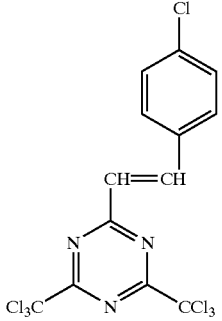

-continued

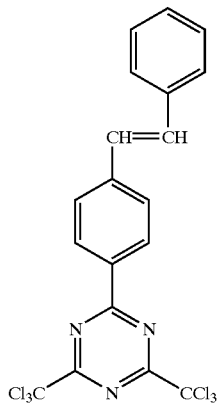
(PAG2-10)

(2) Iodonium salt represented by formula (PAG3) shown below or sulfonium salt represented by formula (PAG4) shown below:

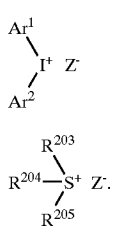
(PAG3)
(PAG4)

In formulae (PAG3) and (PAG4), $Ar^1$ and $Ar^2$, which may be the same or different, each independently represent a substituted or unsubstituted aryl group. Preferred examples of the substituent include an alkyl group, a haloalkyl group, a cycloalkyl group, an aryl group, an alkoxy group, a nitro group, a carboxy group, an alkoxycarbonyl group, a hydroxy group, a mercapto group and a halogen atom.

$R^{203}$, $R^{204}$ and $R^{205}$, which may be the same or different, each independently represents a substituted or unsubstituted alkyl group or a substituted or unsubstituted aryl group, preferably an aryl group having from 6 to 14 carbon atoms, an alkyl group having from 1 to 8 carbon atoms or a substituted derivative thereof. Preferred examples of the substituent include, for the aryl group, an alkoxy group having from 1 to 8 carbon atoms, an alkyl group having from 1 to 8 carbon atoms, a nitro group, a carboxy group, a hydroxy group and a halogen atom, and for the alkyl group, an alkoxy group having from 1 to 8 carbon atoms, a carboxy group and an alkoxycarbonyl group.

$Z^-$ represents a counter anion. Examples of the counter anion include $BF_4^-$, $AsF_6^-$, $PF_6^-$, $SbF_6^-$, $SiF_6^{2-}$, $ClO_4^-$, a perfluoroalkanesulfonic acid anion, e.g., $CF_3SO_3^-$, pentafluorobenzenesulfonic acid anion, a condensed polynucleic aromatic sulfonic acid anion, e.g., naphthalene-1-sulfonic acid anion, an anthraquinonesulfonic acid anion and a dye containing a sulfonic acid group, however, the present invention should not be construed as being limited thereto.

Two of $R^{203}$, $R^{204}$ and $R^{205}$ or $Ar^1$ and $Ar^2$ may be combined with each other through a single bond or a substituent.

Specific examples of such compounds are set forth below, but the present invention should not be construed as being limited thereto.

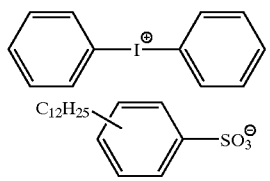
(PAG3-1)

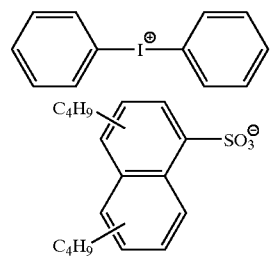
(PAG3-2)

(PAG3-3)

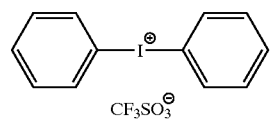
(PAG3-4)

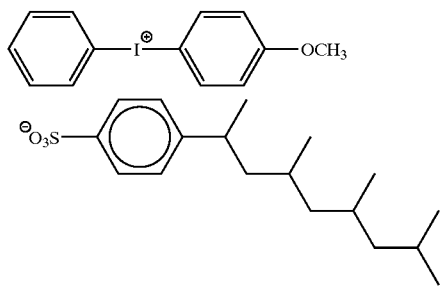
(PAG3-5)

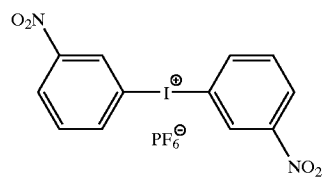
(PAG3-6)

-continued
(PAG3-7)
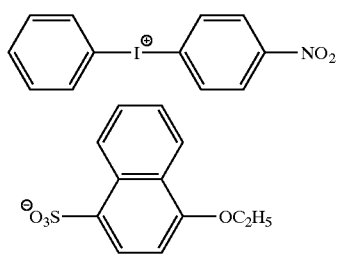
(PAG3-8)
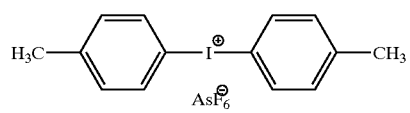
(PAG3-9)
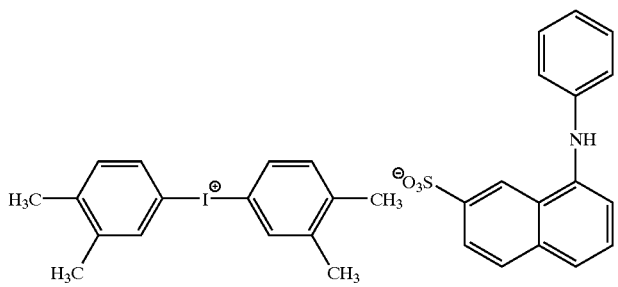
(PAG3-10)
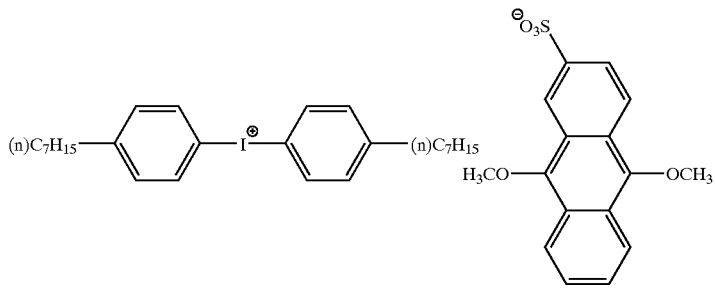
(PAG3-11)
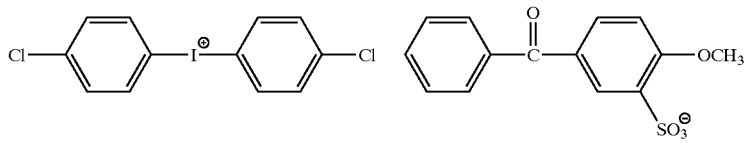
(PAG3-12)
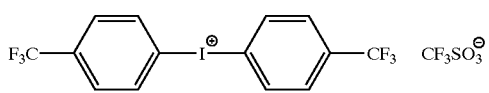
(PAG3-13)
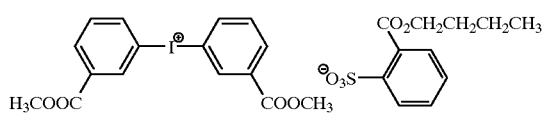
(PAG3-14)
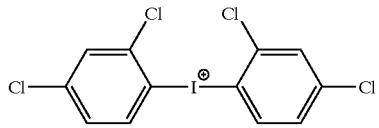
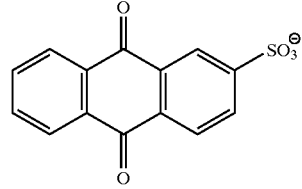
(PAG3-15)
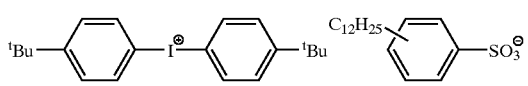
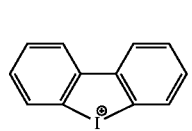
(PAG3-16)

-continued
(PAG3-17) 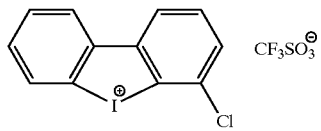
(PAG3-18) 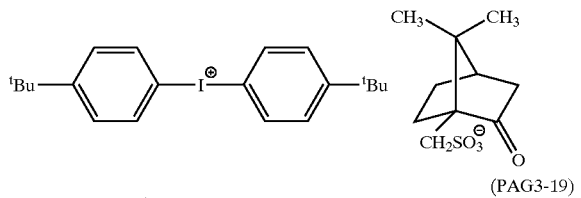
(PAG3-19) 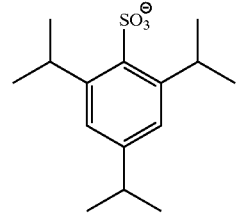
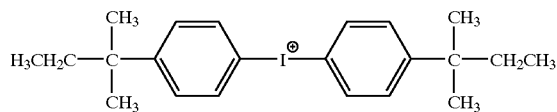
(PAG3-20) 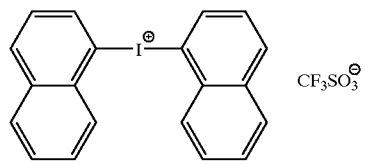
(PAG3-21) 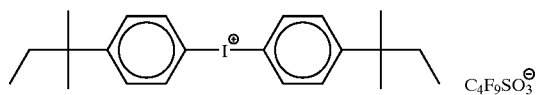
(PAG3-22) 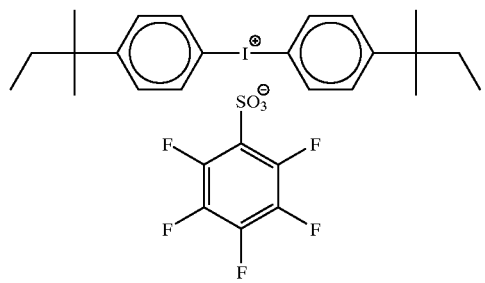
(PAG3-23) 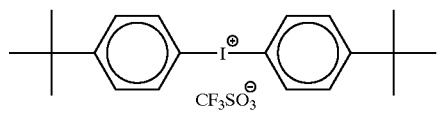
(PAG3-24) 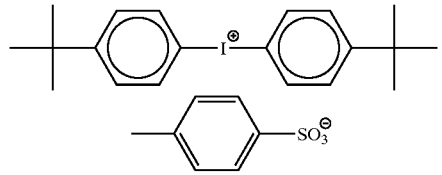
(PAG3-25) 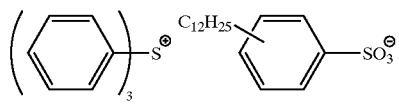
(PAG4-1) 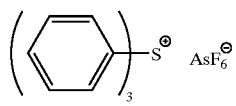
(PAG4-2) 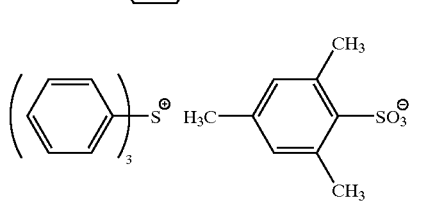
(PAG4-3) 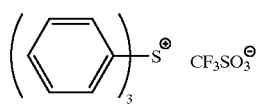
(PAG4-4) 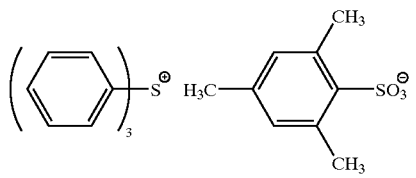
(PAG4-5) 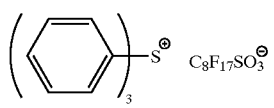
(PAG4-6) 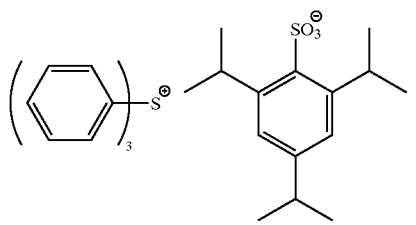

-continued
(PAG4-7)
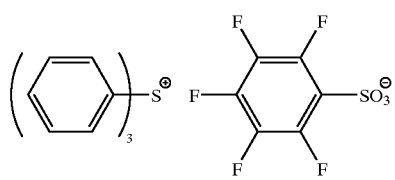
(PAG4-8)
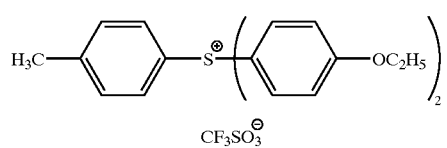
(PAG4-9)
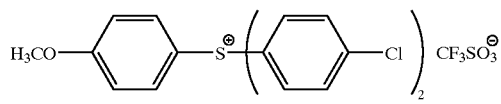
(PAG4-10)
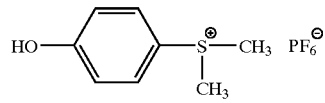
(PAG4-11)
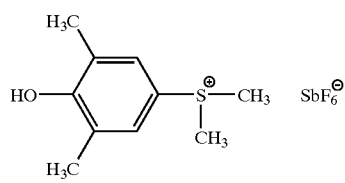
(PAG4-12)
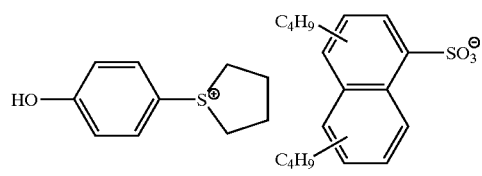
(PAG4-13)
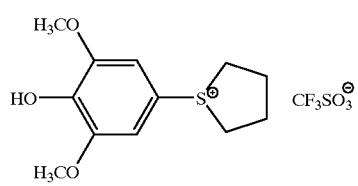
(PAG4-14)
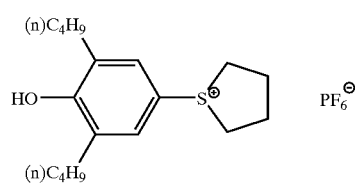
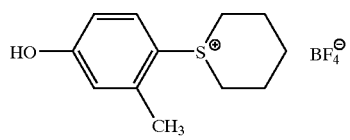
(PAG4-16)
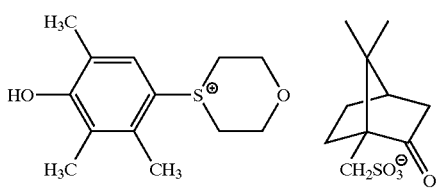
(PAG4-17)
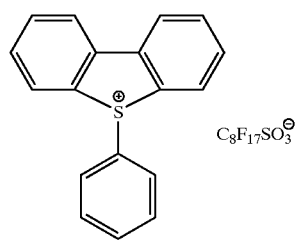
(PAG4-18)
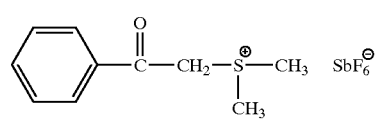
(PAG4-19)
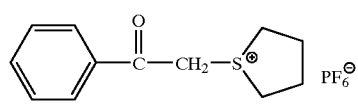
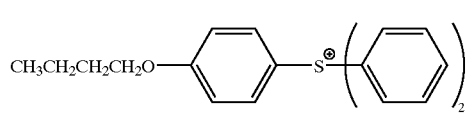
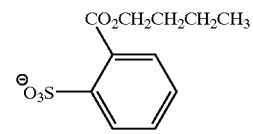
(PAG4-21)
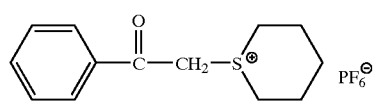
(PAG4-22)
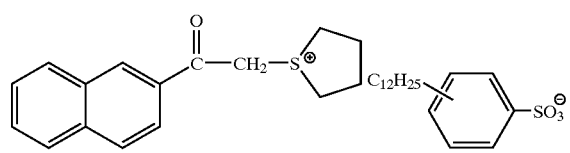

-continued
(PAG4-23)
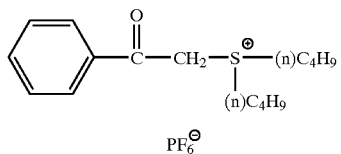
(PAG4-24)
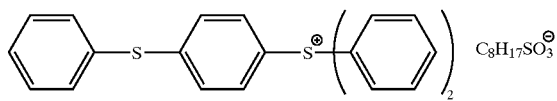
(PAG4-25)
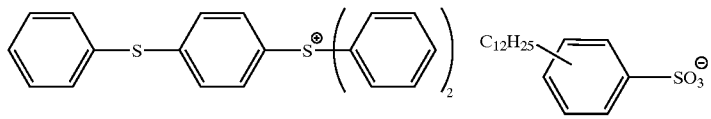
(PAG4-26)
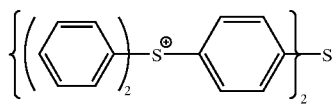
(PAG4-27)
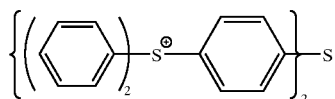
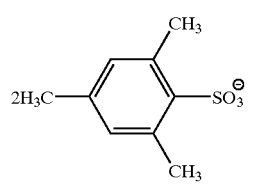
(PAG4-28)
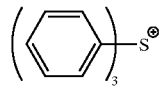
(PAG4-29)
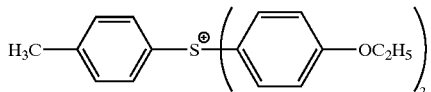
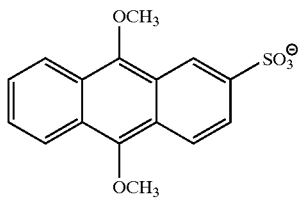
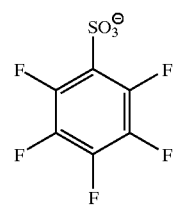
(PAG4-30)
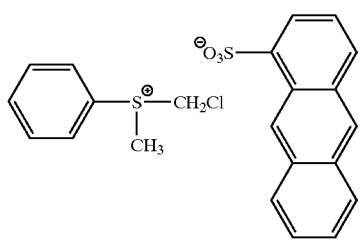
(PAG4-31)
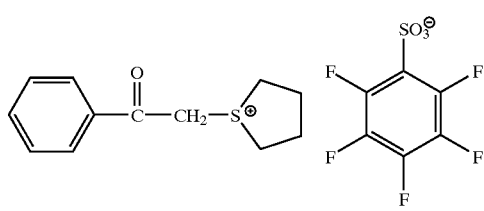
(PAG4-32)
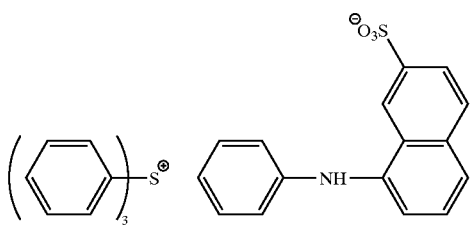
(PAG4-33)
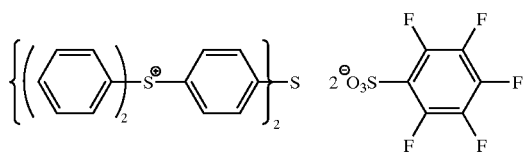
(PAG4-34)
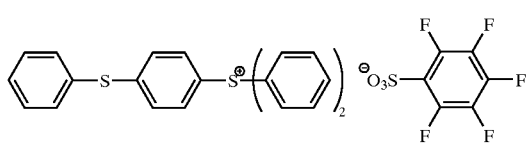
(PAG4-35)
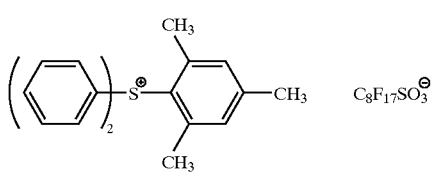

-continued
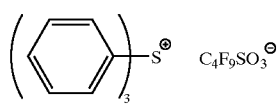 (PAG4-36)
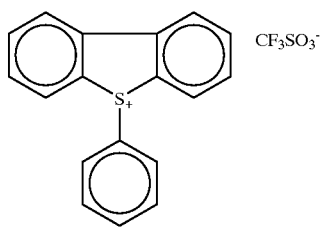 (PAG4-37)
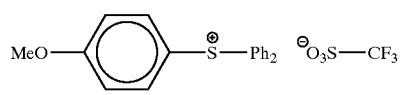 (PAG4-38)
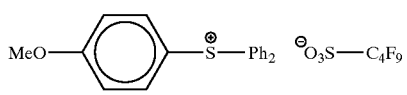 (PAG4-39)
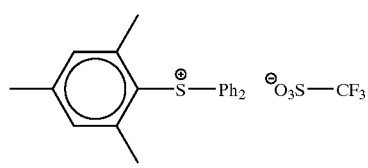 (PAG4-40)
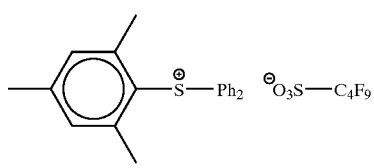 (PAG4-41)
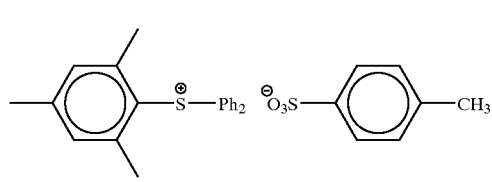 (PAG4-42)
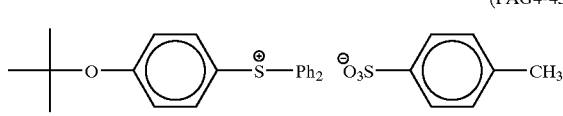 (PAG4-43)
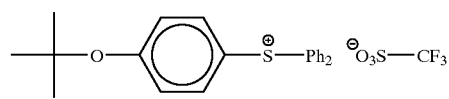 (PAG4-44)
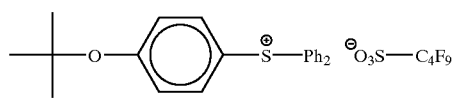 (PAG4-45)
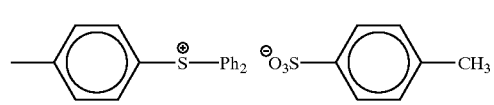 (PAG4-46)
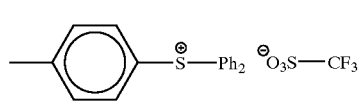 (PAG4-47)
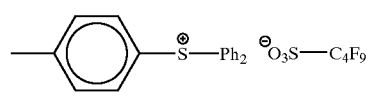 (PAG4-48)
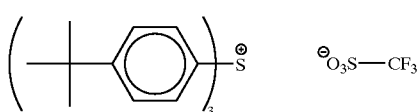 (PAG4-49)
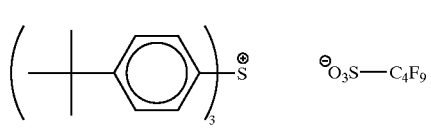 (PAG4-50)
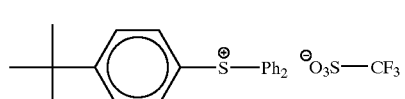 (PAG4-51)
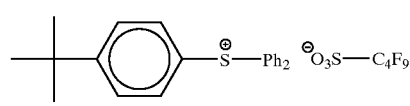 (PAG4-52)
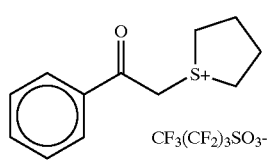 (PAG 4-53)
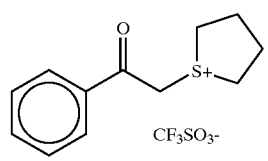 (PAG 4-54)
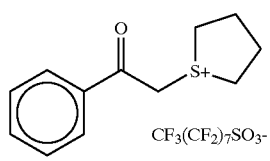 (PAG 4-55)

-continued
(PAG 4-56)
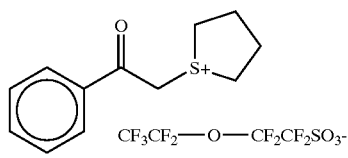
(PAG 4-57)
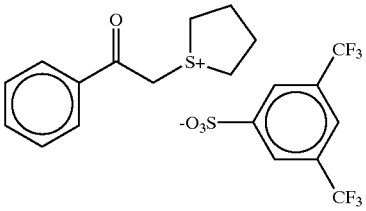
(PAG 4-58)
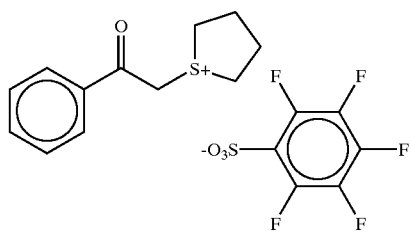
(PAG 4-59)
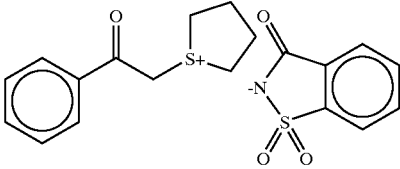
(PAG 4-60)
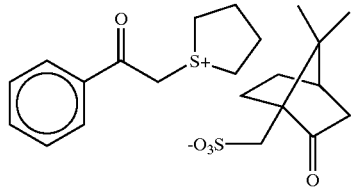
(PAG 4-61)
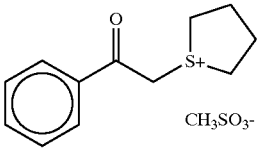
(PAG 4-62)
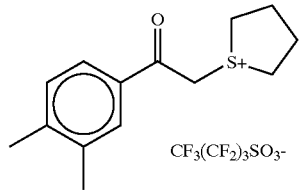
(PAG 4-63)
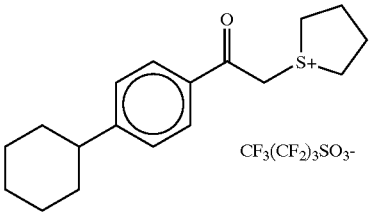
(PAG 4-64)
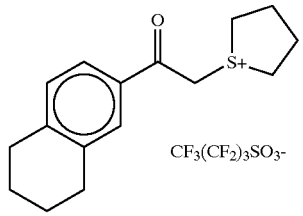
(PAG 4-65)
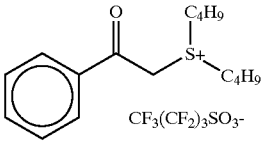
(PAG 4-66)
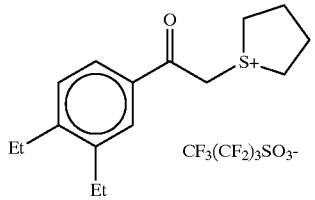
(PAG 4-67)
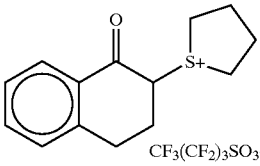
(PAG 4-68)
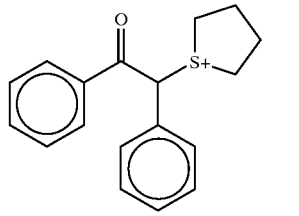
(PAG 4-69)
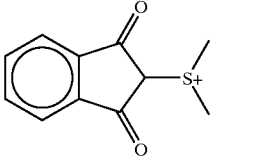

-continued

-continued
(PAG 4-88)
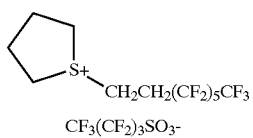
(PAG 4-89)
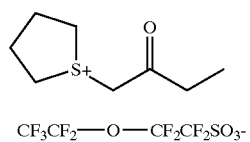
(PAG 4-90)
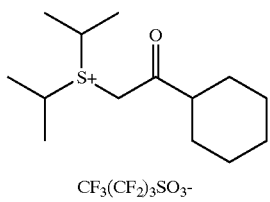
(PAG 4-91)
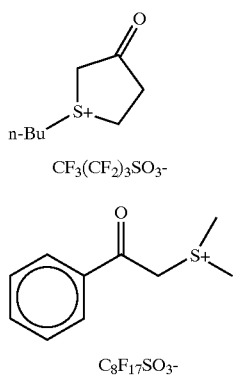
(PAG 4-92)
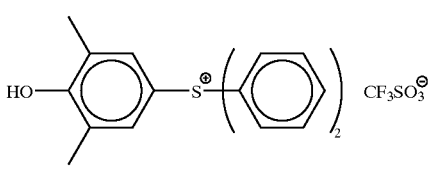
(PAG4-93)
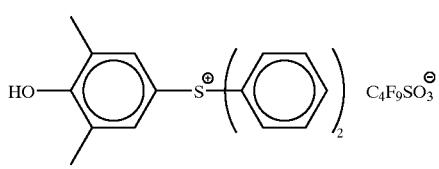
(PAG4-94)
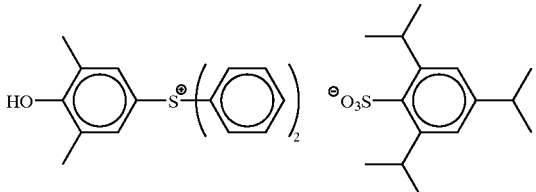
(PAG4-95)
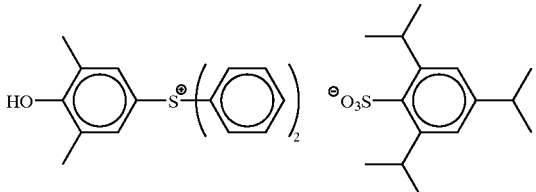
(PAG4-96)
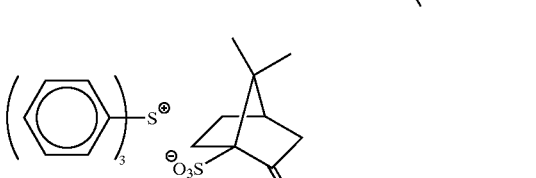
(PAG4-97)
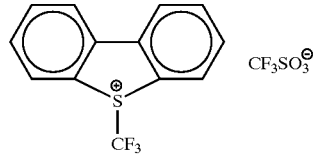
(PAG4-98)
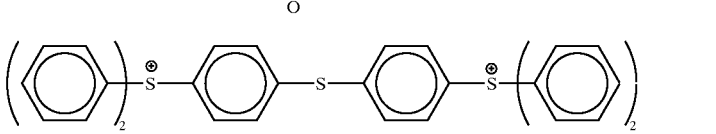
(PAG4-99)
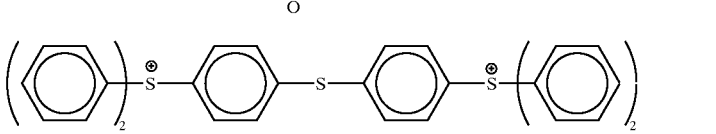
(PAG4-100)
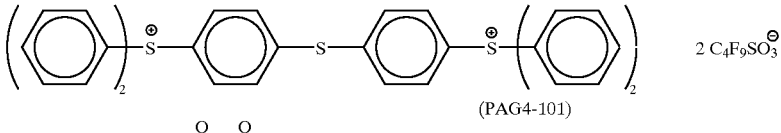
(PAG4-101)
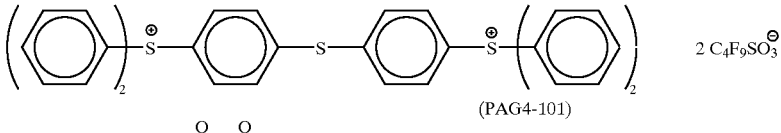
(PAG4-102)
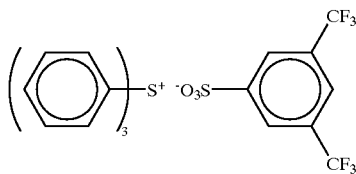

In the formulae described above, Ph represents a phenyl group.

The onium salts represented by formulae (PAG3) and (PAG4) are known and can be synthesized by methods as described, for example, in U.S. Pat. Nos. 2,807,648 and 4,247,473 and JP-A-53-101331.

(3) Disulfone derivative represented by formula (PAG5) shown below or iminosulfonate derivative represented by formula (PAG6) shown below:

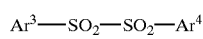
(PAG5)

-continued

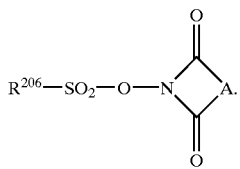
(PAG6)

In formulae (PAG4) and (PAG5), $Ar^3$ and $Ar^4$, which may be the same or different, each independently represent a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group or a substituted or unsubstituted arylene group.

Specific examples of such compounds are set forth below, but the present invention should not be construed as being limited thereto.

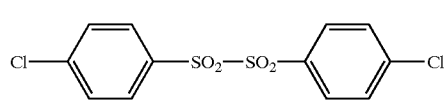
(PAG5-1)

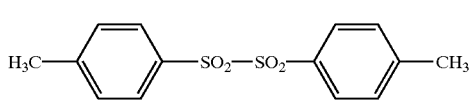
(PAG5-2)

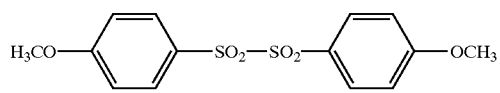
(PAG5-3)

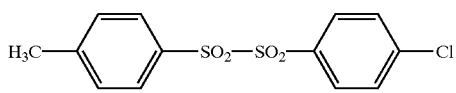
(PAG5-4)

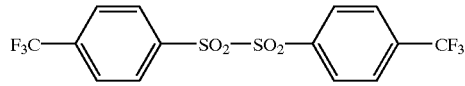
(PAG5-5)

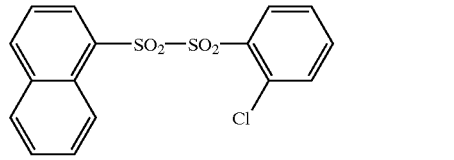
(PAG5-6)

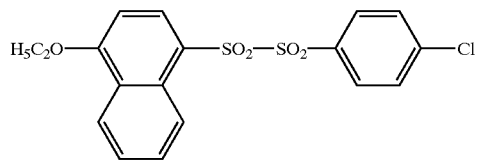
(PAG5-7)

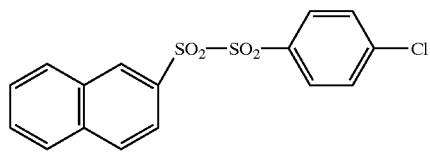
(PAG5-8)

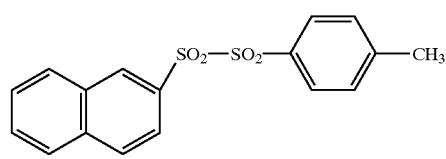
(PAG5-9)

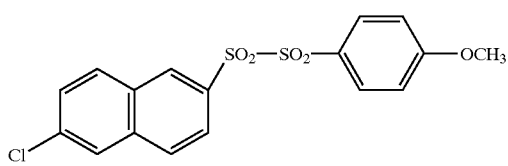
(PAG5-10)

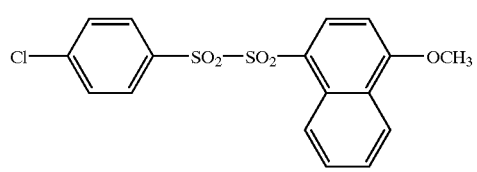
(PAG5-11)

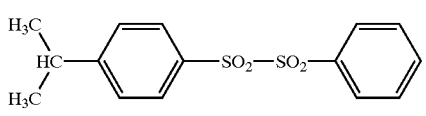
(PAG5-12)

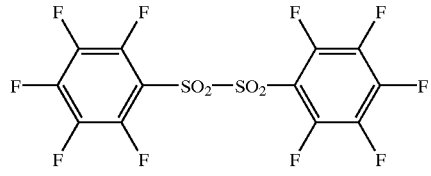
(PAG5-13)

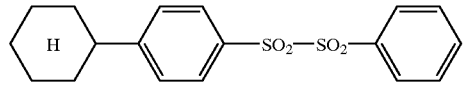
(PAG5-14)

(PAG5-15)
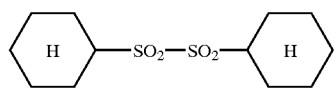
(PAG6-1)
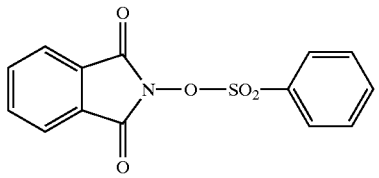
(PAG6-2)
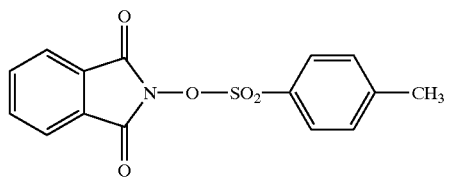
(PAG6-3)
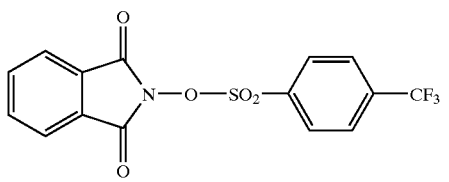
(PAG6-4)
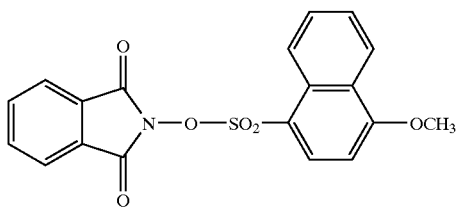
(PAG6-5)
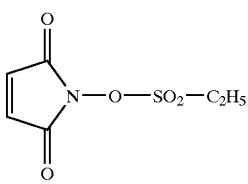
(PAG6-6)
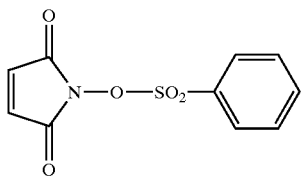
(PAG6-7)
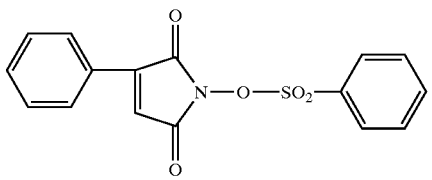
(PAG6-8)
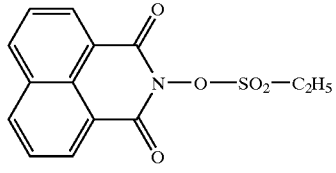
(PAG6-9)
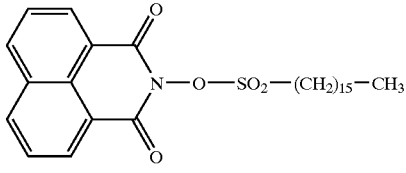
(PAG6-10)
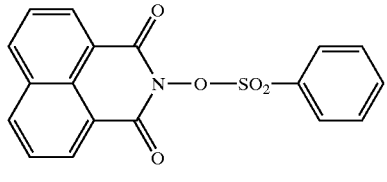
(PAG6-11)
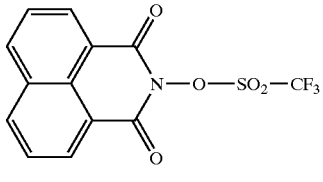
(PAG6-12)
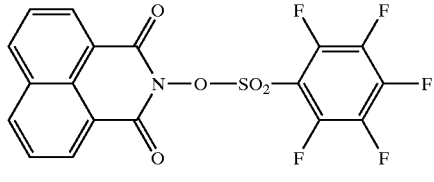
(PAG6-13)
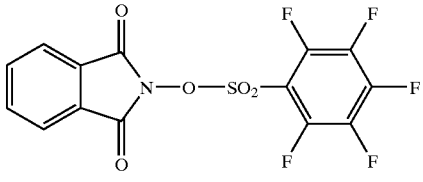
(PAG6-14)
(PAG6-15)

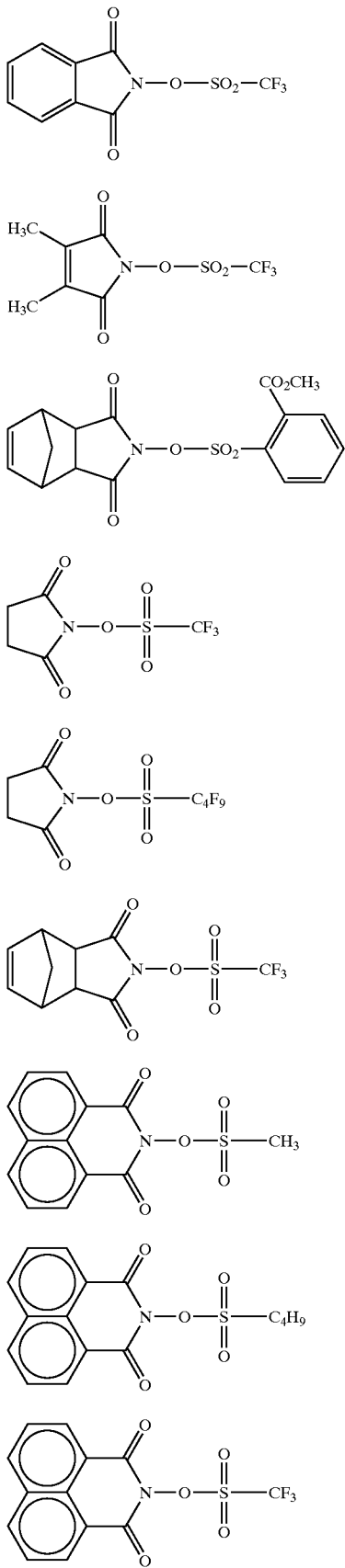
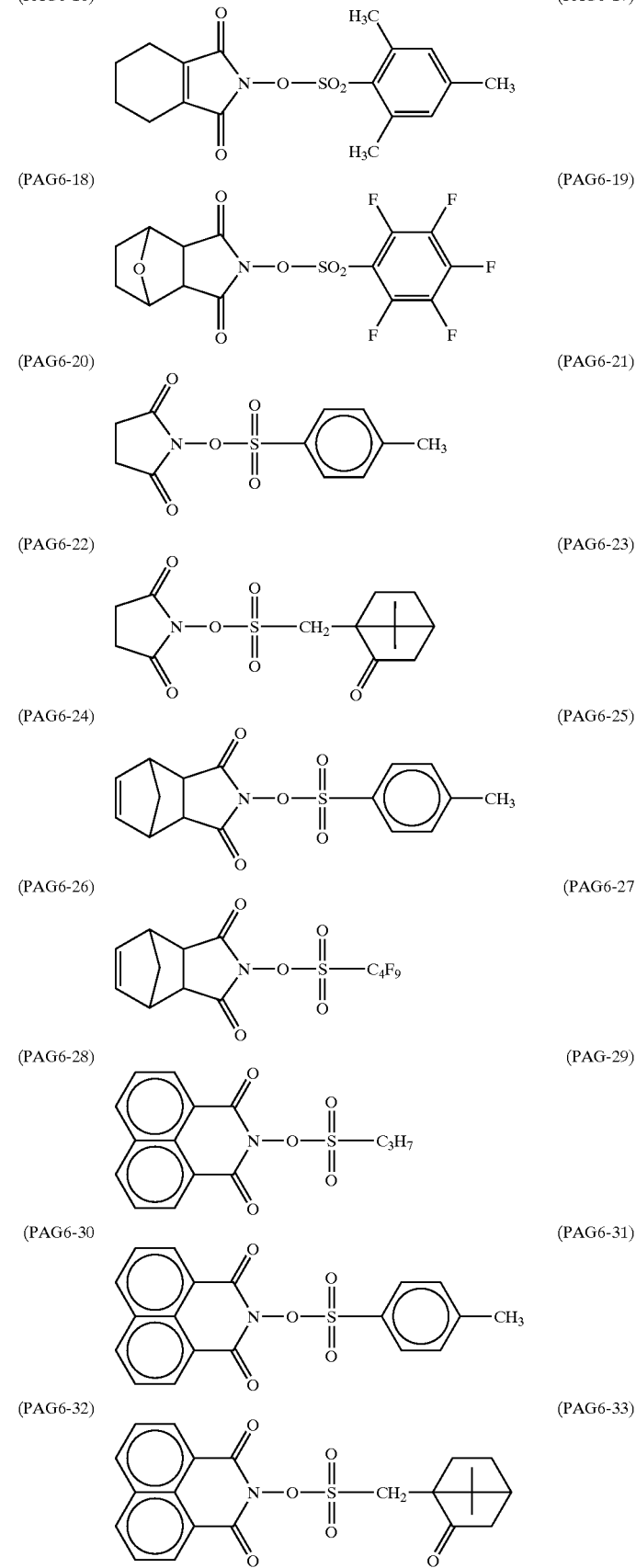

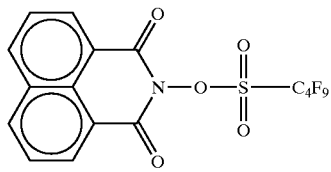
(PAG6-34)

(4) Diazodisulfone derivative represented by formula (PAG7) shown below:

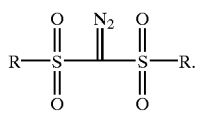
(PAG7)

In formula (PAG7), R represents a straight chain, branched or cyclic alkyl group or a substituted or unsubstituted aryl group.

Specific examples of such compounds are set forth below, but the present intention should not be construed as being limited thereto.

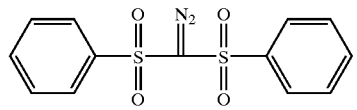
(PAG7-1)

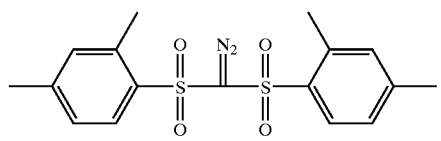
(PAG7-2)

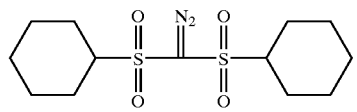
(PAG7-3)

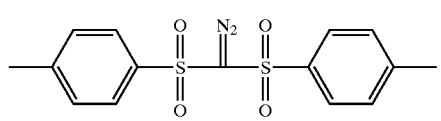
(PAG7-4)

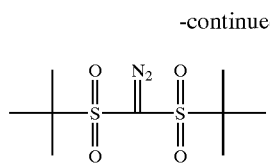
(PAG7-5)

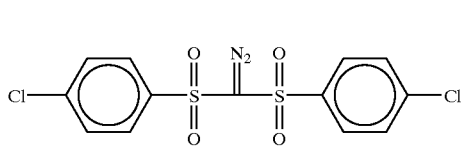
(PAG7-6)

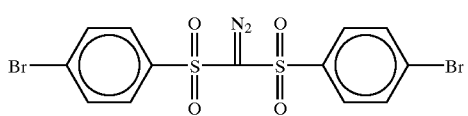
(PAG7-7)

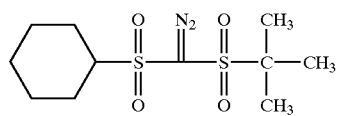
(PAG7-8)

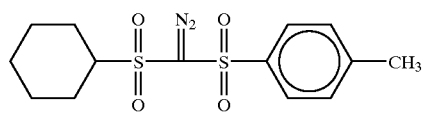
(PAG7-9)

Of the compounds decomposing upon irradiation of an actinic ray or radiation to generate an acid used together with the compound of component (A), those which can an be particularly preferably used are set forth below.

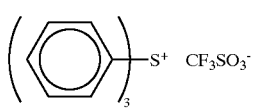
(z1)

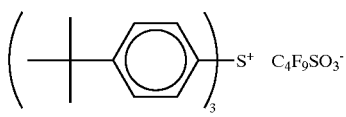
(z3)

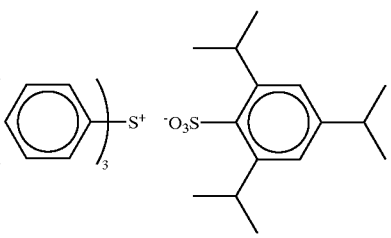
(z2)
(z4)

-continued
(z5) 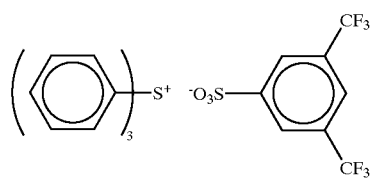
(z6) 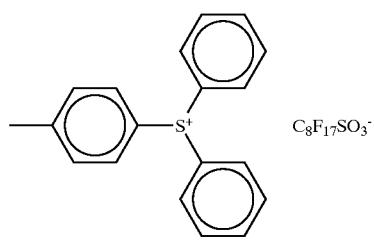
(z7) 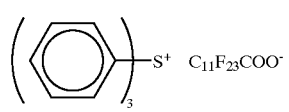
(z8) 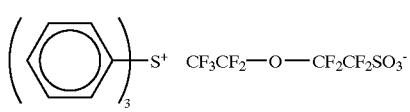
(z9) 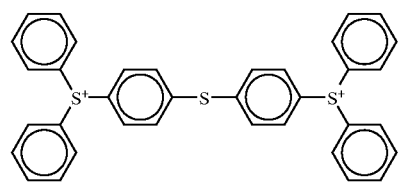 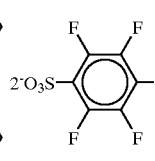
(z10) 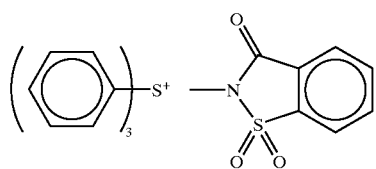
(z11) 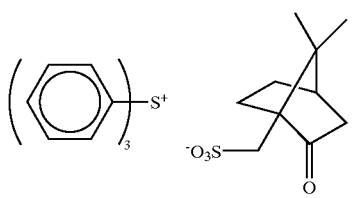
(z12) 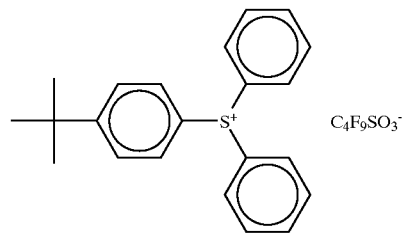
(z13) 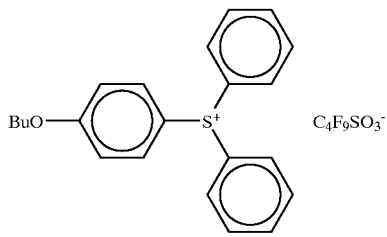
(z14) 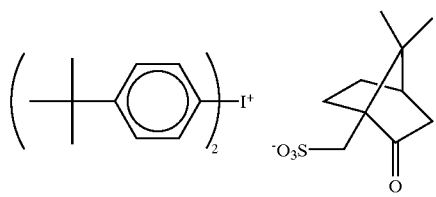
(z15) 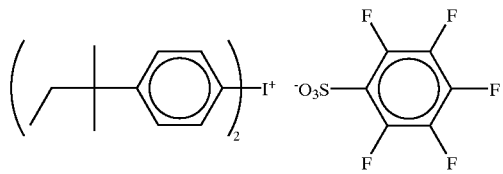
(z16) 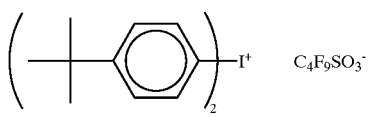
(z17) 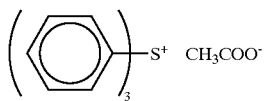
(z18) 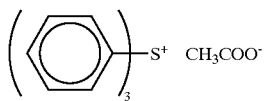
(z19) 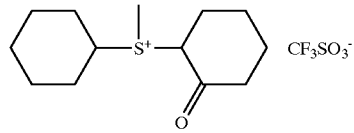
(z20) 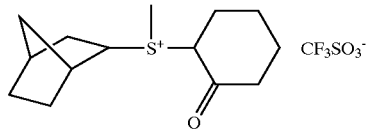

-continued
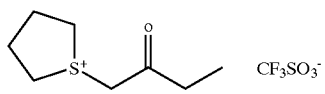 (z21)
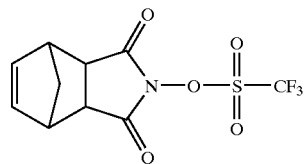 (z22)
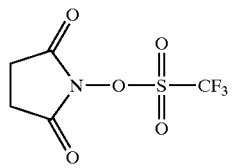 (z23)
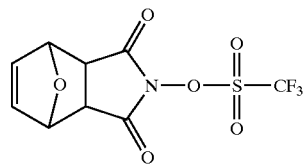 (z24)
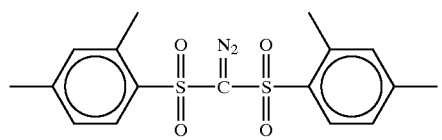 (z25)
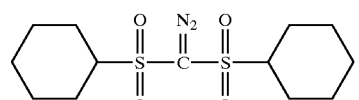 (z26)
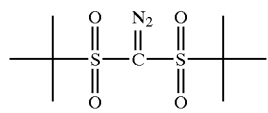 (z27)
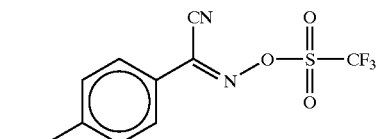 (z28)
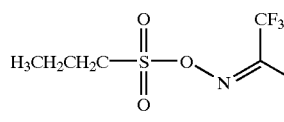 (z29)
 (z30)
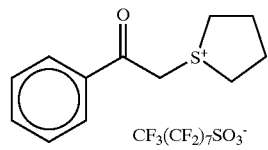 (31)
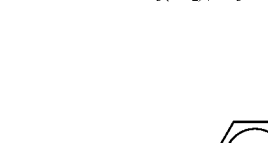 (z32)
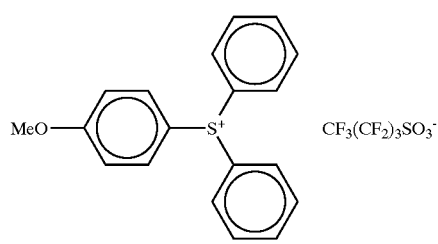 (z33)
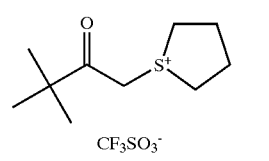 (35)
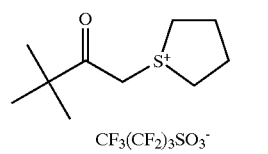 (34)
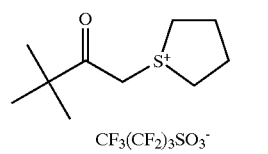 (z36)
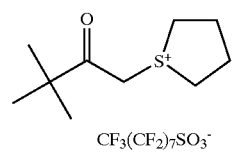 (z37)

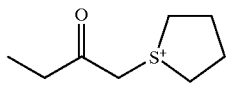
CF₃(CF₂)₃SO₃⁻ (z38)

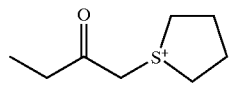
CF₃(CF₂)₇SO₃⁻ (z39)

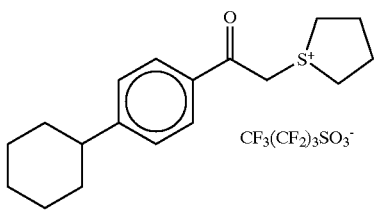
CF₃(CF₂)₃SO₃⁻ (z40)

<<(B) Resin Increasing a Solubility Rate in an Alkali Developing Solution by the Action of an Acid (Hereinafter, also Referred to as an "Acid-decomposable Resin")>>

Any resin that has a monocyclic or polycyclic alicyclic hydrocarbon structure and is decomposed by the action of an acid to increase a solubility rate in an alkali developing solution can be used as the acid-decomposable resin of component (B). Preferred examples of the resin of component (B) include resins containing at least one repeating unit selected from a repeating unit having a partial structure including an alicyclic hydrocarbon represented by formula (pI), (pII), (pIII), (pIV), (pV) or (pVI) described below and a repeating unit represented by formula (II-AB) described below.

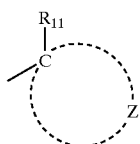
(pI)

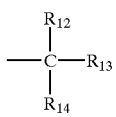
(pII)

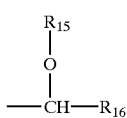
(pIII)

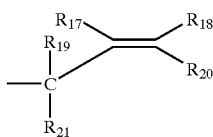
(pIV)

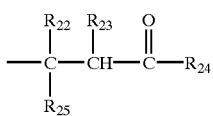
(pV)

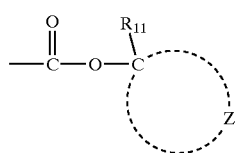
(pVI)

In the above formulae, $R_{11}$ represents a methyl group, an ethyl group, an n-propyl group, an isopropyl group, an n-butyl group, an isobutyl group or a sec-butyl group, and Z represents an atomic group necessary for forming an alicyclic hydrocarbon group together with the carbon atom.

$R_{12}$ to $R_{16}$ each independently represent a straight chain or branched alkyl group having from 1 to 4 carbon atoms or an alicyclic hydrocarbon group, provided that at least one of $R_{12}$ to $R_{14}$, and either $R_{15}$ or $R_{16}$ represents an alicyclic hydrocarbon group.

$R_{17}$ to $R_{21}$ each independently represent a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms or an alicyclic hydrocarbon group.

$R_{22}$ to $R_{25}$ each independently represent a straight chain or branched alkyl group having from 1 to 4 carbon atoms or an alicyclic hydrocarbon group, provided that at least one of $R_{22}$ to $R_{25}$ represents an alicyclic hydrocarbon group. Alternatively, $R_{23}$ and $R_{24}$ may be combined with each other to form a ring.

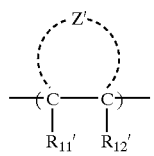
(II-AB)

In formula (II-AB), $R_{11}'$ and $R_{12}'$, which may be the same or different, each independently represent a hydrogen atom, a cyano group, a halogen atom or an alkyl group which may have a substituent.

Z' represents an atomic group necessary for forming an alicyclic structure, which may be substituted, together with the connected two carbon atoms (C—C).

Of the repeating units represented by formula (II-AB), those represented by formulae (II-A) and (II-B) shown below are more preferred.

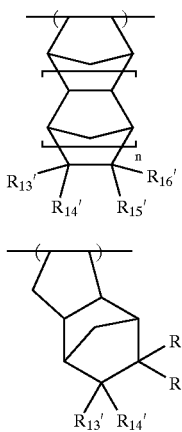

(II-A)

(II-B)

In formulae (II-A) and (II-B), $R_{13}'$ to $R_{16}'$, which may be the same or different, each independently represents a hydrogen atom, a halogen atom, a cyano group, —COOH, —COOR$_5$, a group capable of decomposing by the action of acid, —C(=O)—X-A'-R$_{17}'$, an alkyl group which may have a substituent or a cyclic hydrocarbon group which may have a substituent.

$R_5$ represents an alkyl group which may have a substituent, a cyclic hydrocarbon group which may have a substituent or a group represented by Y.

X represents an oxygen atom, a sulfur atom, —NH—, —NHSO$_2$— or —NHSO$_2$NH—.

A' represents a single bond or a divalent linkage group. Alternatively, at least two of $R_{13}'$ to $R_{16}'$ may be combined with each other to form a ring. n represents 0 or 1.

$R_{17}'$ represents —COOH, —COOR$_5$, —CN, a hydroxy group, an alkoxy group which may have a substituent, —CO—NH—R$_6$, —CO—NH—SO$_2$—R$_6$ or a group represented by Y. $R_6$ represents an alkyl group which may have a substituent or a cyclic hydrocarbon group which may have a substituent.

The group represented by Y has the following formula:

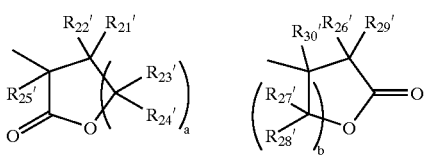

wherein $R_{21}'$ to $R_{30}'$, which may be the same or different, each independently represents a hydrogen atom or an alkyl group which may have a substituent, and a and b each represent 1 or 2.

In formulae (pI) to (pVI), the alkyl group for $R_{12}$ to $R_{25}$ includes a straight chain or branched alkyl group having from 1 to 4 carbon atoms, which may be substituted. Examples of the alkyl group include methyl, ethyl, n-propyl, isopropyl, n-butyl, isobutyl, sec-butyl and tert-butyl groups.

Examples of the substituent for the alkyl group include an alkoxy group having from 1 to 4 carbon atoms, a halogen atom (e.g., fluorine, chlorine, bromine or iodine atom), an acyl group, an acyloxy group, a cyano group, a hydroxy group, a carboxy group, an alkoxycarbonyl group and a nitro group.

The alicyclic hydrocarbon group in $R_{11}$ to $R_{25}$ or the alicyclic hydrocarbon group formed by Z and the carbon atoms may be a monocyclic group or a polycyclic group, and includes specifically a group having not less than 5 carbon atoms and including, for example, a monocyclic, bicyclic, tricyclic or tetracyclic structure. The number of carbon atoms included is preferably from 6 to 30, and more preferably from 7 to 25. The alicyclic hydrocarbon group may have a substituent.

Examples of the structure of alicyclic portion in the alicyclic hydrocarbon group are set forth below.

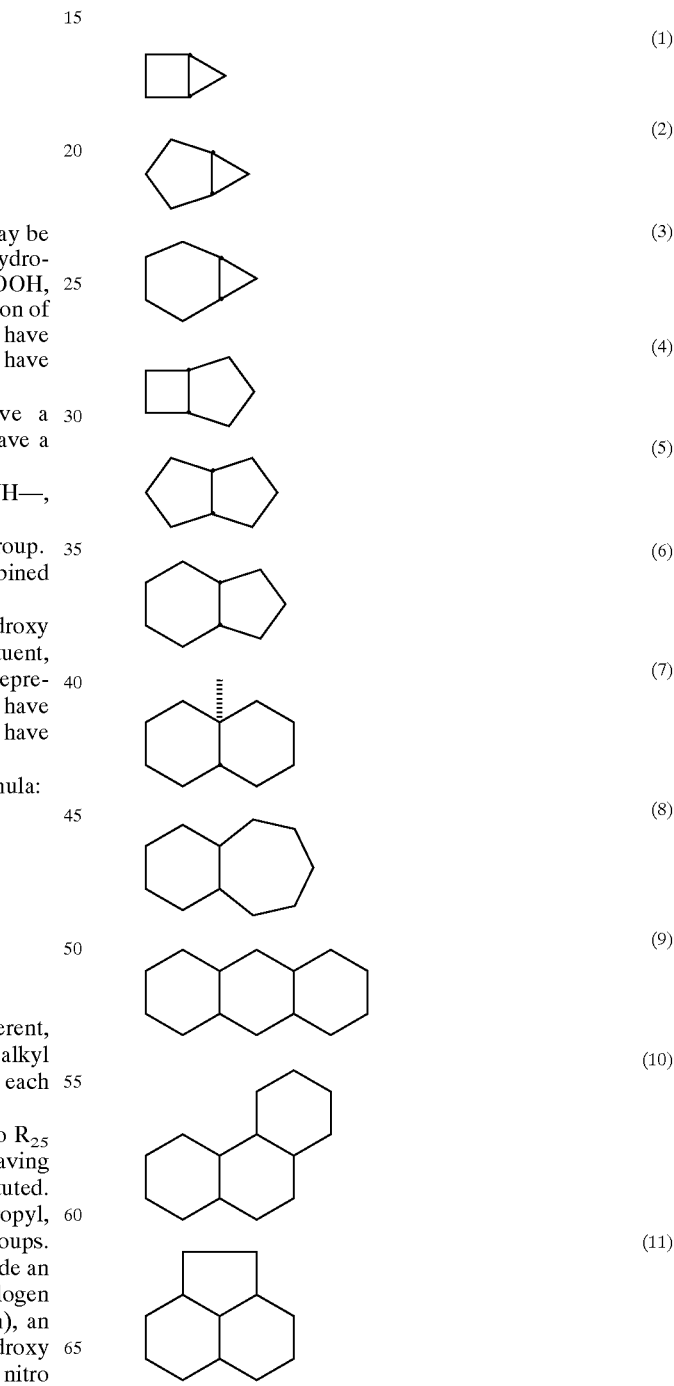

-continued
(12) 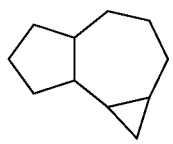
(13) 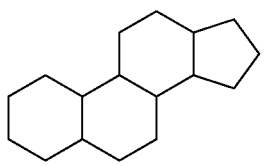
(14) 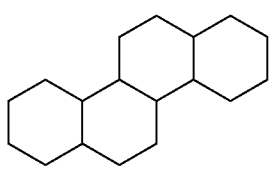
(15) 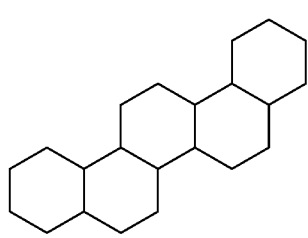
(16) 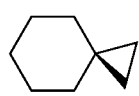
(17) 
(18) 
(19) 
(20) 
(21) 
(22) 
(23) 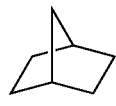
-continued
(24) 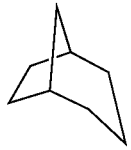
(25) 
(26) 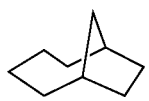
(27) 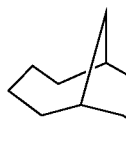
(28) 
(29) 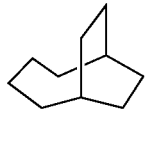
(30) 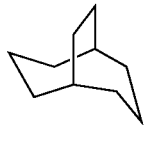
(31) 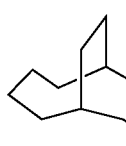
(32) 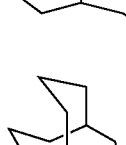
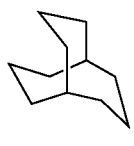
(33) 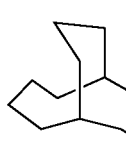
(34) 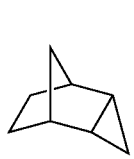

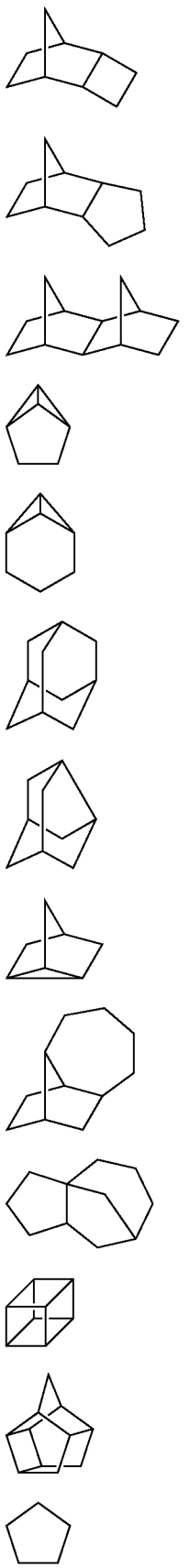

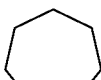

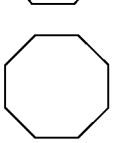

Preferred examples of the alicyclic portion for use in the present invention include an adamantyl group, a noradamantyl group, a decalin residue, a tricyclodecanyl group, a tetracyclododecanyl group of a norbornyl group, a cedrol group, a cyclohexyl group, a cycloheptyl group, a cyclooctyl group, a cyclodecanyl group and a cyclododecanyl group. Of these groups, an adamantyl group, a decalin residue, a norbornyl group, a cedrol group, a cyclohexyl group, a cycloheptyl group, a cyclooctyl group, a cyclodecanyl group and a cyclododecanyl group are more preferred.

Examples of the substituent for the alicyclic hydrocarbon group include an alkyl group, a substituted alkyl group, a halogen atom, a hydroxy group, an alkoxy group, a carboxy group and an alkoxycarbonyl group. The alkyl group is preferably a lower alkyl group, for example, methyl, ethyl, propyl, isopropyl or butyl group, and more preferably methyl, ethyl, propyl or isopropyl group. Examples of the substituent for the substituted alkyl group include a hydroxy group, a halogen atom and an alkoxy group. The alkoxy group includes an alkoxy group having from 1 to 4 carbon atoms, for example, methoxy, ethoxy, propoxy or butoxy group.

The structure represented by any one of formulae (pI) to (pVI) in the resin can be used for protecting an alkalisoluble group. The alkali-soluble group includes various groups known in the field of art.

Specific examples of the alkali-soluble group include a carboxylic acid group, a sulfonic acid group, a phenol group and a thiophenol group, and a carboxylic acid group and a sulfonic acid group are preferably used.

The alkali-soluble group protected by the structure represented by any one of formulae (pI) to (pVI) in the resin preferably includes groups represented by the following formulae (pVII) to (pXI):

-continued

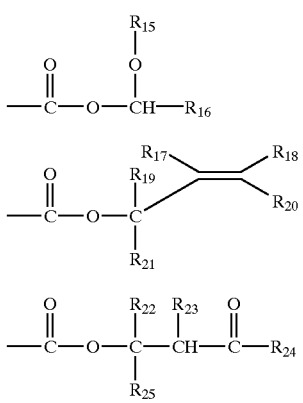

In the above formulae, $R_{11}$ to $R_{25}$ and Z has the same meanings as defined above, respectively.

A repeating unit having the alkali-soluble group protected by the structure represented by any one of formulae (pI) to (pVI) in the resin is preferably it represented by the following formula (pA);

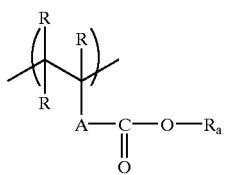

In the formula, R's, which may be the same or different, each represent a hydrogen atom, a halogen atom or a straight chain or branched alkyl group having from 1 to 4 carbon atoms, which may be substituted.

A represents a single bond, an alkylene group, a substituted alkylene group, an ether group, a thioether group, a carbonyl group, an ester group, an amido group, a sulfonamido group, a urethane group, a urea group or a combination of two or more thereof.

$R_a$ represents any one of the groups represented by formulae (pI) to (pVI).

Specific examples of the monomer corresponding to the repeating unit represented by formula (pA) are set forth below, but the present invention should not be construed as being limited thereto.

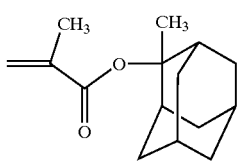

1

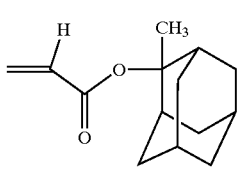

2

-continued

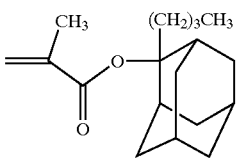

3

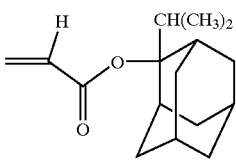

4

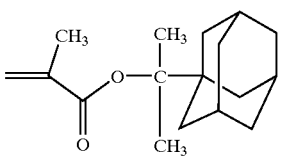

5

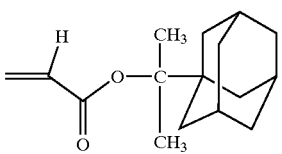

6

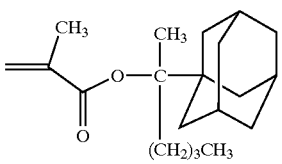

7

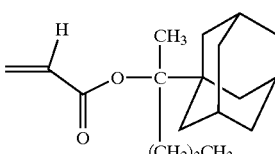

8

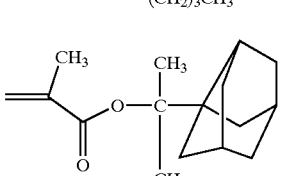

9

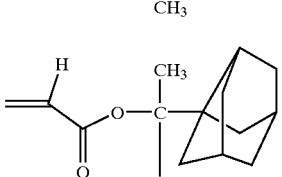

10

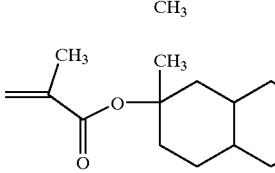

11

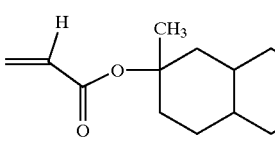

12

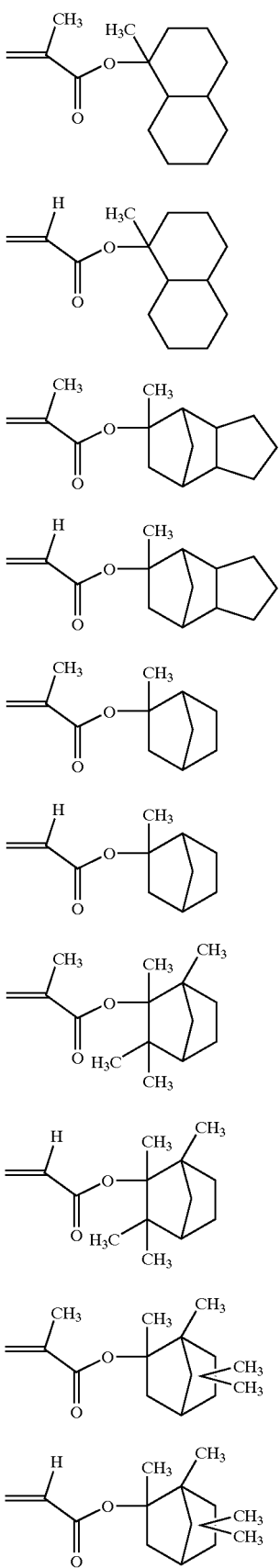
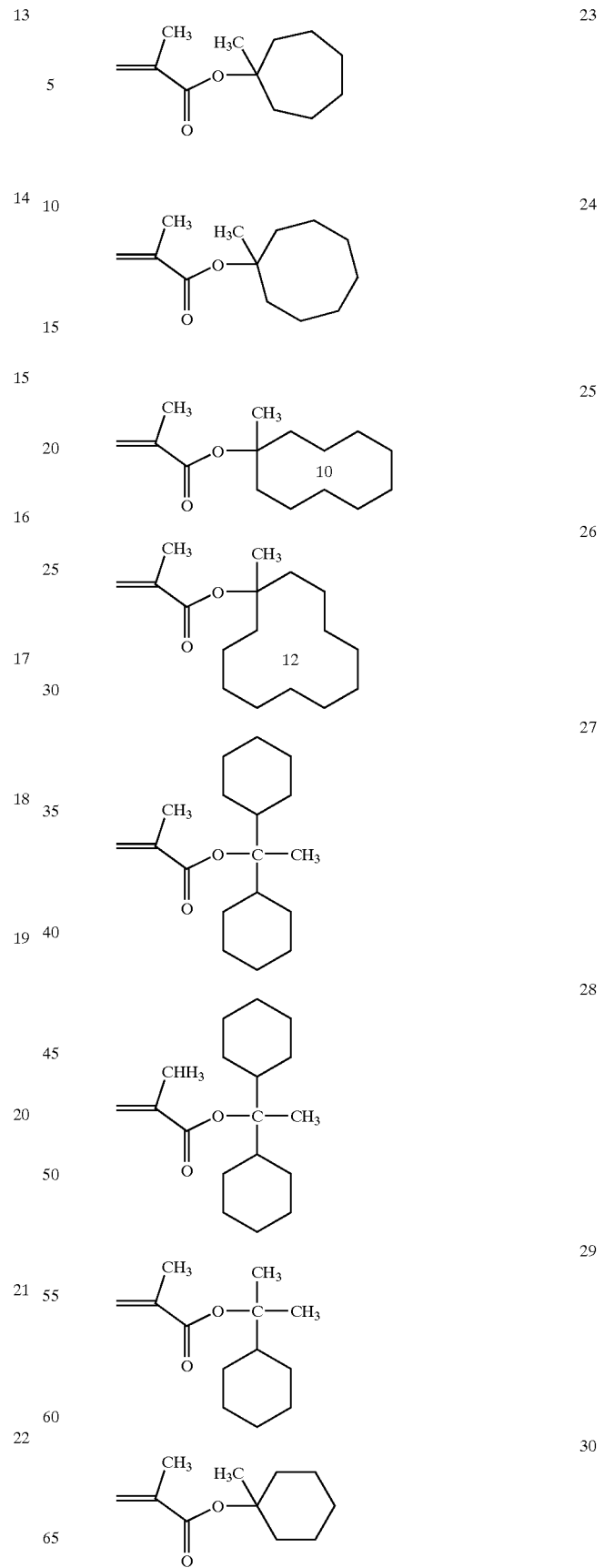

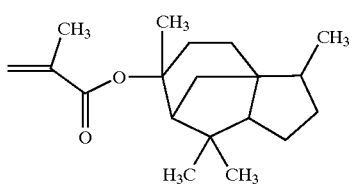

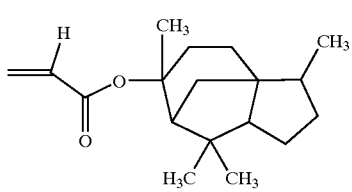

31

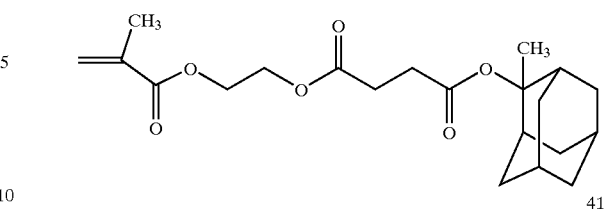

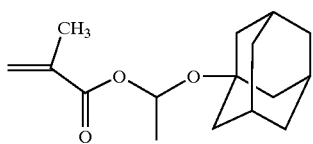

32

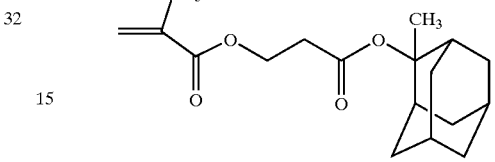

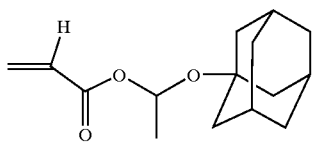

In formula (II-AB), $R_{11}'$ and $R_{12}'$, which may be the same or different, each independently represent a hydrogen atom, a cyano group, a halogen atom or an alkyl group which may have a substituent.

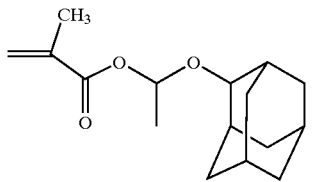

Z' represents an atomic group necessary for forming an alicyclic structure, which may be substituted, together with the connected two carbon atoms (C—C).

The halogen atom for $R_{11}'$ or $R_{12}'$ includes, for example, chlorine, bromine, fluorine and iodine atoms.

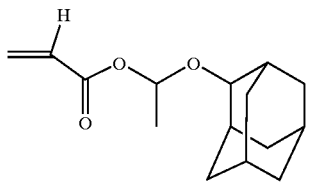

The alkyl group for each of $R_{11}'$, $R_{12}'$ and $R_{21}'$ to $R_{30}'$ includes preferably a straight chain or branched alkyl group having from 1 to 10 carbon atoms, more preferably a straight chain or branched alkyl group having from 1 to 6 carbon atoms, and still more preferably methyl, ethyl, propyl, isopropyl, n-butyl, isobutyl, sec-butyl and tert-butyl groups.

Examples of the substituent for the alkyl group include a hydroxy group, a halogen atom, a carboxy group, an alkoxy group, an acyl group, a cyano group and an acyloxy group. The halogen atom includes chlorine, bromine, fluorine and iodine atoms. The alkoxy group includes an alkoxy group having from 1 to 4 carbon atoms, for example, methoxy, ethoxy, propoxy or butoxy group. The acyl group includes, for example, formyl or acetyl group. The acyloxy group includes, for example, an acetoxy group.

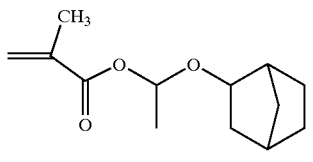

The atomic group necessary for forming an alicyclic structure represented by Z' is an atomic group necessary for forming a repeating unit of alicyclic hydrocarbon moiety, which may be substituted. In particular, an atomic group necessary for forming a bridged alicyclic structure, by which a repeating unit of the bridged alicyclic hydrocarbon is completed, is preferred.

The skeleton of the bridged alicyclic hydrocarbon formed includes those described below.

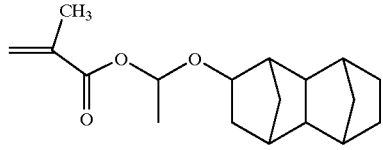

(1)

(2)

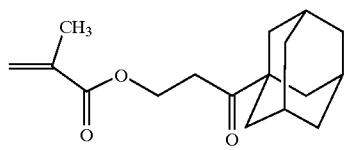

(3)

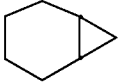

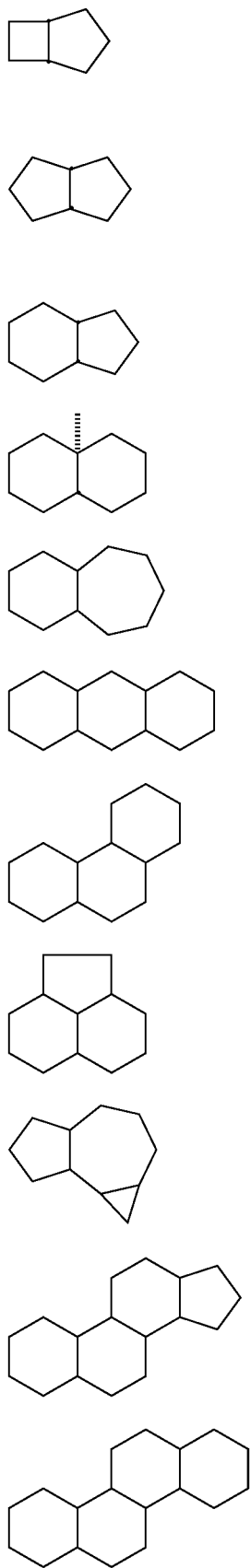
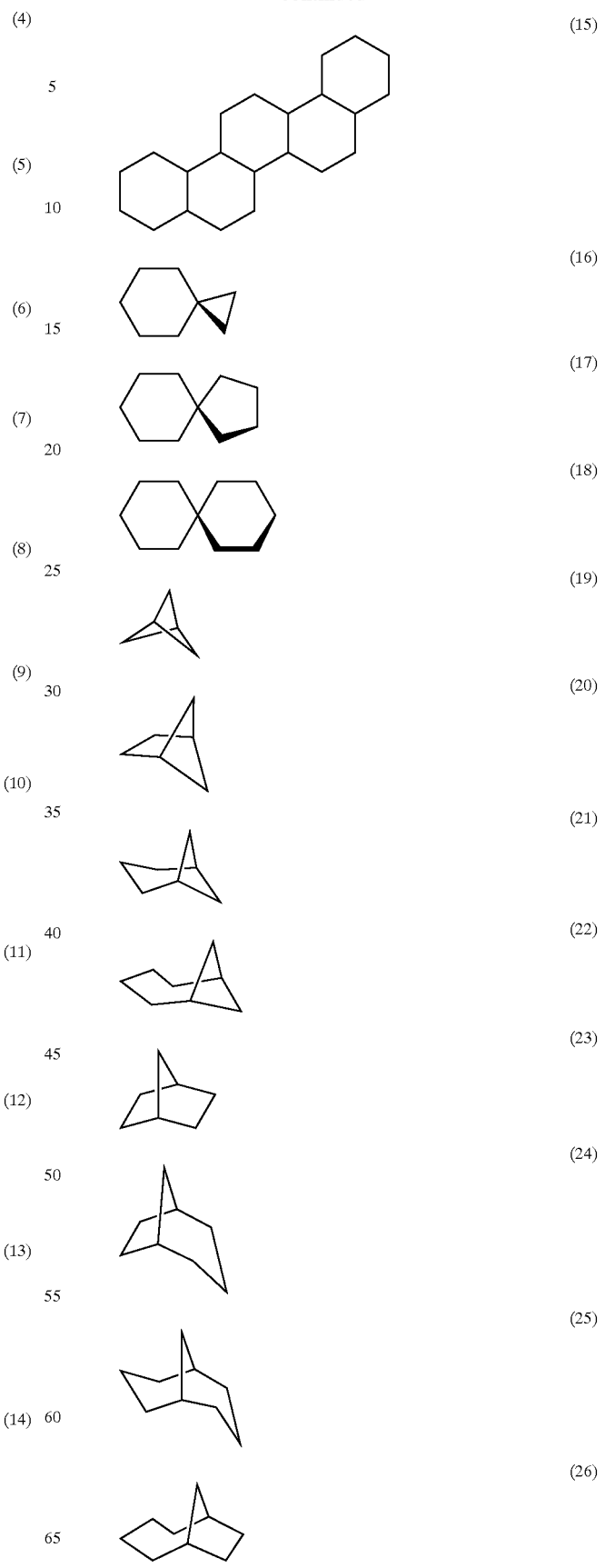

(27) 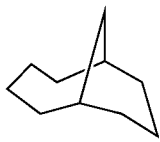

(28) 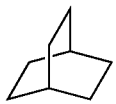

(29) 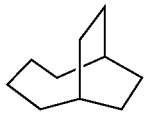

(30) 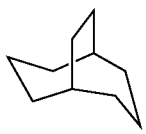

(31) 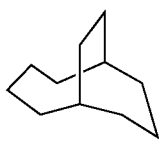

(32) 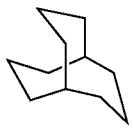

(33) 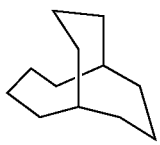

(34) 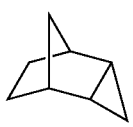

(35) 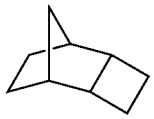

(36) 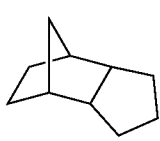

(37) 

(38) 

(39) 

(40) 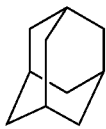

(41) 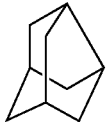

(42) 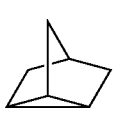

(43) 

(44) 

(45) 

(46) 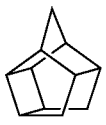

(47) 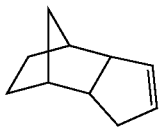

Of the skeletons of the bridged alicyclic hydrocarbon described above, (5), (6), (7), (9), (10), (13), (14), (15), (23), (28), (36), (37), (42) and (47) are preferred.

The skeleton of the alicyclic hydrocarbon may have a substituent. Examples of the substituent include the atoms and groups represented by $R_{13}'$ to $R_{16}'$ in formula (II-A) or (II-B).

Of the repeating units containing the bridged alicyclic hydrocarbon, those represented by formulae (II-A) and (II-B) described above are more preferred.

In formulae (II-A) and (II-B), $R_{13}'$ to $R_{16}'$, which may be the same or different, each independently represents a hydrogen atom, a halogen atom, a cyano group, —COOH, —COOR$_5$, a group capable of decomposing by the action of acid, —C(=O)—X-A'-R$_{17}'$, an alkyl group which may have a substituent or a cyclic hydrocarbon group which may have a substituent.

$R_5$ represents an alkyl group which may have a substituent, a cyclic hydrocarbon group which may have a substituent or a group represented by Y.

X represents an oxygen atom, a sulfur atom, —NH—, —NHSO$_2$— or —NHSO$_2$NH—.

A' represents a single bond or a divalent linkage group.

Alternatively, at least two of $R_{13}$' to $R_{16}$' may be combined with each other to form a ring. n represents 0 or 1.

$R_{17}$' represents —COOH, —COOR$_5$, —CN, a hydroxy group, an alkoxy group which may have a substituent, —CO—NH—R$_6$, —CO—NH—SO$_2$—R$_6$ or a group represented by Y. $R_6$ represents an alkyl group which may have a substituent or a cyclic hydrocarbon group which may have a substituent.

In the group represented by Y, $R_{21}$' to $R_{30}$', which may be the same or different, each independently represents a hydrogen atom or an alkyl group which may have a substituent, and a and b each represent 1 or 2.

In the resin according to the present invention, an acid-decomposable group may be incorporated into the above described —C(=O)—X-A'-$R_{17}$' or as a substituent for Z' in formula (II-AB).

The acid-decomposable group includes a group represented by the following formula:

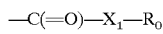

In the formula, $R_0$ represents a tertiary alkyl group, for example, tert-butyl or tert-amyl group, an isobornyl group, an 1-alkoxyethyl group, for example, 1-ethoxyethyl, 1-butoxyethyl, 1-isobutoxyethyl or 1-cyclohexyloxyethyl group, an alkoxymethyl group, for example, 1-metoxymethyl or 1-ethoxymethyl group, a 3-oxoalkyl group, a tetrahydropyranyl group, a tetrahydrofuryl group, a trialkylsilyl ester group, a 3-oxocyclohexyl ester group, a 2-methyl-2-adamantyl group or a mevalonic lactone residue, and $X_1$ has the same meaning as X defined above.

The halogen atom for each of $R_{13}$' or $R_{16}$' includes, for example, chlorine, bromine, fluorine and iodine atoms.

The alkyl group for each of $R_5$, $R_6$ and $R_{13}$' to $R_{16}$' includes preferably a straight chain or branched alkyl group having from 1 to 10 carbon atoms, more preferably a straight chain or branched alkyl group having from 1 to 6 carbon atoms, and still more preferably methyl, ethyl, propyl, isopropyl, n-butyl, isobutyl, sec-butyl and tert-butyl groups.

The cyclic hydrocarbon group for each of $R_5$, $R_6$ and $R_{13}$' to $R_{16}$' includes a cyclic alkyl group and a bridged hydrocarbon moiety, for example, cyclopropyl, cyclopentyl, cyclohexyl, adamantyl, 2-methyl-2-adamantyl, norbornyl, bornyl, isobornyl, tricyclodecanyl, dicyclopentenyl, norbornaneepoxy, menthyl, isomenthyl, neomenthyl or tetracyclododecanyl group.

The ring formed by combining at least two of $R_{13}$' to $R_{16}$' includes a ring having from 5 to 12 carbon atoms, for example, cyclopentene, cyclohexene, cycloheptane or cyclooctane ring.

The alkoxy group for $R_{17}$' includes an alkoxy group having from 1 to 4 carbon atoms, for example, methoxy, ethoxy, propoxy or butoxy group.

Examples of the substituent for the alkyl group, cyclic hydrocarbon group or alkoxy group described above include a hydroxy group, a halogen atom, a carboxy group, an alkoxy group, an acyl group, a cyano group, an acyloxy group, an alkyl group and a cyclic hydrocarbon group. The halogen atom includes, for example, chlorine, bromine, fluorine and iodine atoms. The alkoxy group includes an alkoxy group having from 1 to 4 carbon atoms, for example, methoxy, ethoxy, propoxy or butoxy group. The acyl group includes, for example, formyl and acetyl groups. The acyloxy group includes, for example, an acetoxy group.

The alkyl group and cyclic hydrocarbon group include those described above.

The divalent linkage group for A' includes a single bond, an alkylene group, a substituted alkylene group, an ether group, a thioether group, a carbonyl group, an ester group, an amido group, a sulfonamido group, a urethane group, a urea group and a combination of two or more thereof.

Examples of the alkylene group or substituted alkylene group for A' include a group represented by the following formula:

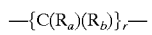

In the formula, $R_a$ and $R_b$, which may be the same or different, each represent a hydrogen atom, an alkyl group, a substituted alkyl group, a halogen atom, a hydroxy group or an alkoxy group, and r represents an integer of from 1 to 10.

The alkyl group includes preferably a lower alkyl group, for example, methyl, ethyl, propyl, isopropyl or butyl group, and more preferably methyl, ethyl, propyl Of or isopropyl group. Examples of the substituent for the substituted alkyl group include a hydroxy group, a halogen atom and an alkoxy group. The alkoxy group includes an alkoxy group having from 1 to 4 carbon atoms, for example, methoxy, ethoxy, propoxy or butoxy group. The halogen atom includes, for example, chlorine, bromine, fluorine and iodine atoms.

In the resin of component (B) according to the present invention, the acid-decomposable group may be incorporated into at least one repeating unit selected from the repeating unit having a partial structure including an alicyclic hydrocarbon represented by formula (pI), (pII), (pIII), (pIV), (pV) or (pVI), the repeating unit represented by formula (II-AB), and a repeating unit of a copolymerization component described hereinafter.

Various atoms and groups represented by $R_{13}$' to $R_{16}$' in formula (II-A) or (II-B) constitute substituents for the atomic group necessary for forming an alicyclic structure or a bridged alicyclic structure represented by Z' in formula (II-AB).

Specific examples of the repeating unit represented by formula (II-A) or (II-B) are set forth below as [II-1] to [II-175], but the present invention should not be construed as being limited thereto.

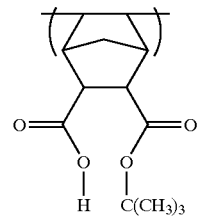

[II-1]

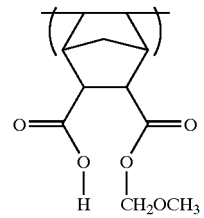

[II-2]

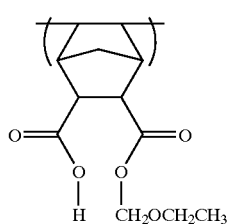
[II-3]
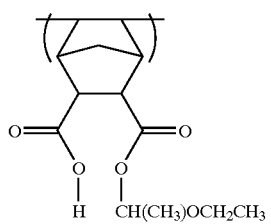
[II-4]
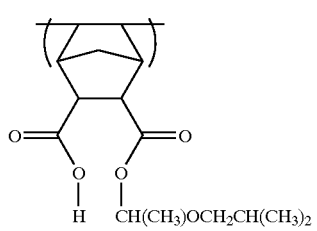
[II-5]
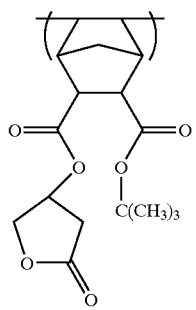
[II-6]
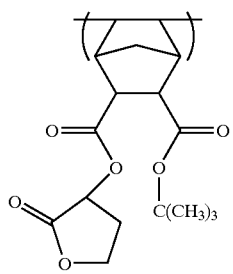
[II-7]
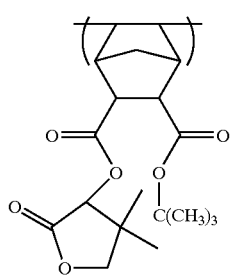
[II-8]
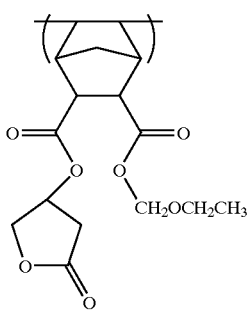
[II-9]
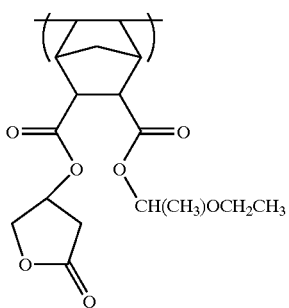
[II-10]
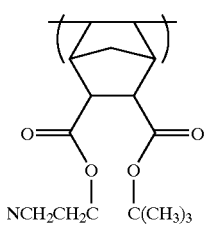
[II-11]
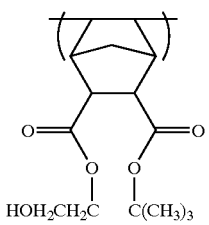
[II-12]
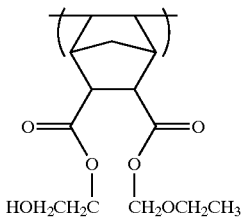
[II-13]
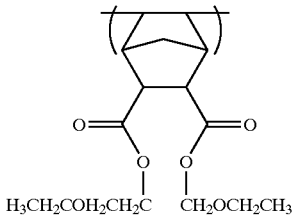
[II-14]

[II-15] 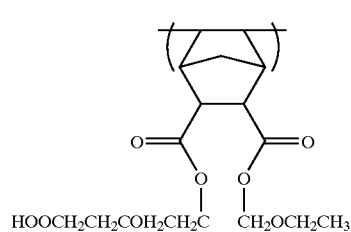
[II-16] 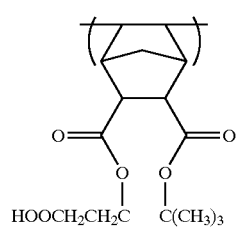
[II-17] 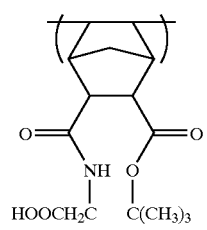
[II-18] 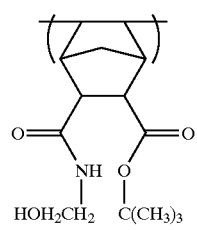
[II-19] 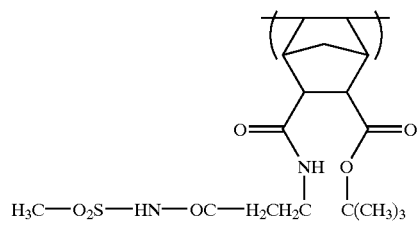
[II-20] 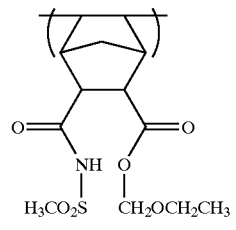
[II-21] 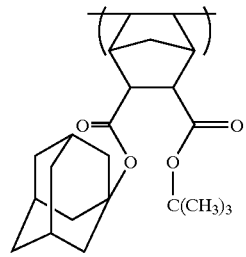
[II-22] 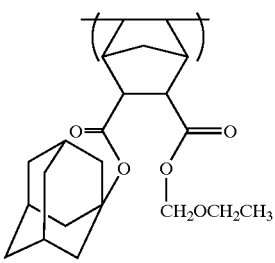
[II-23] 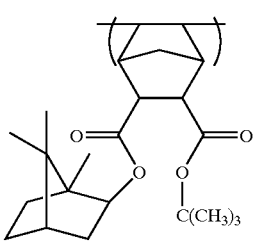
[II-24] 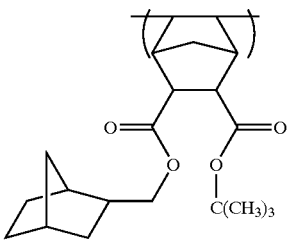
[II-25] 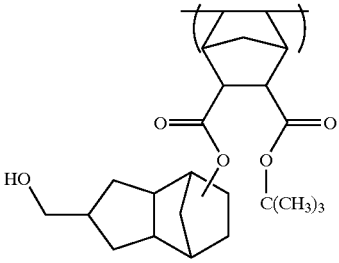
[II-26] 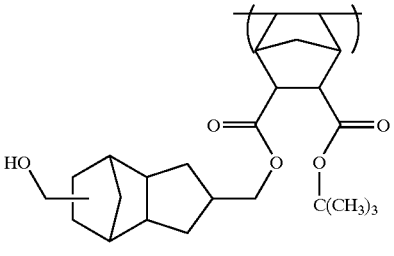
[II-27] 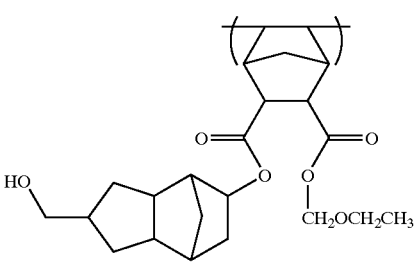

-continued
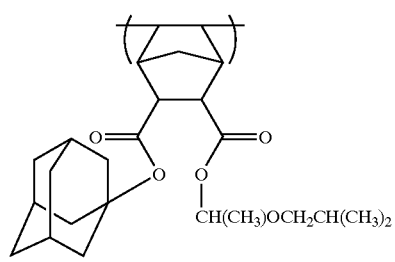
[II-28]
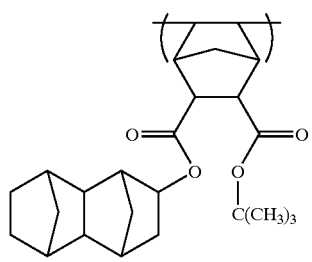
[II-29]
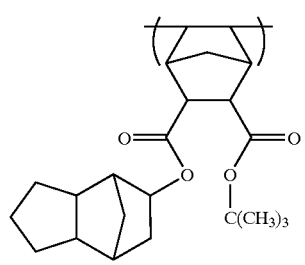
[II-30]
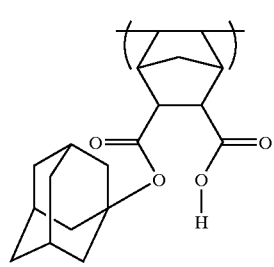
[II-31]
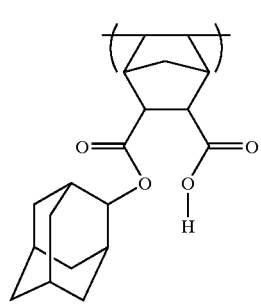
[II-32]
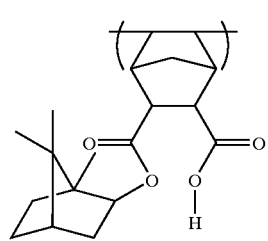
[II-33]
-continued
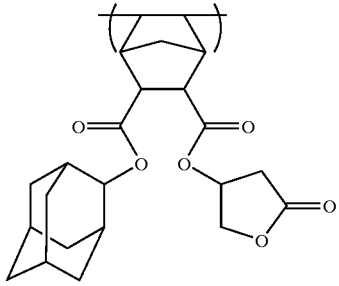
[II-34]
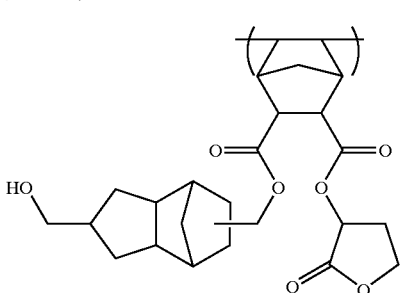
[II-35]
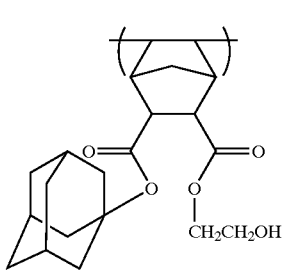
[II-36]
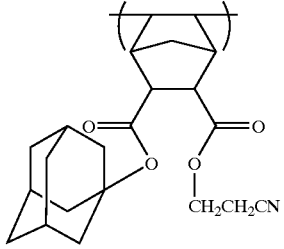
[II-37]
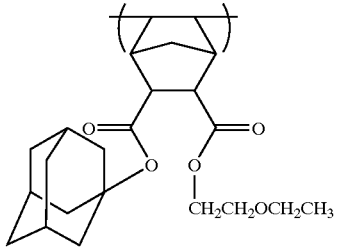
[II-38]
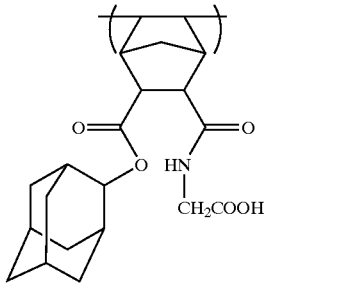
[II-39]

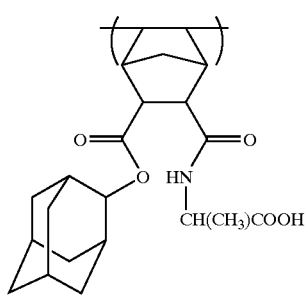
[II-40]
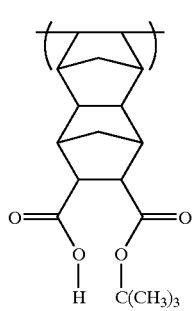
[II-41]
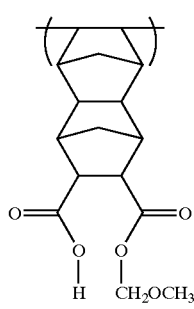
[II-42]
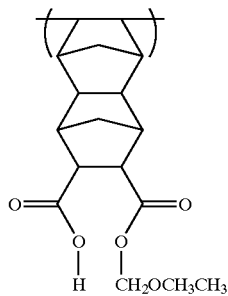
[II-43]
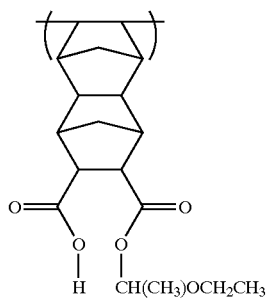
[II-44]
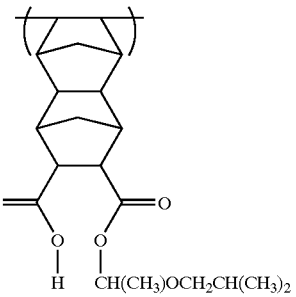
[II-45]
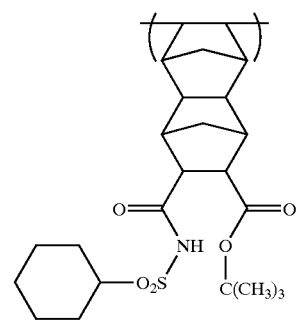
[II-46]
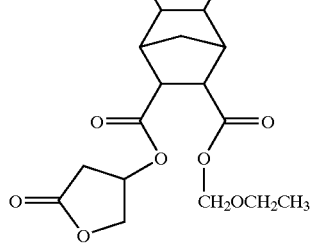
[II-47]
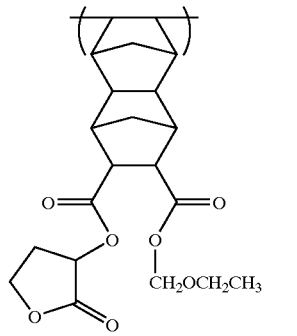
[II-48]
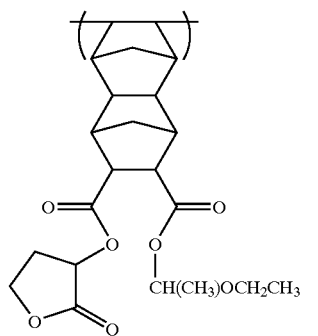
[II-49]

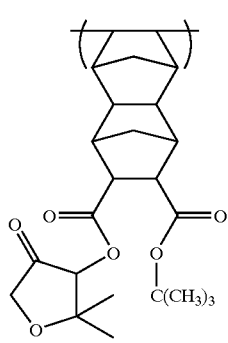
[II-50]
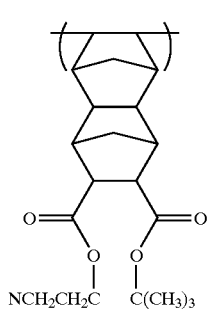
[II-51]
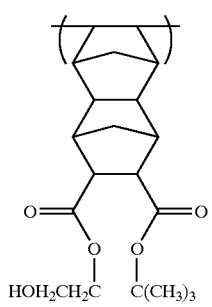
[II-52]
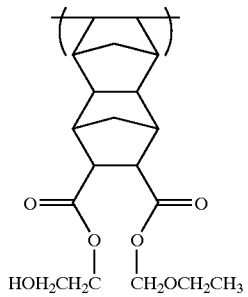
[II-53]
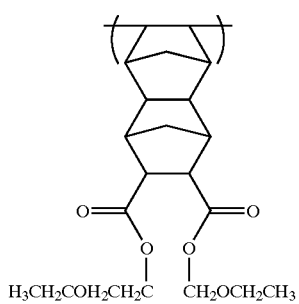
[II-54]
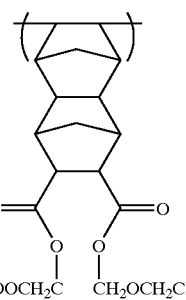
[II-55]
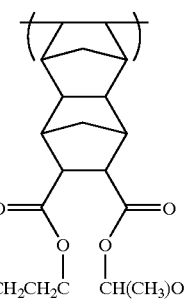
[II-56]
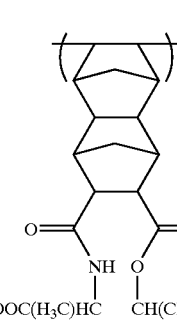
[II-57]
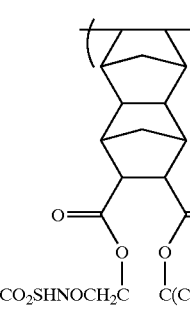
[II-58]
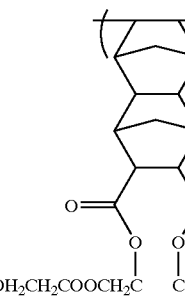
[II-59]

[II-60] 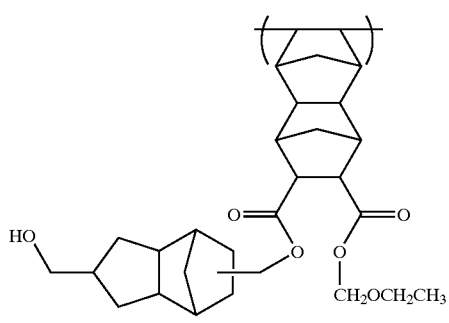
[II-61] 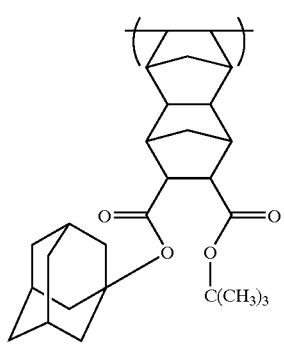
[II-64] 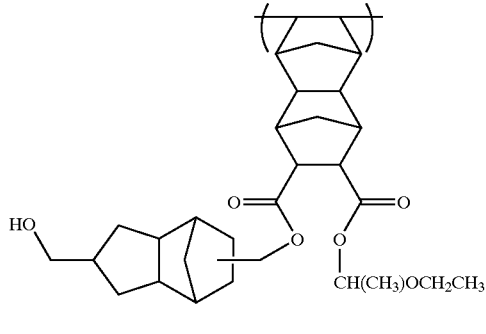
[II-65] 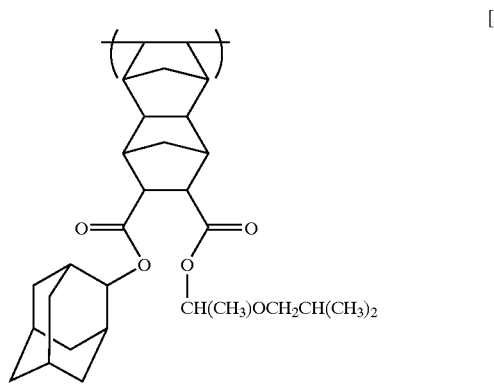
[II-62] 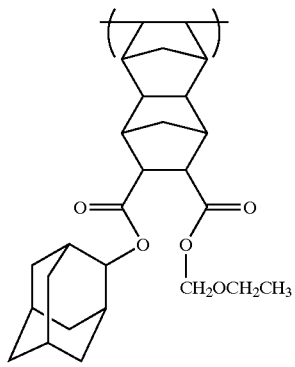
[II-66] 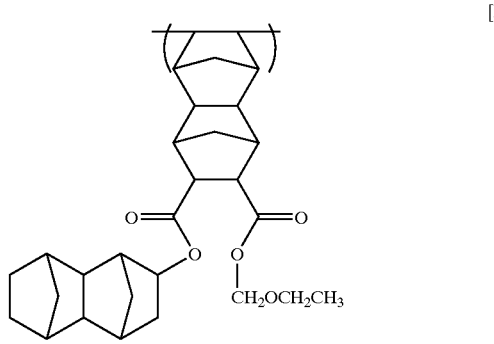
[II-63] 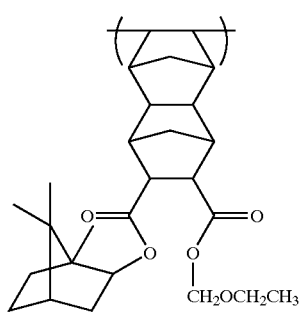
[II-67] 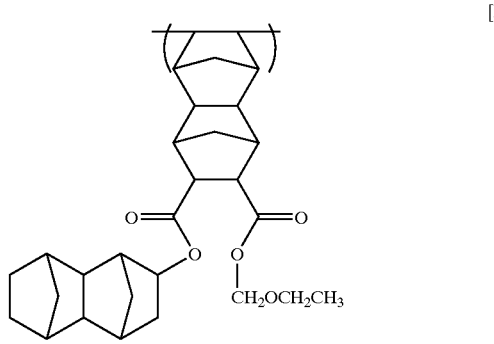

[II-68] 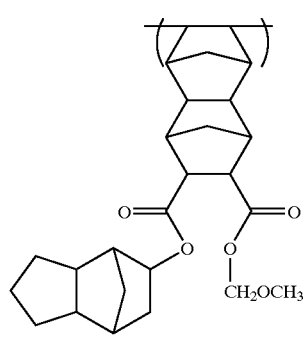
[II-69] 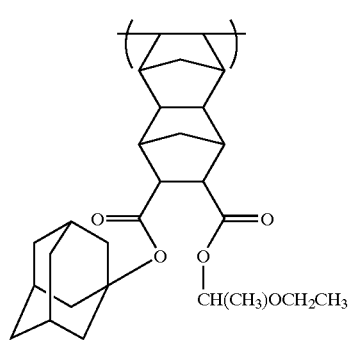
[II-70] 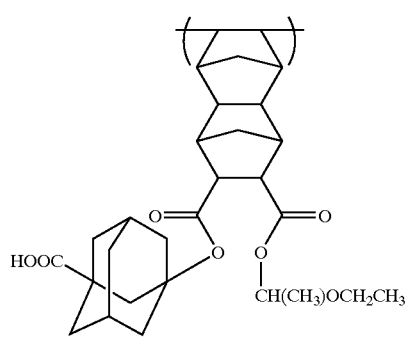
[II-71] 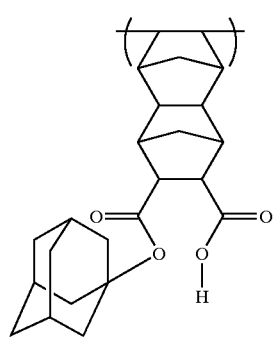
[II-72] 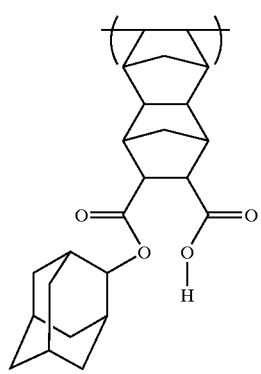
[II-73] 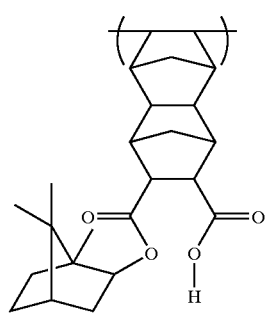
[II-74] 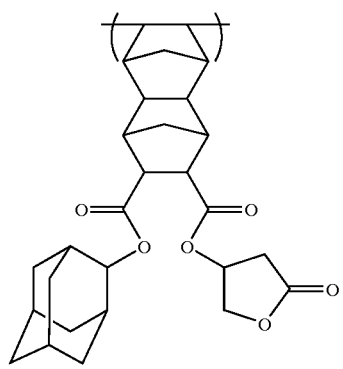
[II-75] 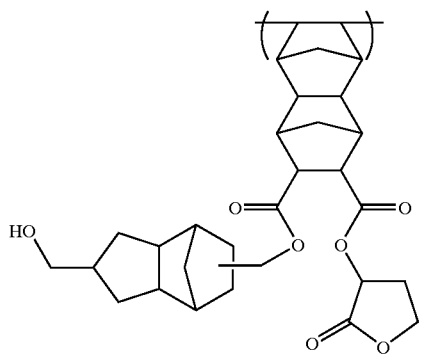

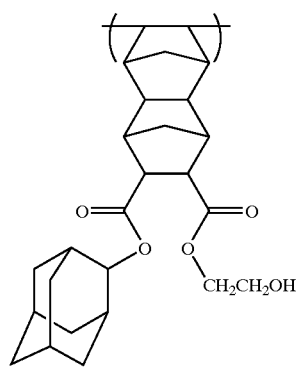 [II-76]
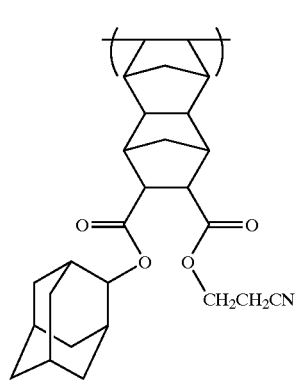 [II-77]
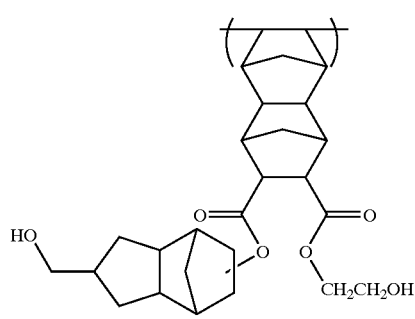 [II-78]
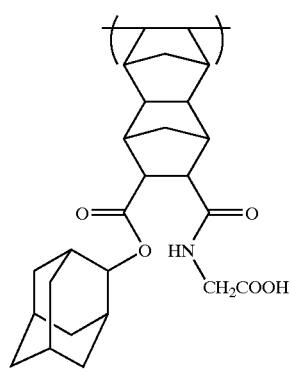 [II-79]
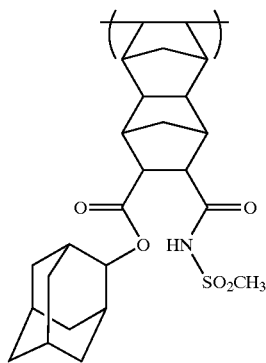 [II-80]
[II-81]
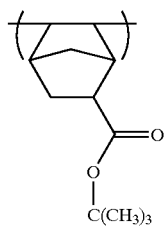
[II-82]
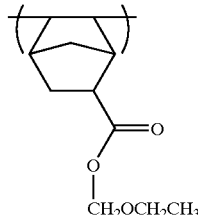
[II-83]
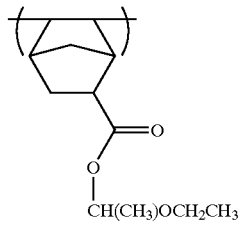
[II-84]
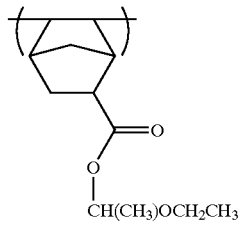
[II-85]
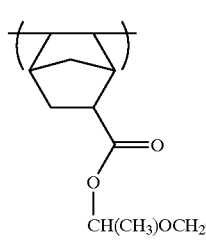

[II-86]
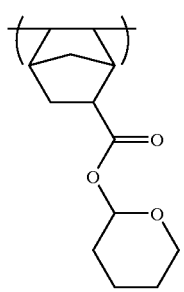
[II-87]
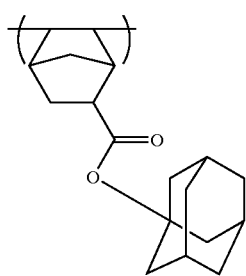
[II-88]
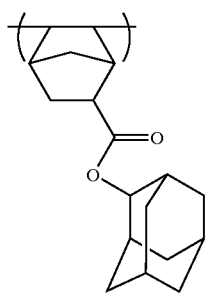
[II-89]
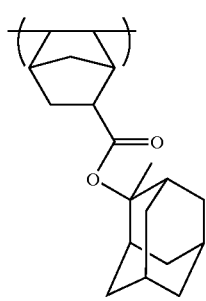
[II-90]
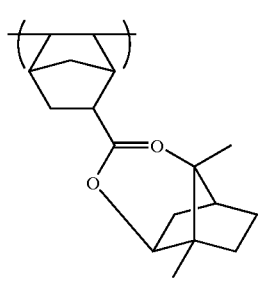
[II-91]
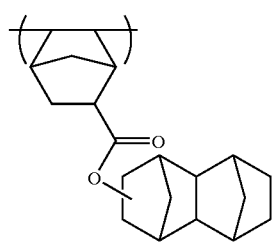
[II-92]
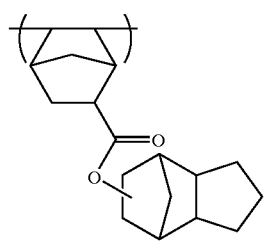
[II-93]
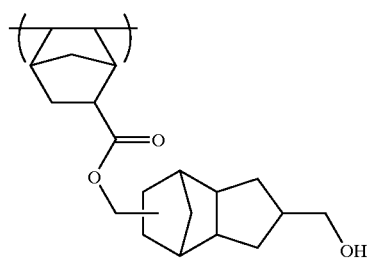
[II-94]
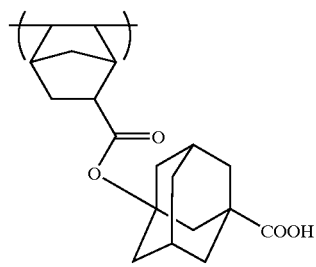
[II-95]
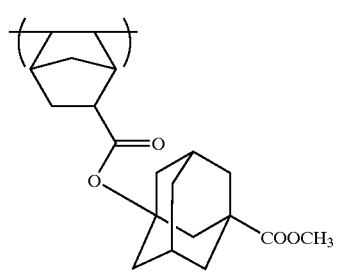
[II-96]
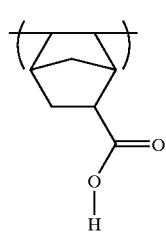

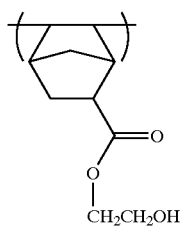 [II-97]
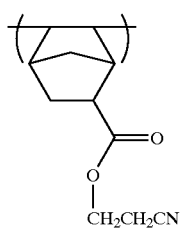 [II-98]
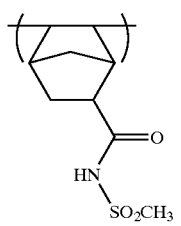 [II-99]
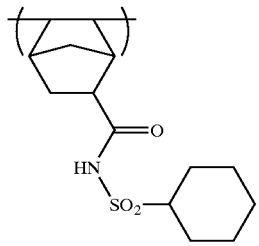 [II-100]
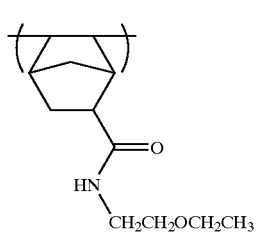 [II-101]
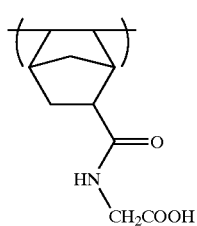 [II-102]
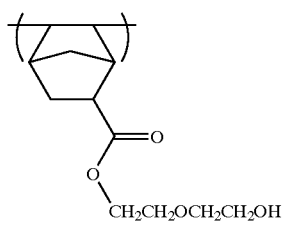 [II-103]
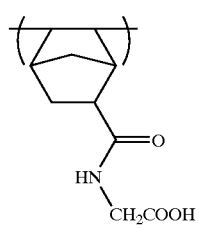 [II-104]
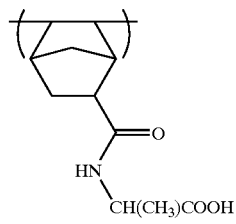 [II-105]
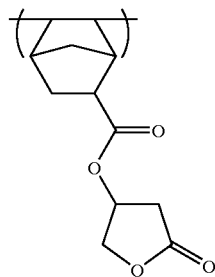 [II-106]
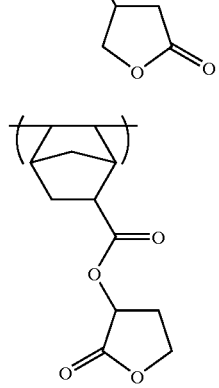 [II-107]
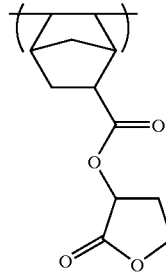 [II-108]
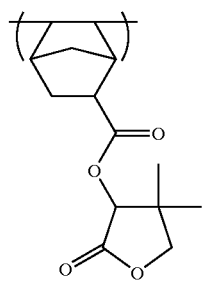 [II-108]
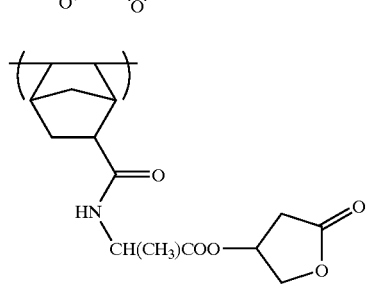 [II-109]

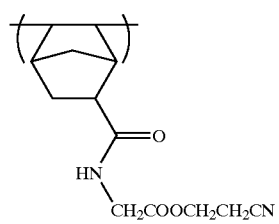
[II-110]
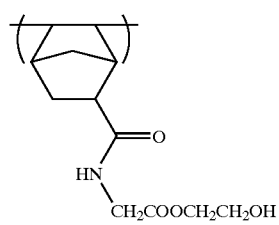
[II-111]
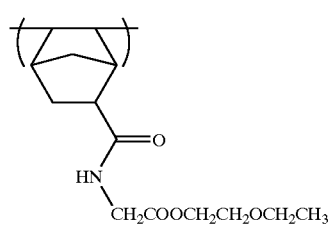
[II-112]
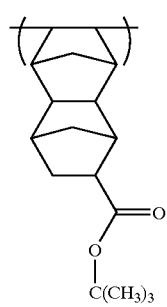
[II-113]
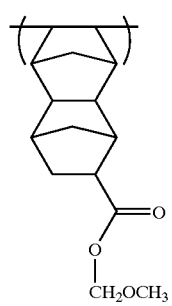
[II-114]
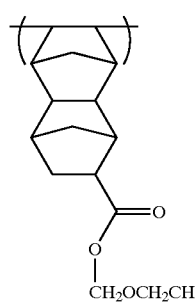
[II-115]
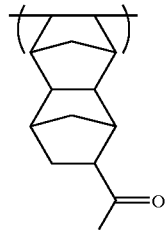
[II-116]
[II-117]
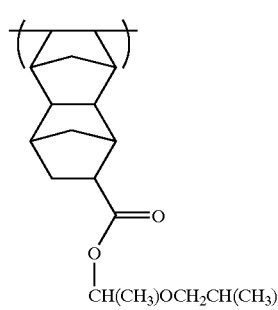
[II-118]
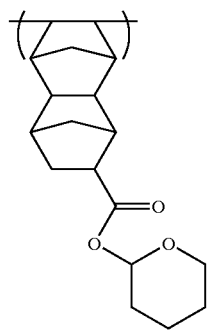
[II-119]
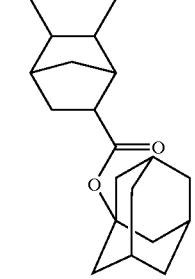
[II-120]
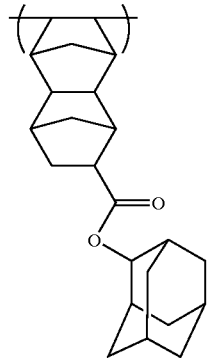

[II-121]
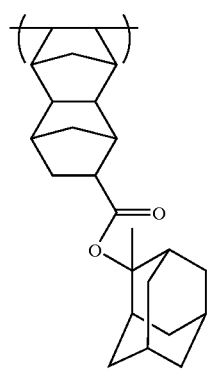
[II-122]
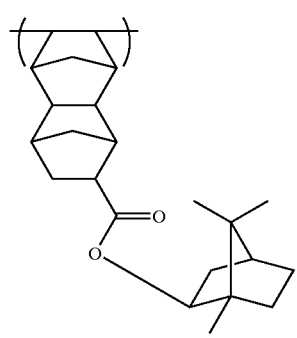
[II-123]
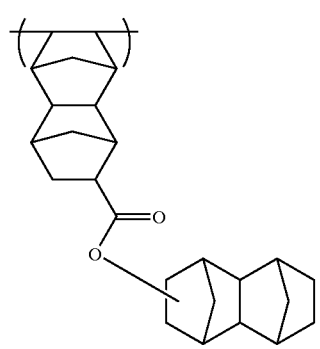
[II-124]
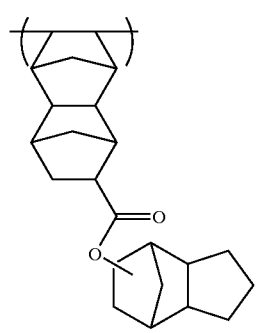
[II-125]
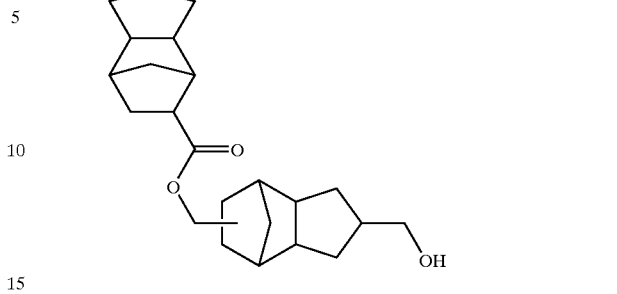
[II-126]
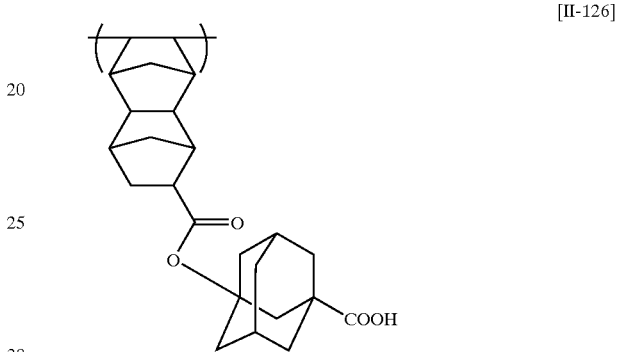
[II-127]
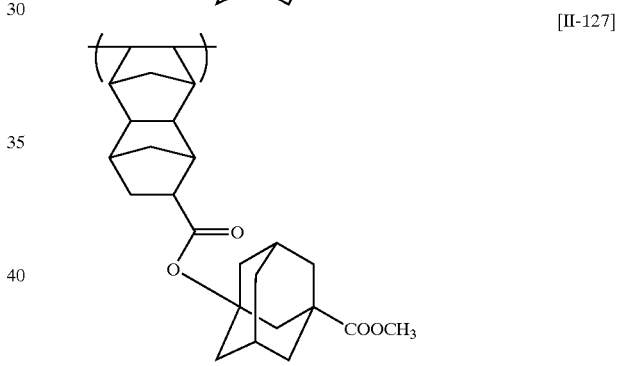
[II-128]
[II-129]
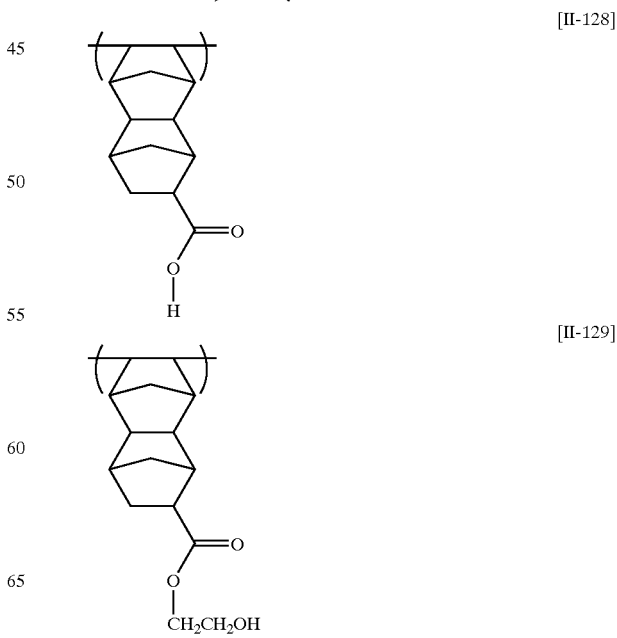

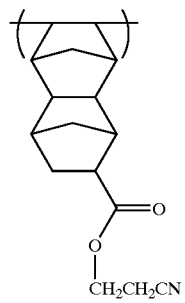
[II-130]
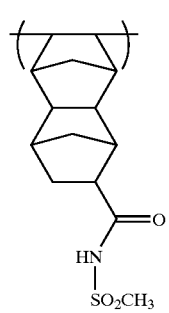
[II-131]
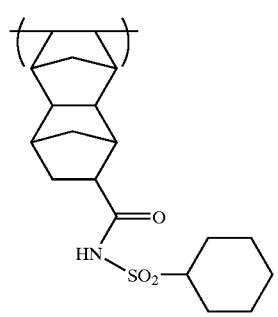
[II-132]
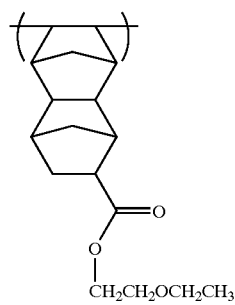
[II-133]
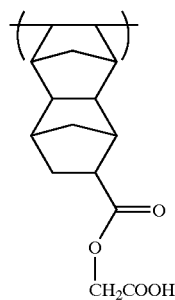
[II-134]
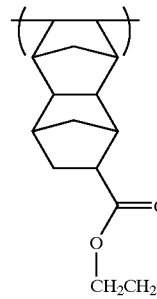
[II-135]
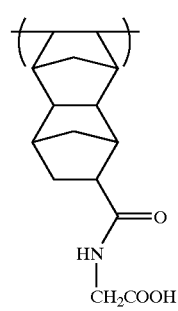
[II-136]
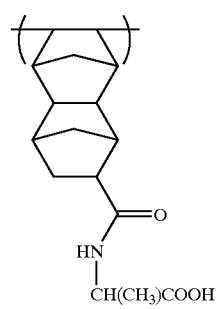
[II-137]
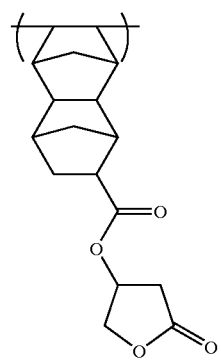
[II-138]
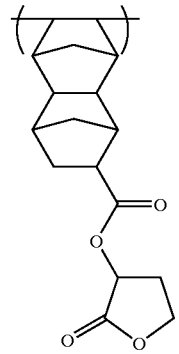
[II-139]

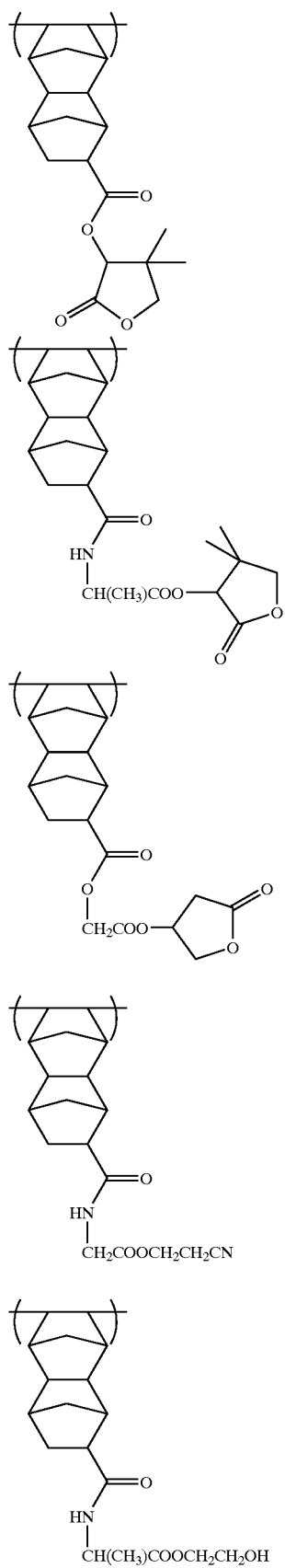
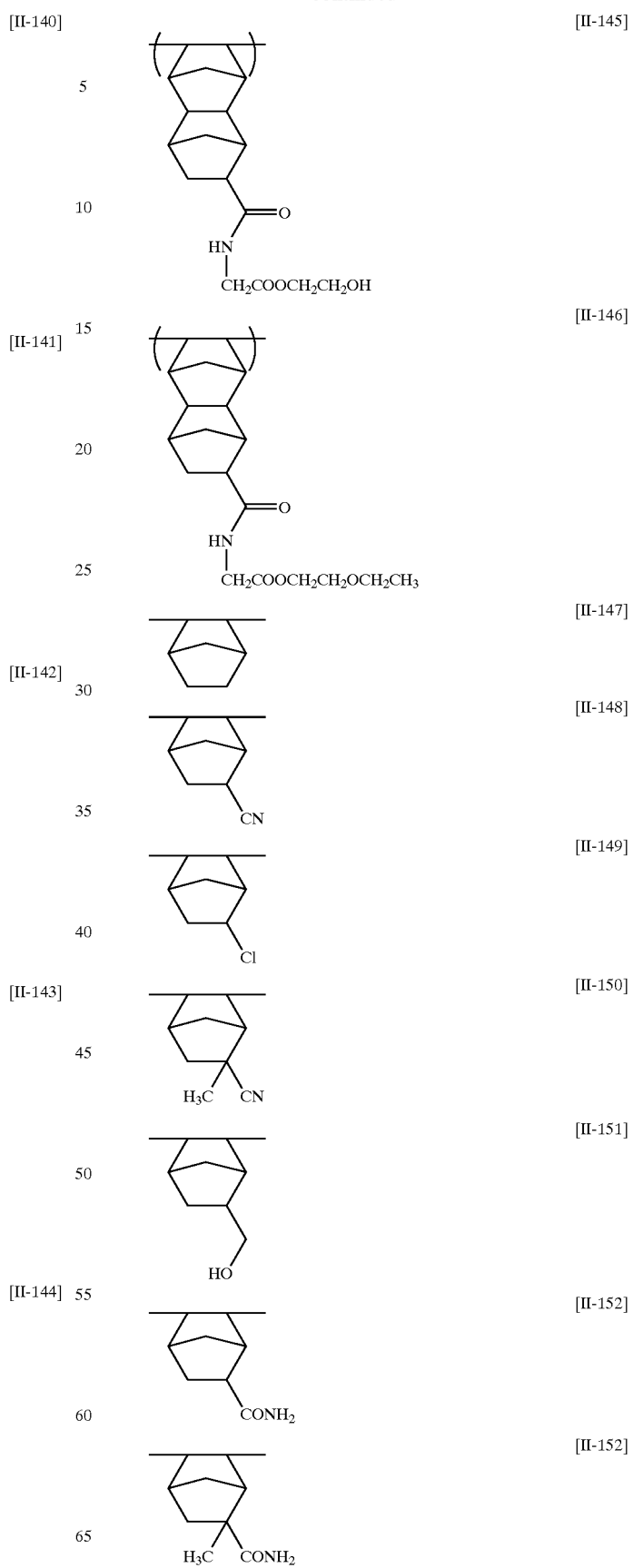

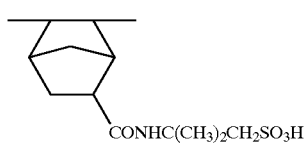
[II-153]
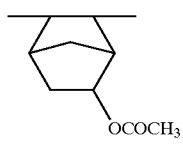
[II-154]
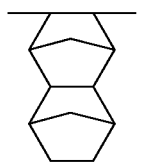
[II-155]
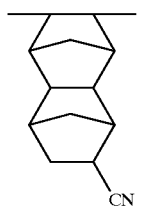
[II-156]
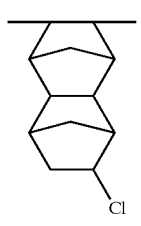
[II-157]
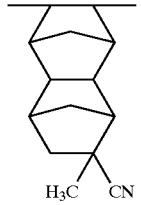
[II-158]
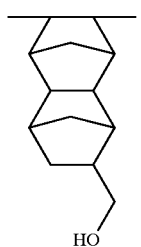
[II-159]
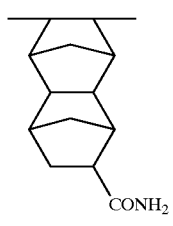
[II-160]
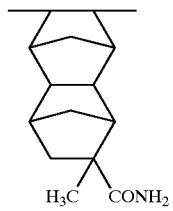
[II-161]
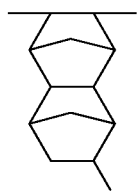
[II-162]
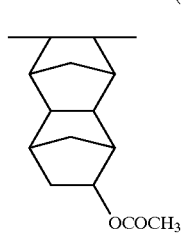
[II-163]
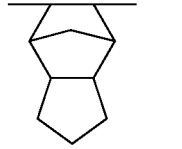
[II-164]
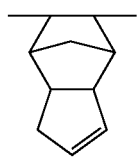
[II-165]
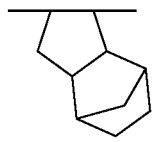
[II-166]
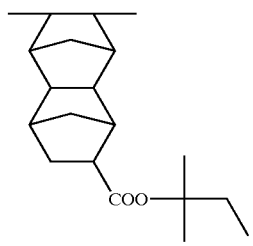
[II-167]
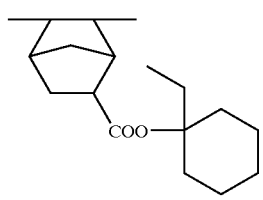
[II-168]

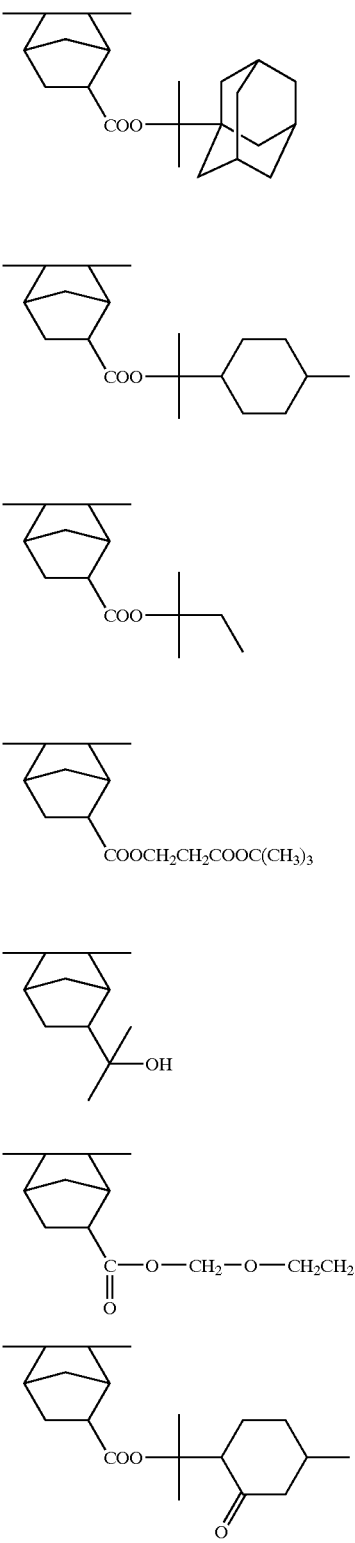

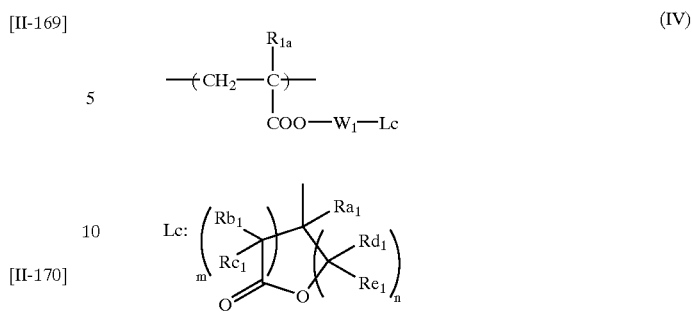

In formula (IV), $R_{1a}$ represents a hydrogen atom or a methyl group.

$W_1$ represents a single bond, an alkylene group, an ether group, a thioether group, a carbonyl group, an ester group or a combination of two or more thereof.

$R_{a1}$, $R_{b1}$, $R_{c1}$, $R_{d1}$ and $R_{e1}$, which may be the same or different, each independently represent a hydrogen atom or an alkyl group having from 1 to 4 carbon atoms m and n, which may be the same or different, each independently represent an integer of from 0 to 3, provided that the sum total of m and n is from 2 to 6.

The alkyl group having from 1 to 4 carbon atoms represented by $R_{a1}$, $R_{b1}$, $R_{c1}$, $R_{d1}$ or $R_{e1}$ includes, for example, methyl, ethyl, propyl, isopropyl, n-butyl, isobutyl, sec-butyl and tert-butyl groups.

The alkylene group represented by $W_1$ in formula (IV) includes a group represented by the following formula:

$$-\{C(Rf)(Rg)\}_{r_1}-$$

In the above formula, Rf and Rg, which may be the same or different, each represent a hydrogen atom, an alkyl group, a substituted alkyl group, a halogen atom, a hydroxy group or an alkoxy group, and $r_1$ represents an integer of from 1 to 10.

The alkyl group is preferably a lower alkyl group, for example, methyl, ethyl, propyl, isopropyl or butyl group, more preferably methyl, ethyl, propyl or isopropyl group. A substituent for the substituted alkyl group includes, for example, a hydroxy group, a halogen atom and an alkoxy group. The alkoxy group includes an alkoxy group having from 1 to 4 carbon atoms, for example, methoxy, ethoxy, propoxy or butoxy group. The halogen atom includes, for example, chlorine, bromine, fluorine and iodine atoms.

Examples of further substituent for the alkyl group include a carboxy group, an acyloxy group, a cyano group, an alkyl group, a substituted alkyl group, a halogen atom, a hydroxy group, an alkoxy group, a substituted alkoxy group, an acetylamido group, an alkoxycarbonyl group and an acyl group.

The alkyl group includes a lower alkyl group, for example, methyl, ethyl, propyl, isopropyl, butyl, cyclopropyl, cyclobutyl or cyclopentyl group. A substituent for the substituted alkyl group includes, for example, a hydroxy group, a halogen atom and an alkoxy group. A substituent for the substituted alkoxy group includes, for example, an alkoxy group. The alkoxy group includes an The acid-decomposable resin of component (B) according to the present invention may further contain a repeating unit having a lactone structure represented by the following formula (IV):

alkoxy group having from 1 to 4 carbon atoms, for example, methoxy, ethoxy, propoxy or butoxy group. The acyloxy group includes, for example, an acetoxy group. The halogen atom includes, for example, chlorine, bromine, fluorine and iodine atoms.

Specific examples of the repeating unit represented by formula (IV) are set forth below, but the present invention should not be construed as being limited thereto.

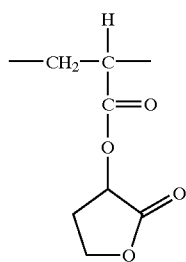
(IV-1)

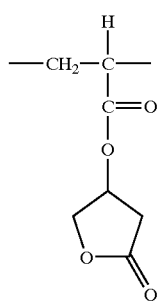
(IV-2)

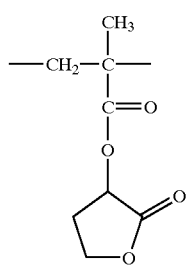
(IV-3)

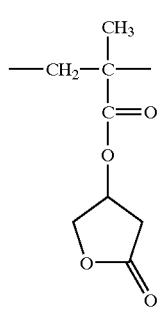
(IV-4)

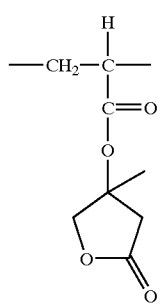
(IV-5)

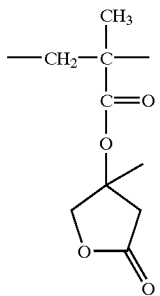
(IV-6)

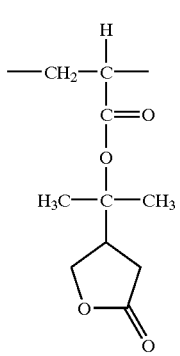
(IV-7)

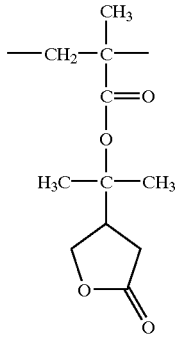
(IV-8)

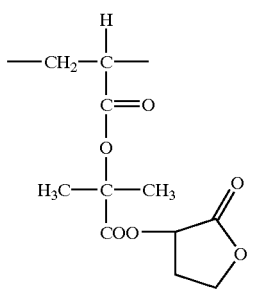
(IV-9)

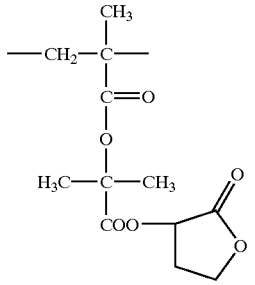
(IV-10)

(IV-11) 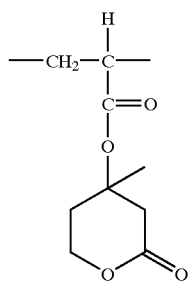
(IV-12) 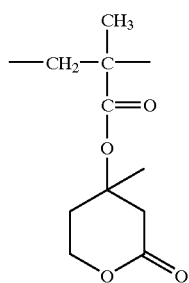
(IV-13) 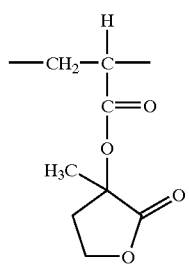
(IV-14) 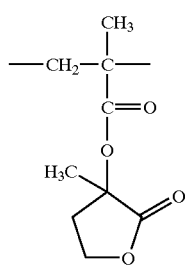
(IV-15) 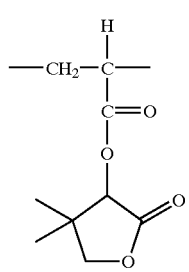
(IV-16) 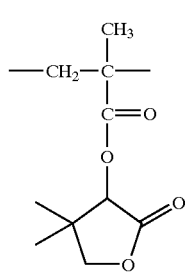
(IV-17) 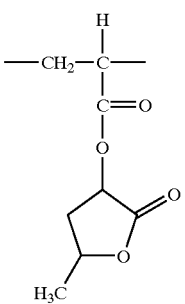
(IV-18) 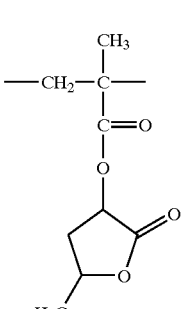
(IV-19) 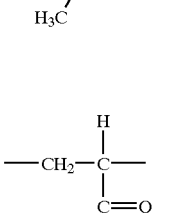
(IV-20) 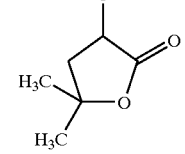
(IV-21) 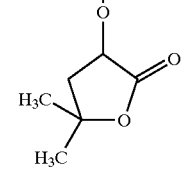
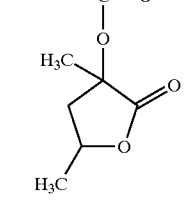

(IV-22) 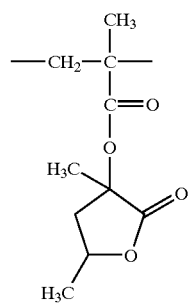
(IV-23) 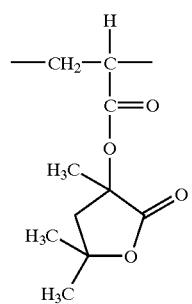
(IV-24) 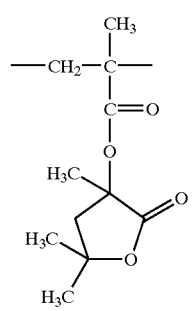
(IV-25) 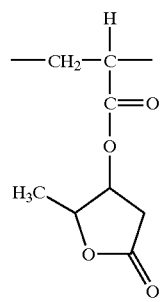
(IV-26) 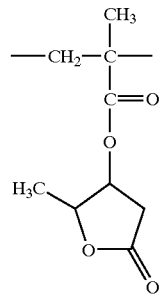
(IV-27) 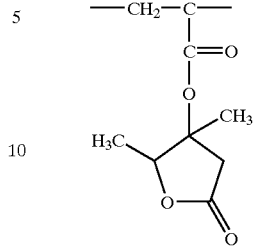
(IV-28) 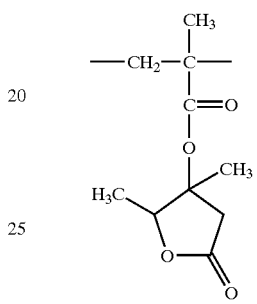
(IV-29) 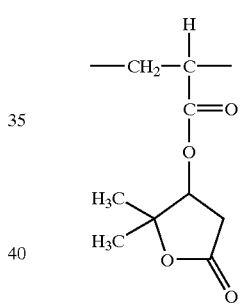
(IV-30) 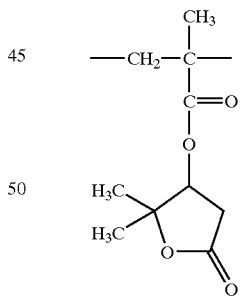
(IV-31) 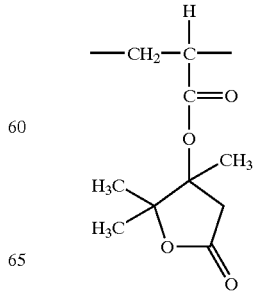

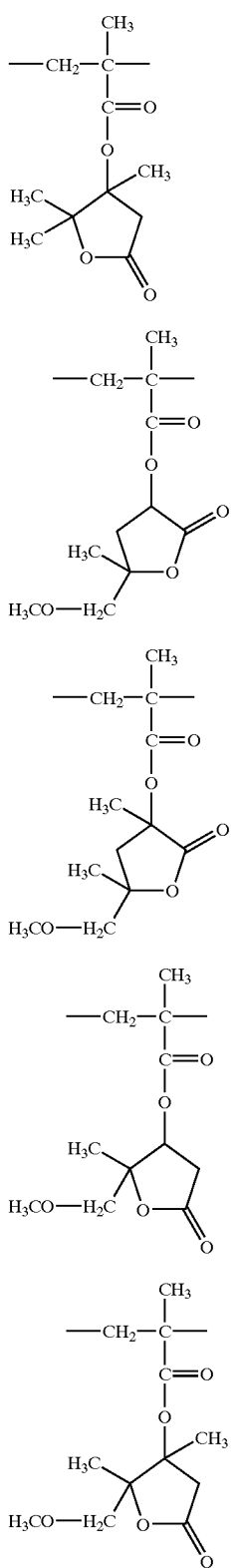

(IV-32)

(IV-33)

(IV-34)

(IV-35)

(IV-36)

Of the specific examples of the repeating unit represented by formula (VI), (IV-17) to (IV-36) are preferred in view of more improved exposure margin.

Further, the repeating units represented by formula (IV) wherein an acrylate structure is included are preferred from a standpoint of good edge roughness.

The resin of component (B) according to the present invention may further contain a repeating unit having a group including an alicyclic lactone structure represented by any one of the following formulae (V-1) to (V-4):

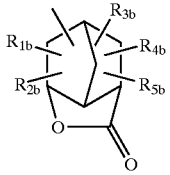

(V-1)

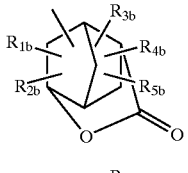

(V-2)

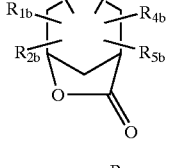

(V-3)

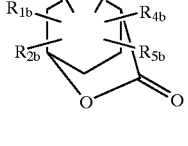

(V-4)

In formulae (V-1) to (V-4), $R_{1b}$, $R_{2b}$, $R_{3b}$, $R_{4b}$ and $R_{5b}$, which may be the same or different, each independently represent a hydrogen atom, an alkyl group which may have a substituent, a cycloalkyl group which may have a substituent or an alkenyl group which may have a substituent, or two of $R_{1b}$, $R_{2b}$, $R_{3b}$, $R_{4b}$ and $R_{5b}$ may be combined with each other to form a ring.

The alkyl group represented by any one of $R_{1b}$, $R_{2b}$, $R_{3b}$, $R_{4b}$ and $R_{5b}$ in formulae (V-1) to (V-4) includes a straight chain or branched alkyl group which may have a substituent. The straight chain or branched alkyl group includes preferably a straight chain or branched alkyl group having from 1 to 12 carbon atoms, more preferably a straight chain or branched alkyl group having from 1 to 10 carbon atoms, and still more preferably methyl, ethyl, propyl, isopropyl, n-butyl, isobutyl, sec-butyl, tert-butyl, pentyl, hexyl, heptyl, octyl, nonyl and decyl groups.

The cycloalkyl group represented by any one of $R_{1b}$, $R_{2b}$, $R_{3b}$, $R_{4b}$ and $R_{5b}$ in formulae (V-1) to (V-4) includes preferably a cycloalkyl group having from 3 to 8 carbon atoms, for example, cyclopropyl, cyclopentyl, cyclohexyl, cycloheptyl or cyclooctyl group.

The alkenyl group represented by any one of $R_{1b}$, $R_{2b}$, $R_{3b}$, $R_{4b}$ and $R_{5b}$ in formulae (V-1) to (V-4) includes preferably an alkenyl group having from 2 to 6 carbon atoms, for example, vinyl, propenyl, butenyl or hexenyl group.

The ring formed by combining two of $R_{1b}$, $R_{2b}$, $R_{3b}$, $R_{4b}$ and $R_{5b}$ in any one of formulae (V-1) to (V-4) includes preferably a 3-membered to 8-membered ring, for example, cyclopropane, cyclobutane, cyclopentane, cyclohexane or cyclooctane ring.

The group represented by $R_{1b}$, $R_{2b}$, $R_{3b}$, $R_{4b}$ and $R_{5b}$ in formulae (V-1) to (V-4) can be bonded to any one of the carbon atoms constituting the cyclic structure.

Preferred examples of the substituent for the alkyl group, cycloalkyl group and alkenyl group described above include an alkoxy group having from 1 to 4 carbon atoms, a halogen atom (e.g., fluorine, chlorine, bromine or iodine atom), an acyl group having from 2 to 5 carbon atoms, an acyloxy group having from 2 to 5 carbon atoms, a cyano group, a hydroxy group, a carboxy group, an alkoxycarbonyl group having from 2 to 5 carbon atoms and a nitro group.

Examples of repeating unit having the group represented by any one of formulae (V-1) to (V-4) include a repeating unit represented by formula (II-A) or (II-B) described above wherein one of $R_{13}'$ to $R_{16}'$ has the group represented by any one of formulae (V-1) to (V-4), for example, $R_5$ of —COOR$_5$ is the group represented by any one of formulae (V-1) to (V-4), and a repeating unit represented by the following formula (AI):

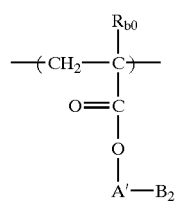

(AI)

In formula (AI), $R_{b0}$ represents a hydrogen atom, a halogen atom, a substituted or unsubstituted alkyl group having from 1 to 4 carbon atoms. Preferred examples of the substituent for the alkyl group represented by $R_{b0}$ include the preferred examples of substituent for the alkyl group represented by $R_{1b}$ in any one of formulae (V-1) to (V-4) described above.

The halogen atom represented by $R_{b0}$ includes fluorine, chlorine, bromine and iodine atoms. $R_{b0}$ is preferably a hydrogen atom.

A' in formula (AI) represents a single bond, an ether group, an ester group, a carbonyl group, an alkylene group or a divalent group formed by combining these groups.

$B_2$ in formula (AI) represents the group represented by any one of formulae (V-1) to (V-4).

Examples of the divalent group formed by combination of the groups represented by A' includes groups represented by the following formulae:

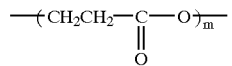

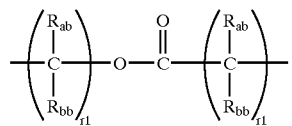

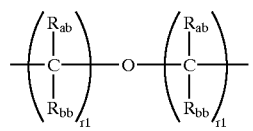

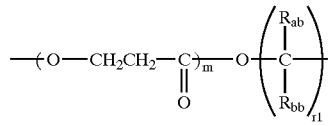

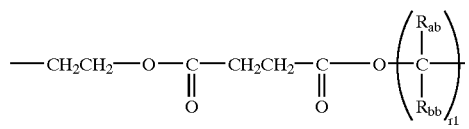

In the above-described formulae, $R_{ab}$ and $R_{bb}$, which may be the same or different, each represent a hydrogen atom, an alkyl group, a substituted alkyl group, a halogen atom, a hydroxy group or an alkoxy group.

The alkyl group represented by any one of $R_{ab}$ and $R_{bb}$ is preferably a lower alkyl group, for example, methyl, ethyl, propyl, isopropyl or butyl group, and more preferably methyl, ethyl, propyl or isopropyl group. A substituent for the substituted alkyl group includes a hydroxy group, a halogen atom and an alkoxy group having from 1 to 4 carbon atoms.

The alkoxy group includes an alkoxy group having from 1 to 4 carbon atoms, for example, methoxy, ethoxy, propoxy or butoxy group. The halogen atom includes, for example, chlorine, bromine, fluorine and iodine atoms. r1 represents an integer of from 1 to 101 and preferably from 1 to 4. m represents an integer of from 1 to 3, and preferably 1 or 2.

Specific examples of the repeating unit represented A by formula (AI) are set forth below, but the present invention should not be construed as being limited thereto.

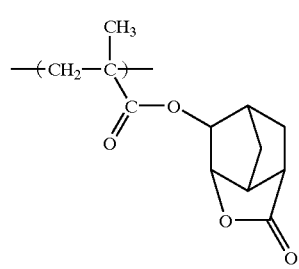

(Ib-1)

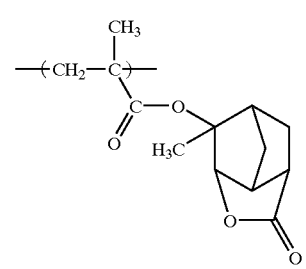

(Ib-2)

-continued
| (Ib-3) 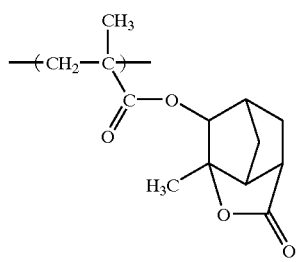 | (Ib-4) 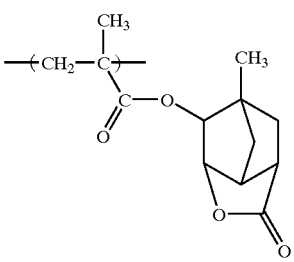 |
| (Ib-5) 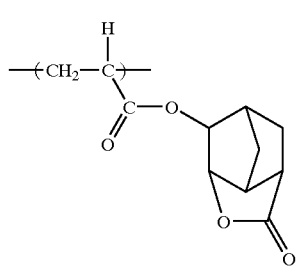 | (Ib-6) 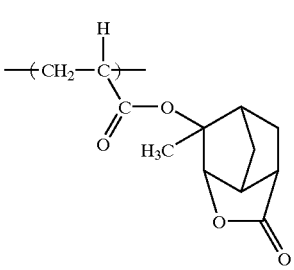 |
| (Ib-7) 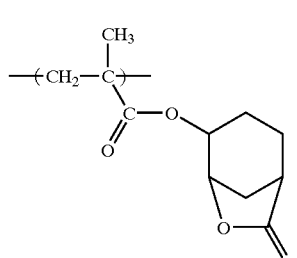 | (Ib-8) 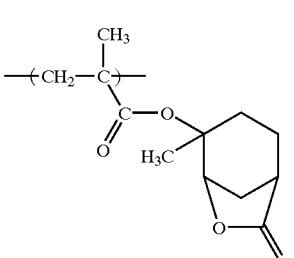 |
| (Ib-9) 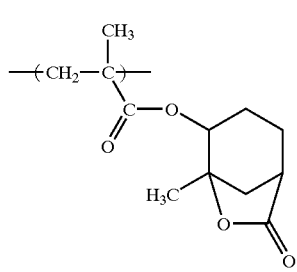 | (Ib-10) 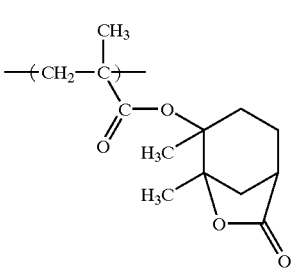 |
| (Ib-11) 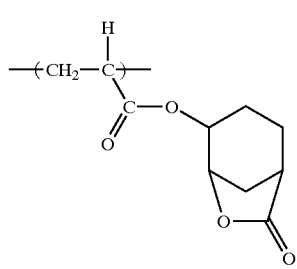 | (Ib-12) 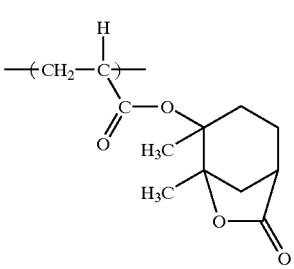 |
| (Ib-13) 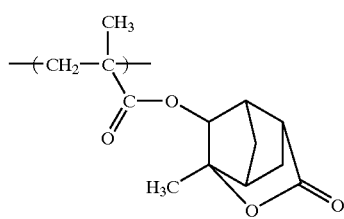 | (Ib-14) 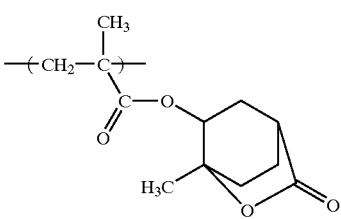 |

-continued
(Ib-15)
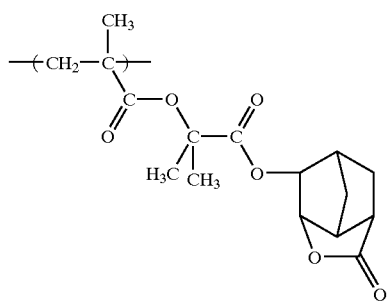
(Ib-16)
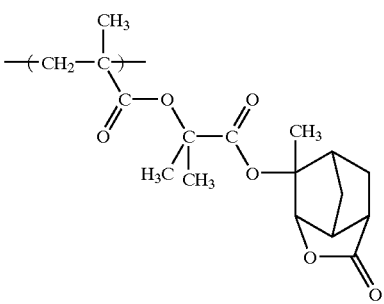
(Ib-17)
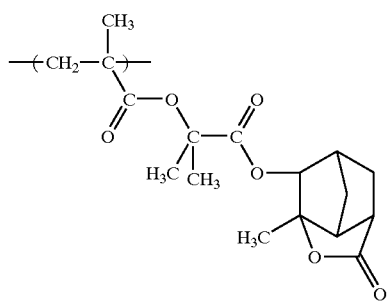
(Ib-18)
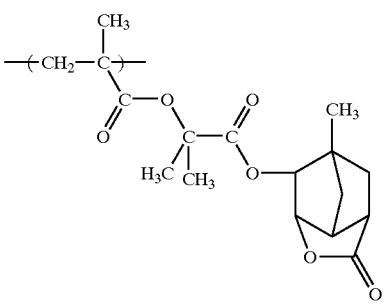
(Ib-19)
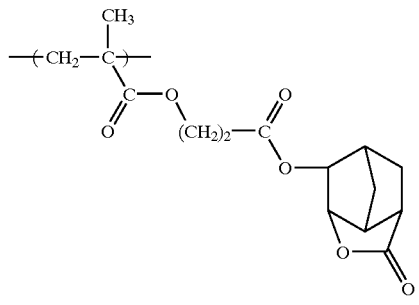
(Ib-20)
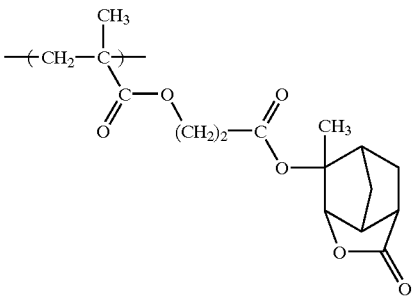
(Ib-21)
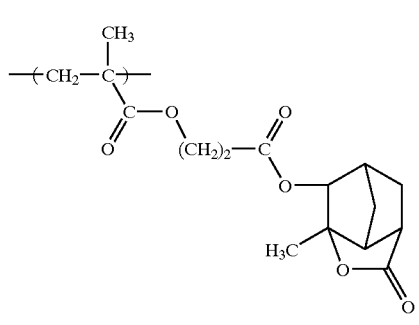
(Ib-22)
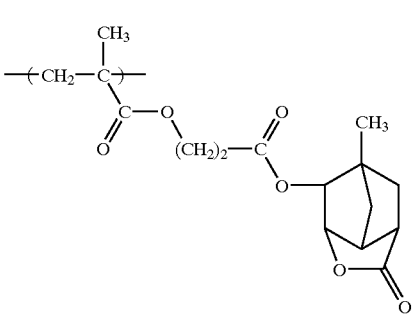
(Ib-23)
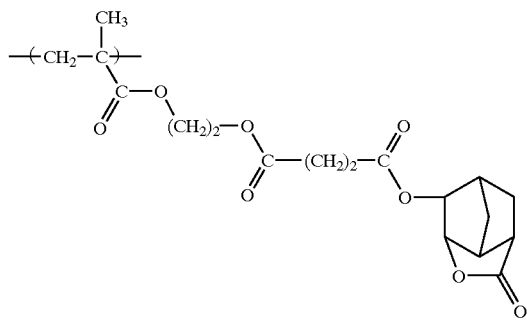
(Ib-24)
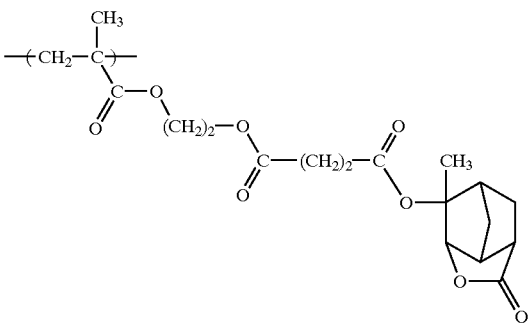

-continued
(Ib-25)
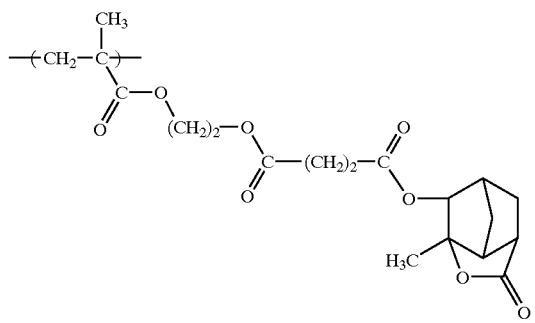
(Ib-26)
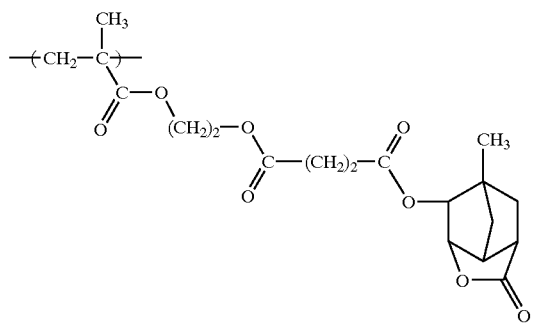
(Ib-27)
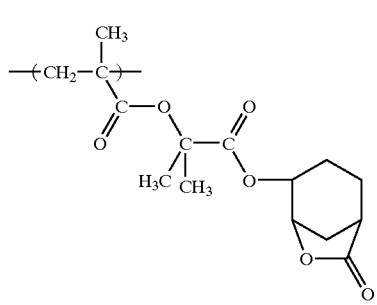
(Ib-28)
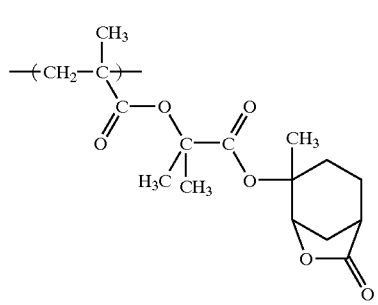
(Ib-29)
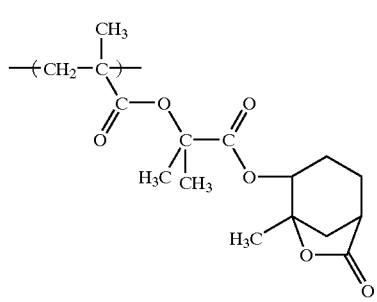
(Ib-30)
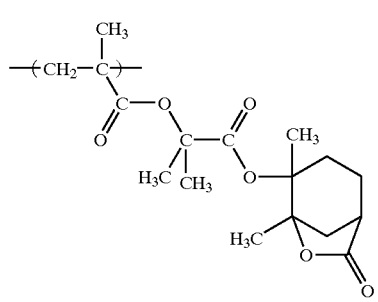
(Ib-31)
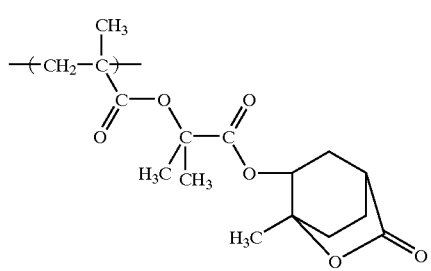
(Ib-32)
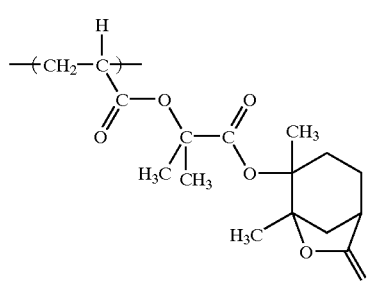
(Ib-33)
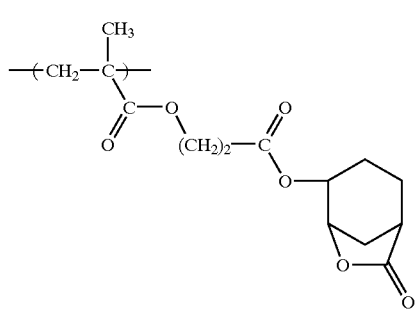
(Ib-34)
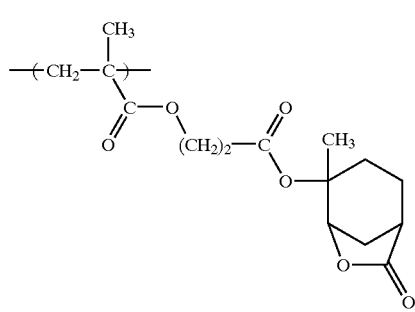

-continued
(Ib-35)
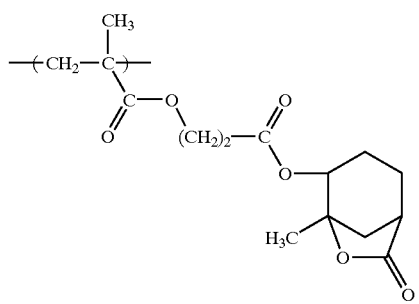
(Ib-36)
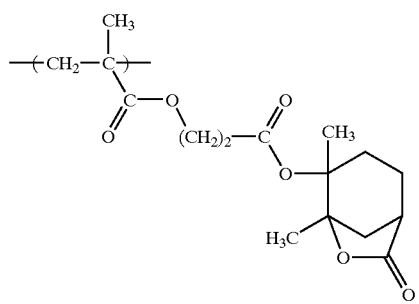
(Ib-37)
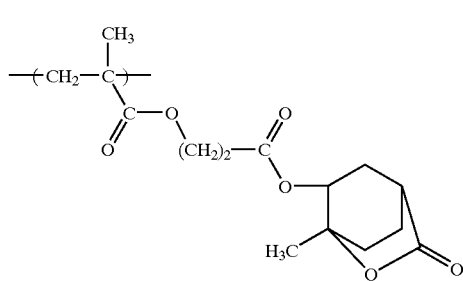
(Ib-38)
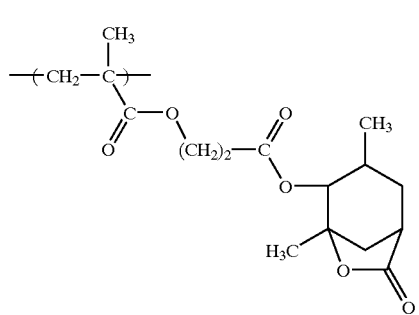
(Ib-39)
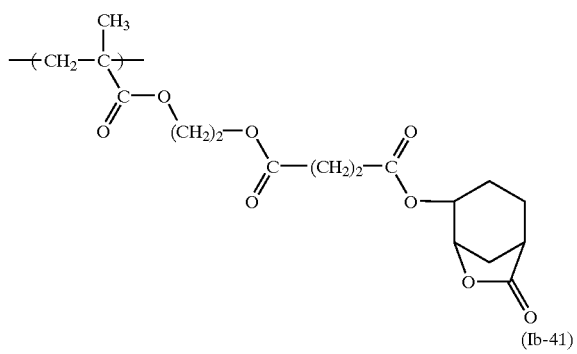
(Ib-40)
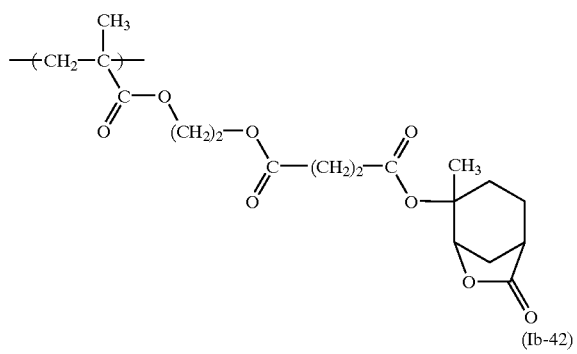
(Ib-41)
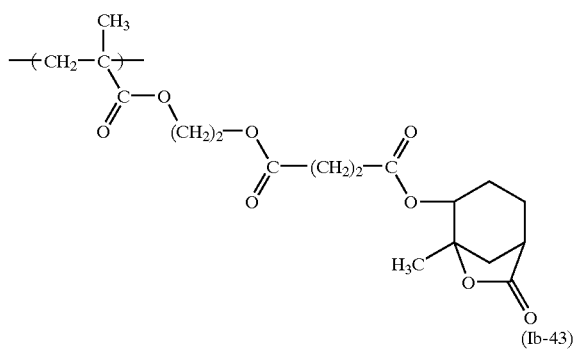
(Ib-42)
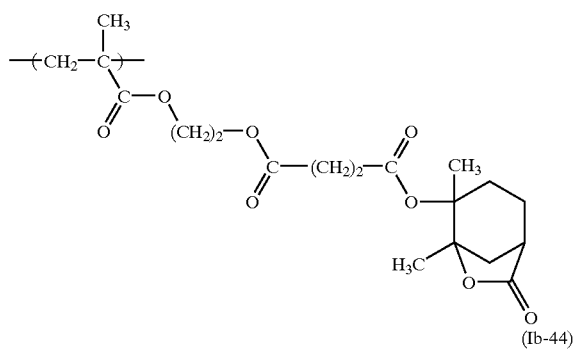
(Ib-43)
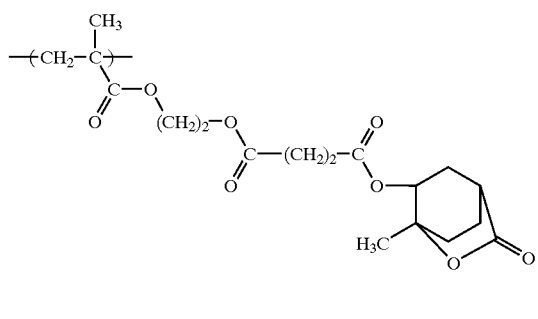
(Ib-44)
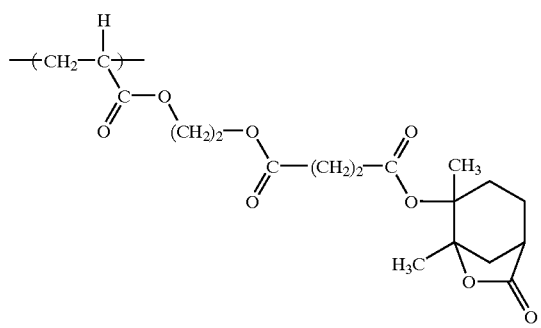

The acid-decomposable resin of component (B) according to the present invention may further contain a repeating unit represented by the following formula (VI):

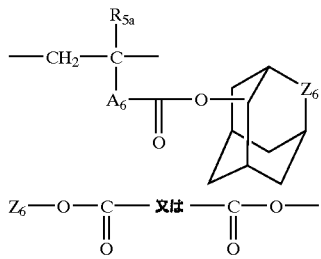
(VI)

In formula (VI), $A_6$ represents a single bond, an alkylene group, a cycloalkylene group, an ether group, a thioether group, a carbonyl group, an ester group or a combination of two or more thereof.

$R_{6a}$ represents a hydrogen atom, an alkyl group having from 1 to 4 carbon atoms, a cyano group or a halogen atom.

The alkylene group for As in formula (VI) includes a group represented by the following formula:

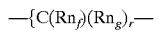

In formula, $Rn_f$ and $Rn_g$, which may be the same or different, each represent a hydrogen atom, an alkyl group, a substituted alkyl group, a halogen atom, a hydroxy group or an alkoxy group, and r represents an integer of from 1 to 10.

The alkyl group is preferably a lower alkyl group, for example, methyl, ethyl, propyl, isopropyl or butyl group, and more preferably methyl, ethyl, propyl or isopropyl group. A substituent for the substituted alkyl group includes, for example, a hydroxy group, a halogen atom and an alkoxy group. The alkoxy group includes an alkoxy group having from 1 to 4 carbon atoms, for example, methoxy, ethoxy, propoxy or butoxy group. The halogen atom includes, for example, chlorine, bromine, fluorine and iodine atoms.

The cycloalkylene group represented by $A_6$ in formula (VI) includes a cycloalkylene group having from 3 to 10 carbon atoms, for example, cyclopentylene, cyclohexylene or cyclooctylene group.

In formula (VI), the bridged alicyclic group including $Z_6$ may have one or more substituents. Examples of the substituent include a halogen atom, an alkoxy group (preferably an alkoxy group having from 1 to 4 carbon atoms), an alkoxycarbonyl group (preferably an alkoxycarbonyl group having from 1 to 5 carbon atoms), an acyl group (for example, formyl or benzyl group), an acyloxy group (for example, propylcarbonyloxy or benzoyloxy group), an alkyl group (preferably an alkyl group having from 1 to 4 carbon atoms), a carboxy group, a hydroxy group and an alkylsulfonylsulfamoyl group (for example, —$CONHSO_2CH_3$). The alkyl group as the substituent may further be substituted with a hydroxy group, a halogen atom or an alkoxy group (preferably an alkoxy group having from 1 to 4 carbon atoms).

The oxygen atom of the ester group connected to $A_6$ in formula (VI) can be bonded to any one of the carbon atoms constituting the bridged alicyclic structure containing $Z_6$.

Specific examples of the repeating unit represented by formula (VI) are set forth below, but the present invention should not be construed as being limited thereto.

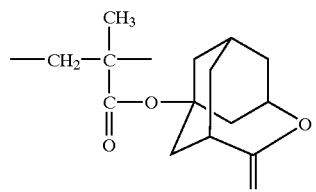

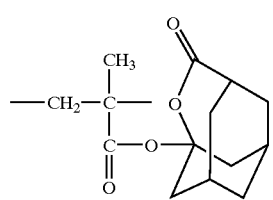

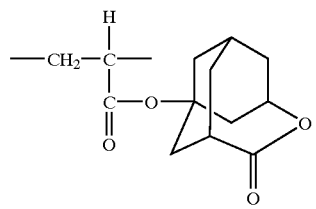

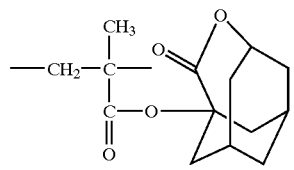

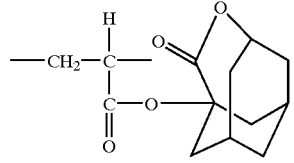

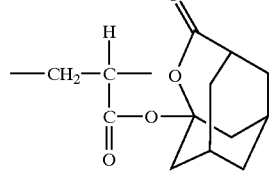

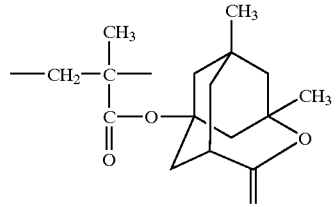

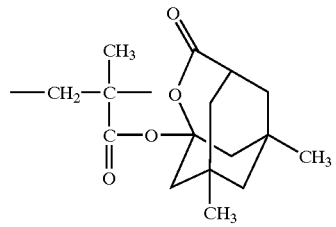

-continued

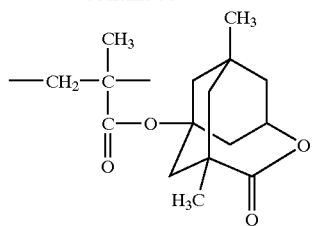

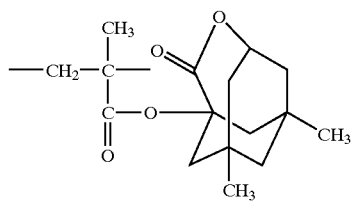

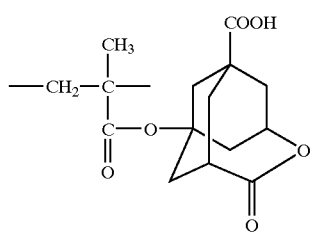

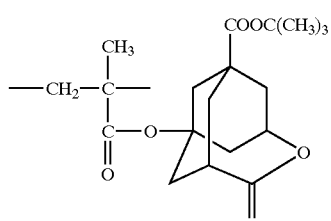

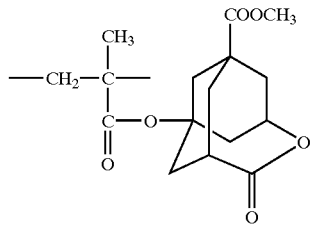

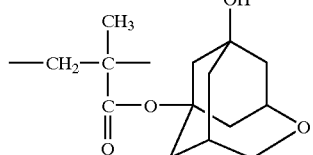

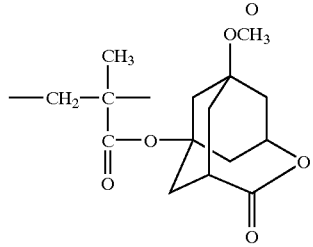

-continued

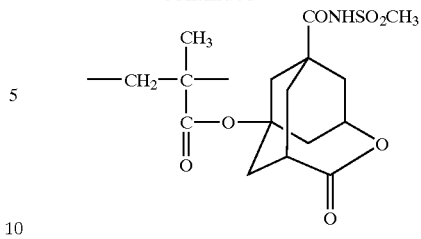

The resin of component (B) according to the present invention may further contain a repeating unit having a group represented by the following formula (VII):

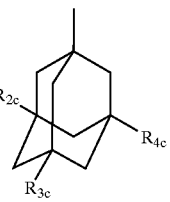

(VII)

In formula (VII), $R_{2c}$, $R_{3c}$ and $R_{4c}$, which may be the same or different, each represent a hydrogen atom or a hydroxy group, provided that at least one of $R_{2c}$, $R_{3c}$ and $R_{4c}$ represents a hydroxy group.

The group represented by formula (VII) is preferably a dihydroxy body or a monohydroxy body, and more preferably a dihydroxy body.

Examples of the repeating unit having the group represented by formulae (VII) include a repeating unit represented by formula (II-A) or (II-B) described above wherein one of $R_{13}'$ to $R_{16}'$ has the group represented by formula (VII), for example, $R_5$ of —COOR$_5$ is the group represented by formula (VII), and a repeating unit represented by the following formula (AII):

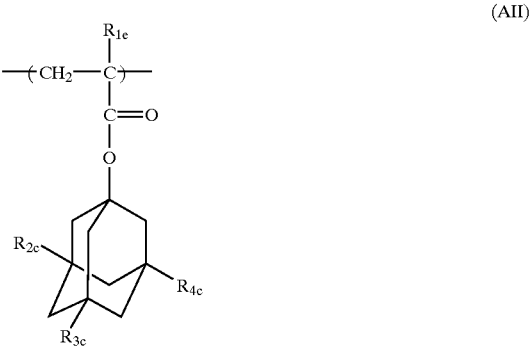

(AII)

In formula (AII), $R_{1c}$ represents a hydrogen atom or a methyl group, and $R_{2c}$, $R_{3c}$ and $R_{4c}$, which may be the same or different, each independently represents a hydrogen atom or a hydroxy group, provided that at least one of $R_{2c}$, $R_{3c}$ and $R_{4c}$, represents a hydroxy group.

Specific examples of the repeating unit represented by formula (AII) are set forth below, but the present invention should not be construed as being limited thereto.

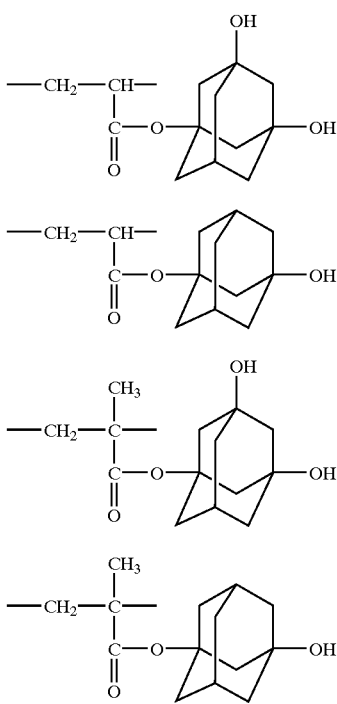

The resin of component (B) according to the present invention may further contain a repeating unit having a group represented by the following formula (VIII):

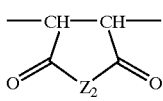
(VIII)

In formula (VIII), $Z_2$ represents —O— or —N($R_{41}$)—, $R_{41}$ represents a hydrogen atom, a hydroxy group, an alkyl group, a haloalkyl group or —O—$SO_2$—$R_{42}$, and $R_{42}$ represents an alkyl group, a haloakyl group, a cycloalkyl group or a camphol residue.

Examples of the alkyl group represented by $R_{41}$ or $R_{42}$ include preferably a straight chain or branched alkyl group having form 1 to 10 carbon atoms, more preferably a straight chain or branched alkyl group having form 1 to 6 carbon atoms, and still more preferably methyl, ethyl, propyl, isopropyl, n-butyl, isobutyl, sec-butyl and tert-butyl groups.

Examples of the haloalkyl group represented by $R_{41}$, or $R_{42}$ include trifluoromethyl, nonafluorobutyl, pentadecafluorooctyl and trichloromethyl groups.

Examples of the cycloalkyl group represented by $R_{42}$ include cyclopentyl, cyclohexyl and cyclooctyl groups.

The alkyl group and haloalkyl group represented by $R_{41}$ or $R_{42}$ and the cycloalkyl group and camphol residue represented by $R_{42}$ may have one or more substituents.

Examples of the substituent for the alkyl group, haloalkyl group, cycloalkyl group and camphol residue include a hydroxy group, a carboxy group, a cyano group, a halogen atom (e.g., chlorine, bromine, fluorine or iodine atom), an alkoxy group (preferably an alkoxy group having from 1 to 4 carbon atoms, e.g., methoxy, ethoxy, propoxy or butoxy group), an acyl group (preferably an acyl group having from 2 to 5 carbon atoms, e.g., formyl or acetyl group), an acyloxy group (preferably an acyloxy group having from 2 to 5 carbon atoms, e.g., acetoxy group) and an aryl group (preferably an aryl group having from 6 to 14 carbon atoms, e.g., phenyl group).

Specific examples of the repeating unit represented by formula (VIII) are set forth below as formulae [I'-1] to [I'-7], but the present invention should not be construed as being limited thereto.

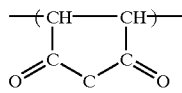
[I'-1]

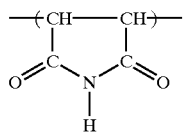
[I'-2]

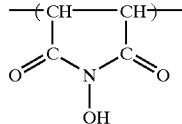
[I'-3]

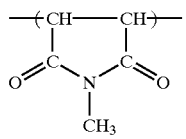
[I'-4]

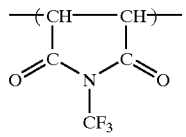
[I'-5]

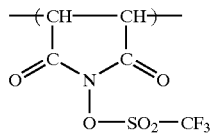
[I'-6]

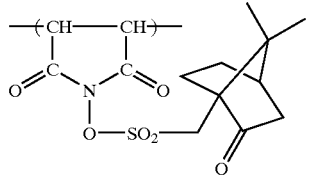
[I'-7]

The acid-decomposable resin of component (B) according to the present invention may contain various repeating structural units in addition to the repeating structural units described above for the purposes of adjusting dry etching resistance, standard developing solution aptitude, adhesion to substrate, resist profile, and other characteristics ordinarily required for resist, for example, resolution, heat resistance and sensitivity.

Examples of such repeating structural units include repeating structural units corresponding to monomers described below, but the present invention should not be construed as being limited thereto.

The introduction of additional repeating structural unit makes possible the minute control of characteristics required for the acid-decomposable resin, particularly (1) solubility in a coating solvent, (2) film forming property (glass transition temperature), (3) developing property with alkali, (4) reduction in a film thickness (hydrophobicity, selection of alkali-soluble group), (5) adhesion of the unexposed area to a substrate, and (6) dry etching resistance.

Examples of such monomers include compounds having one addition-polymerizable unsaturated bond, for example, acrylates, methacrylate, acrylamides, methacrylamides, allyl compound, vinyl ethers and vinyl esters.

Specific examples of the monomer include an acrylate, for example, an alkyl acrylate (preferably an alkyl acrylate containing an alkyl group having from 1 to 10 carbon atoms), e.g., methyl acrylate, ethyl acrylate, propyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, turfuryl acrylate or tetrahydrofurfuryl acrylate; a methacrylate, for example, an alkyl methacrylate (preferably an alkyl methacrylate containing an alkyl group having form 1 to 10 carbon atoms), e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate or tetrahydrofurfuryl methacrylate; an acrylamide, for example, acrylamide, an N-alkylacrylamide (the alkyl group of which is an alkyl group having from 1 to 10 carbon atoms, e.g., methyl, ethyl, propyl, butyl, tert-butyl, heptyl, octyl, cyclohexyl or hydroxyethyl group), an N,N-dialkylacrylamide (the alkyl group of which is an alkyl group having form 1 to 10 carbon atoms, e.g., methyl, ethyl, butyl, isobutyl, ethylhexyl or cyclohexyl group), N-hydroxyethyl-N-methylacrylamide and N-2-acetamidoethyl-N-acetylacrylamide; a methacrylamide, for example, methacrylamide, an N-alkylmethacrylamide (the alkyl group of which is an alkyl group having from 1 to 10 carbon atoms, e.g., methyl, ethyl, tert-butyl, ethylhexyl, hydroxyethyl or cyclohexyl group) an N,N-dialkylmethacrylamide (the alkyl group of which includes, e.g., ethyl, propyl and butyl groups) and N-hydroxyethyl-N-methylmethacrylamide; an allyl compound, for example, an allyl ester (e.g., allyl acetate, allyl caproate, ally caprate, allyl laurate, allyl palmitate, allyl stearate, allyl benzoate, allyl acetoacetate or ally lactate) and allyl oxyethanol; a vinyl ether, for example, an alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether or tetrahydrofurfuryl vinyl ether); a vinyl ester, for example, vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate or vinyl cyclohexylcarboxylate; a dialkyl itaconate, for example, dimethyl itaconate, diethyl itaconate or dibutyl itaconate; a monoalkyl or dialkyl fumarate, for example, dibutyl fumarate; and others, for example, crotonic acid, itaconic acid, maleic anhydride, maleimide, acrylonitrile, methacrylonitrile or maleonitrile.

In addition, any addition-polymerizable unsaturated compounds copolymerizable with monomers corresponding to W the repeating structural units described above may be employed.

A molar ratio of each repeating structural unit in the acid-decomposable resin of component (B) can be appropriately determined taking the adjustment of many factors including dry etching resistance of resist, standard developing solution aptitude, adhesion to substrate, resist profile, and other characteristics ordinarily required for resist, for example, resolution, heat resistance and sensitivity into consideration.

Preferred embodiments of the acid-decomposable resin of component (B) according to the present invention include
(1) resin (side chain type) containing a repeating unit having a partial structure including an alicyclic hydrocarbon represented by formula (pI), (pII), (pIII), (pIV), (pV) or (pVI).
(2) resin (main chain type) containing a repeating unit represented by formula (II-AB). The resin of (2) includes the following resin of (3).
(3) resin (hybrid type) containing a repeating unit represented by formula (II-AB), a maleic anhydride derivative and a (meth)acrylate structure.

A content of the repeating structural unit having a group represented by any one of formulae (V-1) to (V-4) is preferably from 2 to 50% by mole, more preferably from 5 to 40% by mole, and still more preferably from 10 to 30% by mole, based on the total repeating structural units in the acid-decomposable resin.

A content of the repeating structural unit having a partial structure including an alicyclic hydrocarbon represented by formula (pI), (pII), (pIII), (pIV), (pV) or (pVI) is preferably from 30 to 70% by mole, more preferably from 35 to 65% by mole, and still more preferably from 40 to 60% by mole, based on the total repeating structural units in the acid-decomposable resin.

A content of the repeating structural unit represented by formula (II-AB) is preferably from 10 to 60% by mole, more preferably from 15 to 55% by mole, and still more preferably from 20 to 50% by mole, based on the total repeating structural units in the acid-decomposable resin.

A content of the repeating structural unit corresponding to the additional copolymer component described above can be appropriately determined depending on the desired performance of resist. In general, the content is preferably 99% by mole or less, more preferably 90% by mole or less, still more preferably 90% by mole or less, and most preferably 50% by mole or less, to the sum total of the repeating unit having a partial structure including an alicyclic hydrocarbon represented by any one of formulae (pI) to (pVI), the repeating unit having a group represented by any one of formulae (V-1) to (V-4) and/or the repeating unit represented by formula (II-AB).

When the photosensitive composition of the present invention is used for ArF exposure, it is preferred that the acid-decomposable resin does not contain an aromatic group in order to ensure transparency of the ArF beam.

The acid-decomposable resin for use in the present invention can be synthesized according to conventional methods, for example, radical polymerization. For instance, in an ordinary synthesis method, monomers are put into a reaction vessel at once or separately during the reaction, dissolved in a reaction solvent, for example, an ether, e.g., tetrahydrofuran, 1,4-dioxane or diisopropyl ether, a ketone, e.g., methyl ethyl ketone or methyl isobutyl ketone, an ester, e.g., ethyl acetate, or a solvent dissolving the composition of the present invention, e.g., propylene glycol monomethyl ether acetate, if desired, to form a uniform solution, and under inert gas atmosphere, for example, nitrogen or argon, polymerization is initiated using a commercially available radical initiator (e.g., an azo initiator or a peroxide) while heating, if desired. The initiator is further added or separately added, if desired. After the completion of the reaction, the reaction mixture is poured into a solvent to correct the resulting powder or solid, thereby obtaining the polymer. The concentration of reaction is ordinarily not less than 20% by weight, preferably not less than 30% by weight, and more preferably not less than 40% by weight. The reaction temperature is ordinarily from 10 to 150° C., preferably from 30 to 120° C., and more preferably from 50 to 100° C.

A weight average molecular weight of the resin of component (B) for use in the present invention is preferably form 1,000 to 200,000 measured by a GPC method and calculated in terms of polystyrene. It is not preferred that the weight average molecular weight of the resin is less than 1,000, since the degradation of heat resistance and dry etching resistance may occur. On the other hand, when the weight average molecular weight of the resin is more than 200,000, undesirable results, for example, the degradation of developing property and film-forming property due to severe increase in viscosity may occur.

A content of the resin of component. (B) according to the present invention in the positive photosensitive composition of the present invention is preferably from 40 to 99.99% by weight, and more preferably from 50 to 99.97% by weight, based on the total solid content of the photosensitive composition.

<<(C) Basic Compound>>

It is preferred that the positive photosensitive composition of the present invention contains a basic compound of component (C) for restraining fluctuations in performances occurred with the passage of time from exposure to heating.

The basic compound preferably has a structure represented by any one of formulae (A) to (E) shown below.

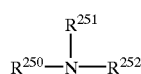
(A)

In the above formula, $R^{250}$, $R^{251}$ and $R^{252}$, which may be the same or different, each independently represent a hydrogen atom, an alkyl group having from 1 to 20 carbon atoms, an aminoalkyl group having from 1 to 20 carbon atoms, a hydroxyalkyl group having from 1 to 20 carbon atoms or a substituted or unsubstituted aryl group having from 6 to 20 carbon atoms, or $R^{250}$ and $R^{251}$ may be combined with each other to form a ring,

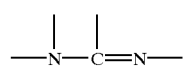
(B)

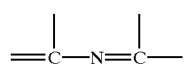
(C)

(D)

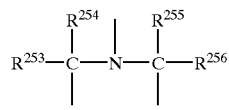
(E)

In the above formulae, $R^{253}$, $R^{254}$, $R^{255}$ and $R^{256}$, which may be the same or different, each independently represent an alkyl group having from 1 to 6 carbon atoms.

Preferred examples of the basic compound include substituted or unsubstituted guanidines, substituted or unsubstituted aminopyridines, substituted or unsubstituted aminoalkylpyridines, substituted or unsubstituted aminopyrrolidines, substituted or unsubstituted indazoles, substituted or unsubstituted pyrazoles, substituted or unsubstituted pyrazines, substituted or unsubstituted pyrimidines, substituted or unsubstituted purines, substituted or unsubstituted imidazolines, substituted or unsubstituted pyrazolines, substituted or unsubstituted piperazines, substituted or unsubstituted aminomorpholines, substituted or unsubstituted aminoalkylmorpholines, substituted or unsubstituted piperidines, compounds having a structure selected from an imidazole structure, a diazabicyclo structure, an onium hydroxide structure and an onium carboxylate structure, primary aliphatic amines, secondary aliphatic amines, tertiary aliphatic amines, primary oxygen-containing aliphatic amines, secondary oxygen-containing aliphatic amines tertiary oxygen-containing aliphatic amines, alcoholic nitrogen-containing compounds and substituted anilines. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

More preferred compounds include compounds having an imidazole structure, a diazabicyclo structure, an onium hydroxide structure or an onium carboxylate structure, primary aliphatic amines, secondary aliphatic amines, tertiary aliphatic amines, primary oxygen-containing aliphatic amines, secondary oxygen-containing aliphatic amines, tertiary oxygen-containing aliphatic amines, alcoholic nitrogen-containing compounds and substituted anilines.

The compound having an imidazole structure includes imidazole, 2,4,5-triphenylimidazole and benzimidazole. The compound having a diazabicyclo structure includes 1,4-diazabicyclo[2.2.2]octane, 1,5-diazabicyclo[4.3.0]non-5-ene, 1,8-diazabicyclo[5.4.0]undec-7-ene, 4,7,13,16,21,24-hexaoxa-1,10-diazabicyclo[8.8.8]hexacosan, 4,7,13,18-tetraoxa-1,10-diazabicyclo[8.5.5]hexacosan and 1,4,10,13-tetraoxa-7,16-diazabicyclooctadecene. The compound having an onium hydroxide structure includes a triarylsulfonium hydroxide, phenacyl sulfonium hydroxide and a 2-oxoalkyl group-containing sulfonium hydroxide, e.g., triphenylsulfonium hydroxide, tris(tert-butylphenyl) sulfonium hydroxide, bis(tert-butylphenyl)iodonium hydroxide., phenacyl thiophenium hydroxide or 2-oxopropylthiophenium hydroxide. The compound having an onium carboxylate structure includes a compound wherein an anion portion of the compound having an onium hydroxide structure is replaced by a carboxylate, e.g., acetate, adamantane-1-carboxylate or a perfluoroalkyl carboxylate.

Examples of the primary aliphatic amine include methylamine, ethylamine, n-propylamine, isopropylamine, n-butylamine, isobutylamine, sec-butylamine, tertbutylamine, pentylamine, tert-amylamine, cyclopentylamine, hexylamine, cyclohexylamine, heptylazine, octylamine, nonylamine, decylamine dodecylamine, cetylamine, methylenediamine, ethylenediamine and tetraethylenepentamine.

Examples of the secondary aliphatic amine include dimethylamine, diethylamine, di-n-propylamine, diisopropyamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine didodecylamine, dicetylamine, N,N'-dimethylmethylenediamine, N,N'-dimethylethylenediamine and N,N'-dimethyltetraethylenepentamine.

Examples of the tertiary aliphatic amine include trimethylamine, triethylamine, tri-n-propylamine, triisopropyaminel, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine tridodecylamine, tricetylamine, N,N,N',N'-tetramethylmethylenediamine, N,N,N',N'-tetramethylethylenediamine and N,N,N',N'-tetramethyltetraethylenepentamine.

Examples of the primary, secondary and tertiary oxygen-containing aliphatic amine include methoxyethoxyethylamine, bis(methoxyethoxyethyl)amine, tris{2-(methoxymethoxy)ethyl}amine, tris{2-(methoxyethoxy)ethyl}amine, tris(2-[(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine and tris[2-{2-(2-hydroxyethoxy)ethoxy}ethyl]amine.

Examples of the alcoholic nitrogen-containing compound include monoethanolamine, diethanolamine, triethanolamine, N-ethyldiethanolamine, N-phenyldiethanolamine, N,N-diethylethanolamine, triisopropanolamine, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidineethanol, 1-(2-hydroxyethyl)pyrrolidine, 1-(2-hydroxyethyl)-2-pyrrolidinone, 3-piperidino-1,2-propanediol, 3-pyppolidino-1,2-propanediol, 8-hydroxyjulolidine, 3-quinuclidinol, 3-tropanol, 1-methyl-2-pyrrolidineethanol, 1-aziridineethanol, N-(2-hydroxyethyl)phthalimide and N-(2-hydroxyethyl)isonicotinamide.

Examples of the substituted aniline compound include N,N-dimethylaniline, N-methylaniline, 2-methylaniline, 2-methyl-N,N-dimethylaniline, 2,6-dimethylaniline, 2,6-dimethyl-N,N-dimethylaniline, 2,6-diethylaniline, 2,6-diisopropylaniline, 2,6-dipropylaniline, 2,6-dibutylaniline, 2,6-diisobutylaniline, 2,6-di-tert-butylaniline, 2,4,6-triisopropylaniline, 2,4,6-tripropylaniline and 2,4,6-tributylaniline, but the substituted aniline compound should not be construed as being limited thereto.

The basic compound of component (C) for use in the present invention should not be construed as being limited to these specific examples.

More preferred examples of the basic compound of component (C) for use in the present invention include tributylamine, trihexylamine, trioctylamine, triethanolamine, trismethoxymethoxyethylamine, trismethoxyethoxyethylamine, trismethoxyethoxymethoxyethylamine and 2,6-diisopropylaniline.

The basic compounds of component (C) may be used individually or as a mixture of two or more thereof. The amount of basic compound of component (C) used is ordinarily from 0.001 to 10% by weight, and preferably from 0.01 to 5% by weight, based on the solid content of the positive photosensitive composition. When the amount is less than 0.001% by weight, an effect of the addition of basic compound is not obtained. When the amount exceeds 10% by weight, on the other hand, the sensitivity tends to decrease or the developability tends to degrade in the unexposed area.

<<(D) Fluorine-base and/or Silicon-base Surface Active Agent>>

It is preferred that the positive photosensitive composition of the present invention contains one or ac more of fluorine-base and/or silicon-base surface active agent (a fluorine atom-containing surface active agent, a silicon atom-containing surface active agent and a surface active agent containing both a fluorine atom and a silicon atom).

By the addition of the surface active agent of component (D), the positive photosensitive composition of the present invention can provide, at high sensitivity and good resolution, resist patterns having good adhesion, good exposure margin and less defect in development, when an exposure light source of 250 nm or less, especially 220 nm or less is used.

Specific examples of the surface active agent of component (D) include those as described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5;436,098, 5,576,143, 5,294,511 and 5,824,451. Commercially available surface active agents described below may also be used as they are.

Examples of the commercially available surface active agent used include fluorine-base or silicon-base surface active agents, e.g., Eftop EF301 and EF303 (manufactured by Shin-Akita Kasei Co., Ltd.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, 102, 103, 104, 105 and 106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as a silicon-base surface active agent.

The amount of surface active agent used is preferably from 0.0001 to 2% by weight, and more preferably from 0.001 to 1% by weight, based on the total amount of the positive photosensitive composition (excluding a solvent).

<<(E) Organic Solvent>>

The positive photosensitive composition of the present invention is used by dissolving the above-described components in the desired organic solvent.

Examples of the organic solvent used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetatet ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran.

Preferred examples of the solvent include propylene glycol monomethyl ether acetate, 2-heptanone, γ-butyrolactone, ethylene glycol monomethyl ether, ethylene glycol monoethyl ether, ethylene glycol monoethyl ether acetate, propylene glycol monomethyl ether, propylene glycol monoethyl ether, methyl lactate, ethyl lactate, methyl methoxypropionate, ethyl ethoxypropionate, N-methylpyrrolidone and tetrahydrofuran.

In the present invention, the organic solvents may be used individually or as a mixture of two or more thereof. It is preferred to use a mixture of a solvent containing a hydroxy group and a solvent free from a hydroxy group. This makes it possible to restrain the generation of particles during storage of the resist solution.

Examples of the hydroxy group-containing solvent include ethylene glycol, ethylene glycol monomethyl ether, ethylene glycol monoethyl ether, propylene glycol, propylene glycol monomethyl ether, propylene glycol monoethyl ether and ethyl lactate. Of these solvents, propylene glycol monomethyl ether and ethyl lactate are particularly preferred.

Examples of the solvent free from a hydroxy group include propylene glycol monomethyl ether acetate, ethyl ethoxypropionate, 2heptanone, γ-butyrolactone, cyclohexanone, butyl acetate, N-methylpyrrolidone, N,N-dimethylacetamide and dimethylsulfoxide. Of these solvents, propylene glycol monomethyl ether acetate, ethyl ethoxypropionate, 2-heptanone, γ-butyrolactone, cyclohexanone and butyl acetate are particularly preferred, and propylene glycol monomethyl ether acetate, ethyl ethoxypropionate and 2-heptanone are most preferred.

A mixing ratio (by weight) of the hydroxy group-containing solvent to the solvent free from a hydroxy group ranges from 1/99 to 99/1, preferably from 10/90 to 90/10, and more preferably from 20/80 to 60/40. A mixed solvent containing not less than 50% by weight of the solvent free from a hydroxy group is also particularly preferred in view of uniform coating.

<<(F) Acid Decomposable Dissolution Inhibiting Compound>>

It is preferred that the positive photosensitive composition of the present invention contains a dissolution inhibiting low molecular weight compound of component (F) (hereinafter also referred to as an "acid decomposable dissolution inhibiting compound") having a group capable of being decomposed by the action of an acid to increase solubility in an alkali developing solution and having a molecular weight of not more than 3,000.

In order to prevent deterioration in transmittance at 220 nm or less, an alicyclic or aliphatic compound having an acid decomposable group, for example, a cholic acid derivative having an acid decomposable group as described in *Proceeding of SPIE*, 2724, 355 (1966) is preferred as the acid decomposable dissolution inhibiting compound of component (F). Examples of the acid decomposable group and alicyclic structure are similar to those described regarding the acid decomposable resin of component (B) hereinbefore.

The amount of acid decomposable dissolution inhibiting compound of component (F) used is preferably from 3 to 50% by weight, and more preferably 5 to 40% by weight, based on the solid content of the total positive photosensitive composition.

Specific examples of the acid decomposable dissolution inhibiting compound of component (F) are set forth below, but the present invention should not be construed as being limited thereto.

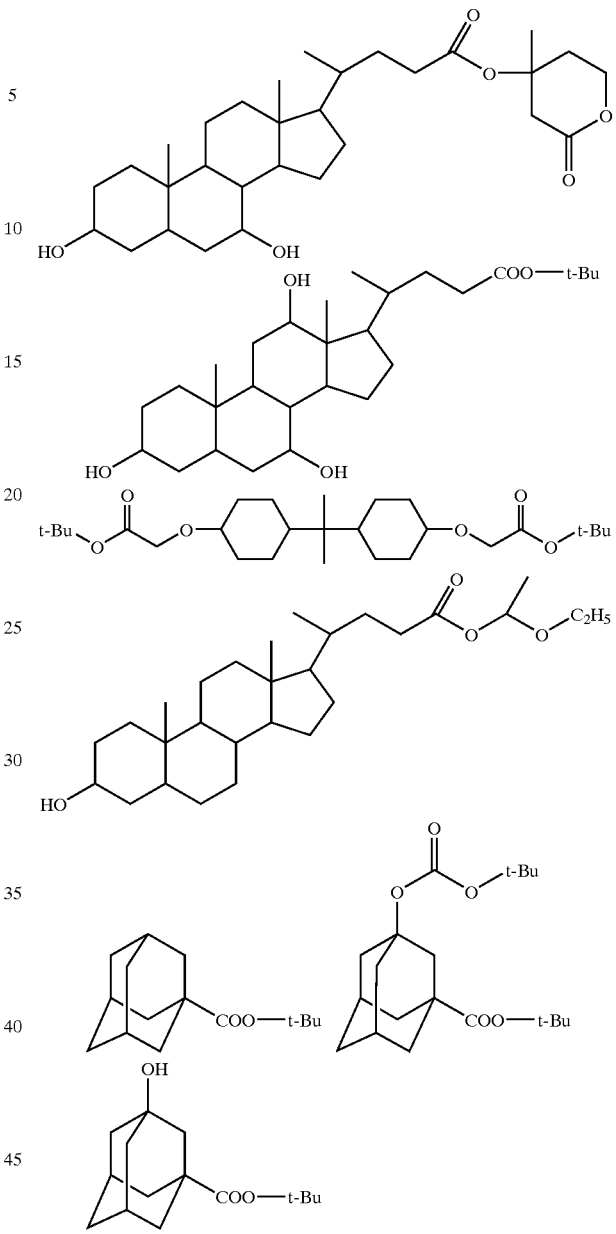

<<(G) Alkali-soluble Resin>>

The positive photosensitive composition of the present invention may contain a resin of component (G), which does not contain an acid-decomposable group, insoluble in water but soluble in an alkali developing solution. By the addition of such a resin, the sensitivity of the photosensitive composition can be improved.

In the present invention, a novolac resin having a molecular weight of from about 1,000 to about 20,000 and a polyhydroxystyrene derivative having a molecular weight of from about 3,000 to about 50,000 are used as such a resin. Since these resins have a large absorption of light of 250 nm or less, they are preferably used after being subjected to partial hydrogenation or in an amount not larger than 30% by weight based on the total amount of resin.

Resins having a carboxy group as an alkali-solubilizing group are also used. The carboxy group-containing resin preferably has a monocyclic or polycyclic alicyclic hydrocarbon group for improving dry etching resistance. Specific examples of such a resin include a methacrylic ester/(meth) acrylic acid copolymer having an alicyclic hydrocarbon structure which does not exhibit acid decomposability and a (meth)acrylic ester resin containing an alicyclic hydrocarbon group having a carboxy group at the terminal thereof.

<<Other Additives>>

Into the positive photosensitive composition of the present invention, a aye, a plasticizer, a surface active agent other than the surface active agent of component (D), a photosensitizer and a compound for promoting dissolution in a developing solution may be incorporated.

The dissolution promoting compound in a developing A solution for use in the present invention is a low molecular weight compound having a molecular weight of not more than 1,000 and having at least two phenolic hydroxy groups or at least one carboxy group. In case of containing a carboxy group, an alicyclic or aliphatic compound is preferred because of the same reason as described above.

The amount of dissolution promoting compound used is preferably from 2 to 50% by weight, and more preferably from 5 to 30% by weight, based on the resin capable of being decomposed by the action of an acid to increase a solubility rate in an alkali developing solution of component (B). The amount exceeding 50% by weight is not preferred, because another problem of the increase in development residue or the deformation of patterns at development may occur.

Such a phenolic compound having a molecular weight of not more than 1,000 can be easily synthesized by one skilled in the art with reference to methods as described, for example, in JP-A-4-122938, JP-A-2-28531, U.S. Pat. No. 4,916,210 and European Patent 219,294.

Specific examples of the carboxy group-containing alicyclic or aliphatic compound include a carboxylic acid derivative having a steroid structure, e.g., cholic acid, deoxycholic acid or lithocholic acid, an adamantanecarboxylic acid derivative, adamantanedicarboxylic acid, cyclohexanecarboxylic acid and cyclohexanedicarboxylic acid, but the present invention should not be construed as being limited thereto.

To the photosensitive composition of the present invention, a surface active agent other than the fluorine-base and/or silicon-base surface active agent of component (D) may be added. Specific examples of such surface active agent include a nonionic surface active agent, for example, a polyoxyethylene alkyl ether, e.g., polyoxyethylene lauryl ether, polyoxyethylene stearyl ether, polyoxyethylene cetyl ether or polyoxyethylene oleyl ether, a polyoxyethylene alkyl aryl ether, e.g., polyoxyethylene octyl phenol ether or polyoxyethylene nonyl phenol ether, a polyoxyethylene/polyoxypropylene block copolymer, a sorbitan fatty acid ester, e.g., sorbitan monolaurate, sorbitan monopalmitate, sorbitan monostearate, sorbitan monooleate, sorbitan trioleate or sorbitan tistearate, and a polyoxyethylene sorbitan fatty acid ester, e.g., polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate.

The surface active agents may be used individually or in combination of two or more thereof, <<Method for Use>>

The positive photosensitive composition of the present invention is applied onto a substrate to form a thin film. The thickness of the film is preferably from 0.2 to 1.2 $\mu$m.

An inorganic substrate for use in the present invention includes a conventional bare Si substrate, a SOG substrate and a substrate having a reflection preventing film as described below.

In the present invention, a known inorganic or organic reflection preventing film may be used, if desired.

Suitable examples of the reflection preventing film include an inorganic film type, for example, titanium, titanium dioxide, titanium nitride, chromium oxide, carbon or amorphous silicon, and an organic film type comprising a light absorbent and a polymer material. The former requires an apparatus, for example, a vacuum deposition apparatus, a CVD apparatus or a sputtering apparatus, for the formation of reflection preventing film. The organic reflection preventing film includes, for example, a film comprising a condensate of a diphenylamine derivative with a formaldehyde-modified melamine resin, an alkali-soluble resin and a light absorbent as described in JP-B-7-69611 (the term "JP-B" as used herein means an "examined Japanese patent publication"), a film comprising a reaction product of a maleic anhydride copolymer with a diamine light absorbent as described in U.S. Pat. No. 5,294,680, a film comprising a resin binder and a methylolmelamine thermal crosslinking agent as described in JP-A-6-118631, a reflection preventing film of an acrylic resin containing a carboxylic acid group, an epoxy group and a light absorbing group within the same molecule as described in JP-A-6-118656, a film comprising methylolmelamine and a benzophenone light absorbent as described in JP-A-8-87115, and a film comprising a low molecular weight light absorbent added to a polyvinyl alcohol resin as described in JP-A-8-179509.

Also, a commercially available reflection preventing film, for example, DUV-30 Series, DUV-40 Series or APC25 (manufactured by Brewer Science, Inc.) or AC-2, AC-3, AR19 or AR20 (manufactured by Shipley Co., Ltd.) is employed as the organic reflection preventing film.

A resist solution of the photosensitive composition is applied to a substrate (e.g., silicon/silicon dioxide coating) having thereon the reflection preventing film described above, if desired, as used for the production of a precision integrated circuit element by means of an appropriate coating method, for example, using a spinner or coater. After the application, the resulting photosensitive layer is exposed to light through a desired mask, followed by baking and development. Thus, good resist patterns are obtained. As a light source for the exposure, light having a wavelength of from 150 to 250 nm is preferred. Specific examples thereof include a Krf excimer laser beam (248 nm), an ArF excimer laser beam (193 nm), an $F_2$ excimer laser beam (157 nm), an X-ray and an electron beam.

In the development step, a developing solution as described below is used. The developing solution for the positive photosensitive composition of the present invention includes an aqueous alkaline solution containing, for example, an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcohol amine, e.g., dimethylethanolamine or triethanolamine, a quaternary ammonium salt, e.g., tetramethylammonium hydroxide or tetraethylammonium hydroxide, and a cyclic amine, e.g., pyrrole or piperidine.

A developing solution prepared by adding an appropriate amount of an alcohol or a surface active agent to the aqueous alkaline solution is also used.

The present invention is described in more detail with reference to the following examples, but the present invention should not be construed as being limited thereto.

<Synthesis Example of Acid Generator>

SYNTHESIS EXAMPLE 1

Synthesis of Acid Generator (IA-1)

In 100 ml of N,N-dimethylformamide was dissolved 10 g of tetralone under a nitrogen gas stream, and to the solution was added 50 ml of triethylamine. To the solution was gradually added 14.9 g of chlorotrimethylsilane, followed by reacting at 120° C. for 2 hours. The reaction solution was allowed to cool to room temperature and 200 ml of hexane was added thereto. The solution was washed twice with a saturated aqueous sodium hydrogen carbonate solution, dried and concentrated. The crude product was purified by distillation under a reduced pressure to obtain 13 g of enol silyl ether of tetralone.

In 50 ml of chloroform were dissolved 5 g of the enol silyl ether of tetralone and 2.4 g of tetramethylenesulfoxide under a nitrogen gas stream, and the solution was cooled to −10° C. To the solution was added 4.8 g of trifluoroacetic anhydride over a period of 30 minutes, follower by reacting for 30 minutes. An aqueous solution containing 7.7 g of potassium nonafluorobutanesulfonate was added to the reaction solution and the mixture was thoroughly stirred. The chloroform phase was separated and the aqueous phase was extracted with chloroform. The chloroform phase was concentrated to obtain a crude product. The crude product was washed with diisopropyl ether to obtain 4.2 g of Acid Generator (IA-1).

Acid Generators (IA-2) to (IA-54) were also synthesized in a similar manner.

SYNTHESIS EXAMPLE 2

Synthesis of Acid Generator (IB-1)

In 100 ml of carbon tetrachloride was dissolved 22.7 g of aluminum chloride, and to the solution were dropwise added 10 g of thioanisole and 20 g of chloroacetic chloride under cooling with ice. The mixed solution was reacted by refluxing for 2 hours. The reaction solution was poured into ice, and 15 ml of concentrated hydrochloric acid was added thereto, followed by stirring for 30 minutes. The aqueous phase was separated and an aqueous solution containing 24.5 g of potassium nonafluorobutanesulfonate was added thereto to deposit powder. The powder was collected by filtration and recrystallized from a mixed solvent of ethyl acetate and acetone to obtain 12.6 g of Acid Generator (IB-1).

Acid Generators (IB-2) to (IB-24) were also synthesized in a similar manner.

<Synthesis Example of Resin>

SYNTHESIS EXAMPLE 1

Synthesis of Resin (1) (Side Chain Type)

2-Ethyl-2-adamantyl methacrylate and butyrolactone methacrylate in a molar ratio of 55/45 were dissolved in a mixed solvent of methyl ethyl ketone and tetrahydrofuran (5/5 by weight) to prepare 100 ml of a solution having a solid concentration of 20% by weight. To the solution was added 2% by mole of V-65 manufactured by Wako Pure Chemical Industries, Ltd., and the solution was added dropwise to 10 ml of methyl ethyl ketone heated at 60° C. under a nitrogen gas stream over a period of 4 hours. After the completion of the addition, the reaction solution was heated for 4 hours and 1% by mole of V-65 was again added thereto, followed by stirring for 4 hours. Then, the reaction solution was cooled to room temperature and poured into 3 liters of a mixed solvent of distilled water and isopropyl alcohol (1/1 by weight) to crystallize, and the white powder deposited was recovered to obtain Resin (1).

A monomer unit composition ratio of the resin determined by $C^{13}$NMR was 46/54. A weight average molecular weight thereof measured by GPC method and calculated in terms of standard polystyrene was 10,700.

Resins (2) to (15) were synthesized in a similar manner to Synthesis Example (1) respectively. The monomer, unit composition ratio and weight average molecular weight of each of Resins (2) to (15) are shown in Table 1 below. In Table 1, Repeating Units 1, 2, 3 and 4 denote the repeating units of Resins (2) to (15) shown below in order from left to right, respectively.

TABLE 1

| Resin | Repeating Unit 1 (mol %) | Repeating Unit 2 (mol %) | Repeating Unit 3 (mol %) | Repeating Unit 4 (mol %) | Weight Average Molecular Weight |
|---|---|---|---|---|---|
| 2 | 53 | 40 | 7 | — | 13,400 |
| 3 | 46 | 34 | 20 | — | 9,400 |
| 4 | 42 | 31 | 27 | — | 8,300 |
| 5 | 49 | 42 | 9 | — | 9,900 |
| 6 | 42 | 30 | 28 | — | 10,300 |
| 7 | 39 | 35 | 26 | — | 8,900 |
| 8 | 46 | 22 | 30 | 2 | 12,900 |
| 9 | 42 | 20 | 32 | 6 | 11,600 |
| 10 | 46 | 42 | 12 | — | 9,200 |
| 11 | 38 | 32 | 30 | — | 11,300 |
| 12 | 42 | 18 | 38 | 2 | 13,800 |
| 13 | 38 | 31 | 29 | 2 | 11,100 |
| 14 | 50 | 31 | 19 | — | 11,700 |
| 15 | 35 | 6 | 16 | 43 | 13,200 |

Structures of Resins (1) to (15) are shown below.

(1)

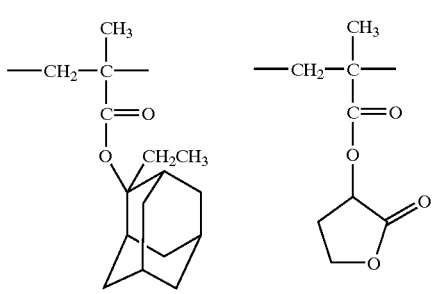

-continued
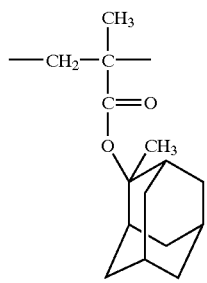 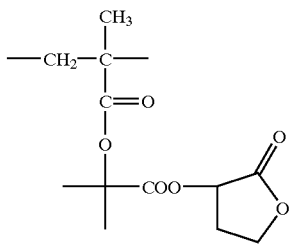 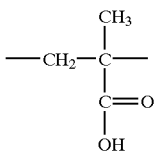
(2)
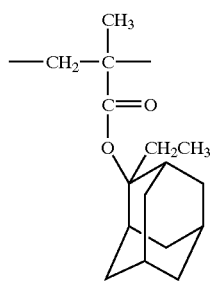 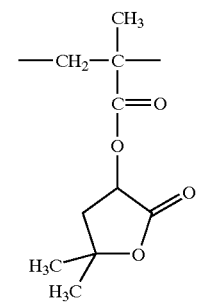 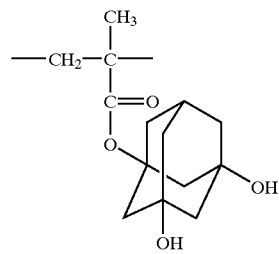
(3)
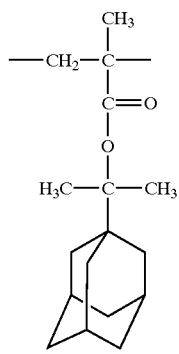 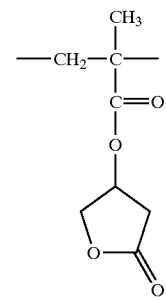 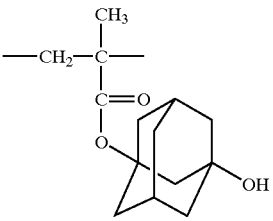
(4)
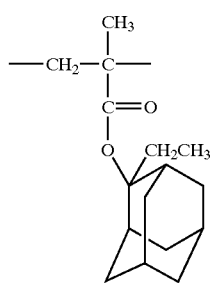 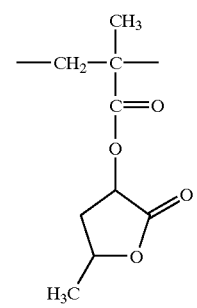 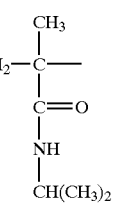
(5)
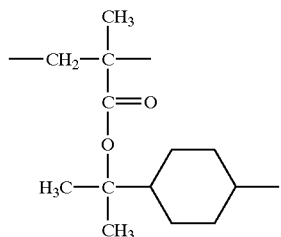 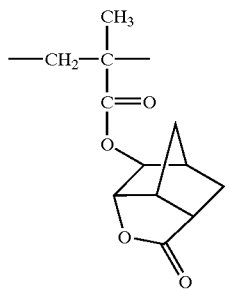 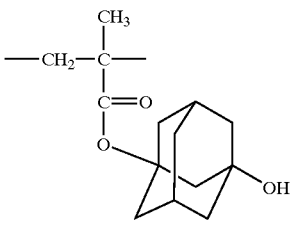
(6)

-continued
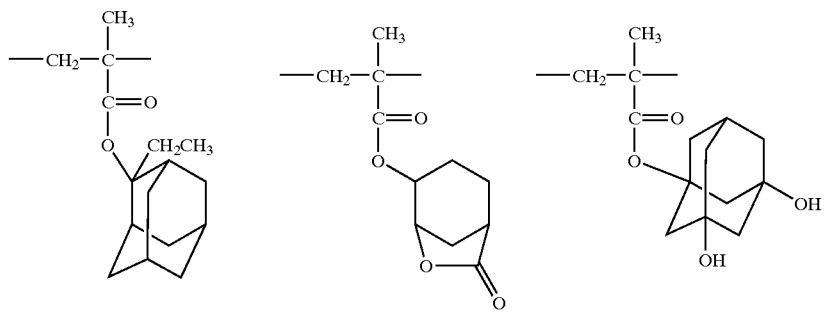
(7)
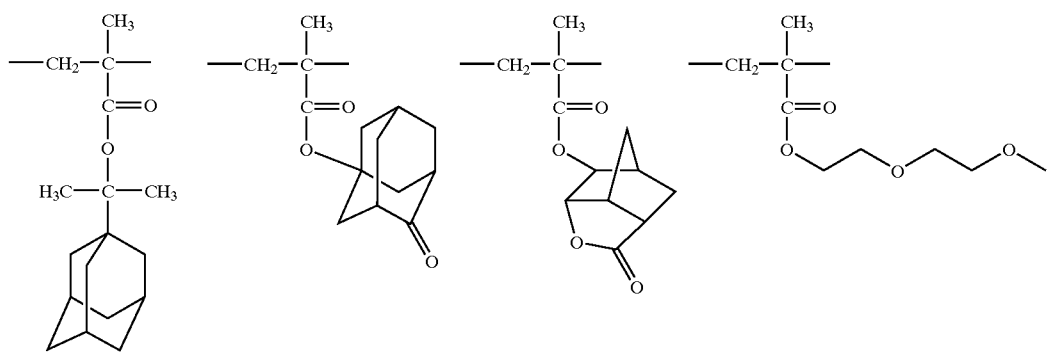
(8)
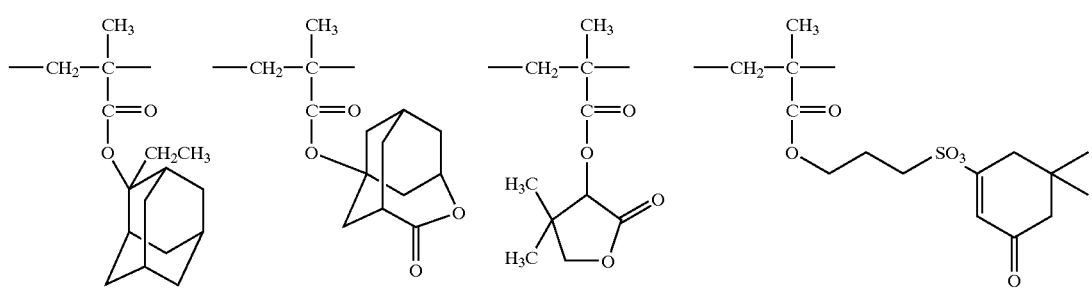
(9)
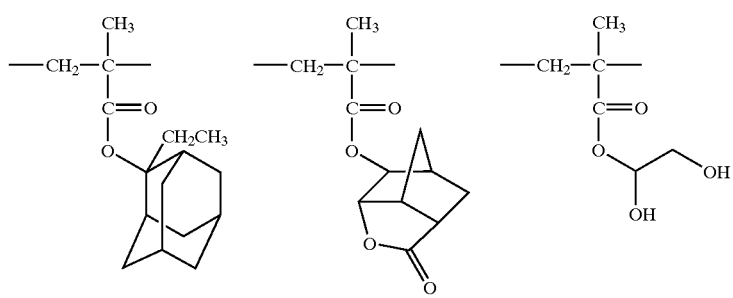
(10)
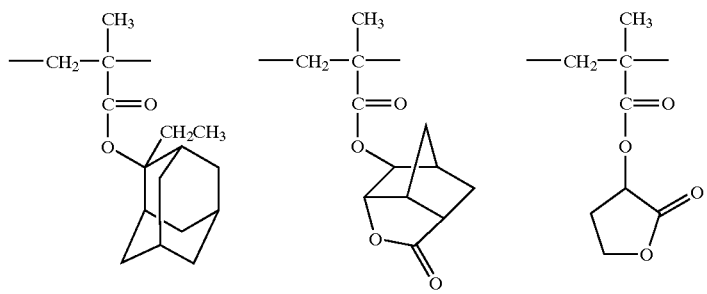
(11)

(12)
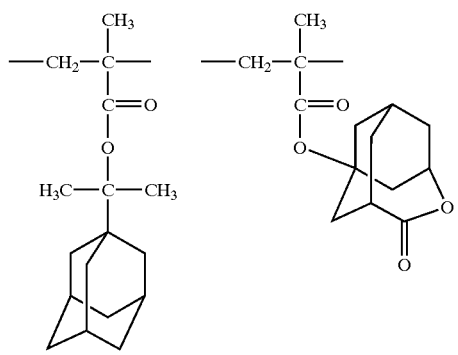
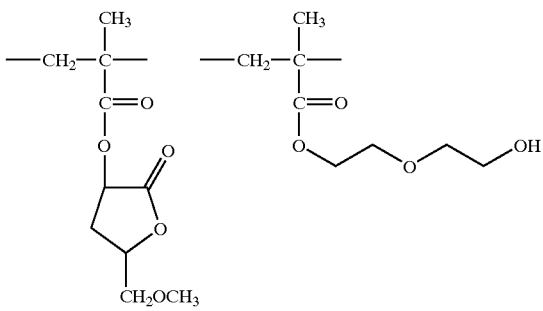

(13)
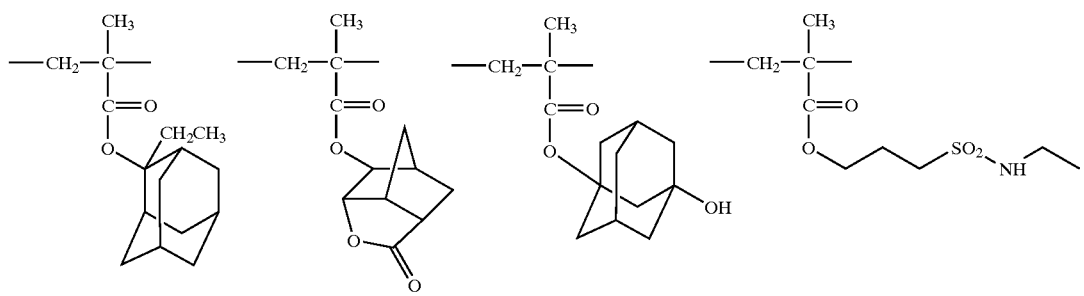

(14)
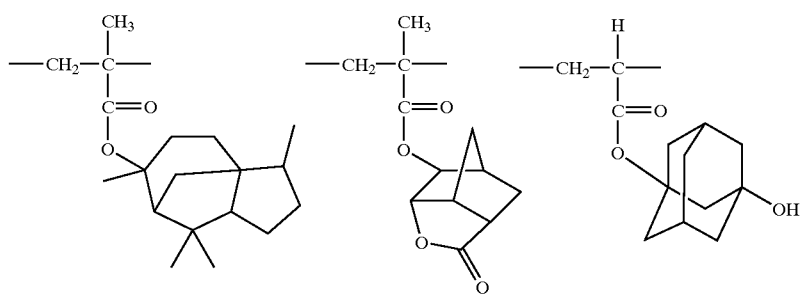

(15)
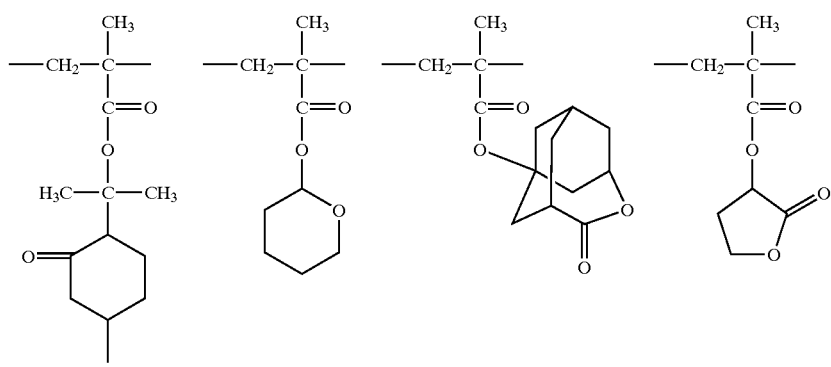

SYNTHESIS EXAMPLE 2

Synthesis of Resin (16) (Main Chain Type)

Into a separable flask were put tert-butyl ester of norbornenecarboxylic acid, butyrolactone ester of norbornenecarboxylic acid and maleic anhydride in a molar ratio of 40/10150 and tetrahydrofuran in an amount necessary for forming a solution having a reaction concentration of 60% by weight, and the solution was heated at 60° C. under a nitrogen gas stream. After the reaction temperature was stabilized, 2% by mole of a radical initiator (V-601 manufactured by Wako Pure Chemical Industries, Ltd.) was added to initiate a reaction. After heating for 12 hours, the reaction mixture was diluted twice with tetrahydrofuran and poured into a solvent mixture of hexane and isopropyl alcohol (1/1 by weight) to deposit white powder. The powder was collected by filtration and dried to obtain Resin (16).

Resin (16) was subjected to molecular weight analysis by a GPC method and it was found that a weight average molecular weight thereof calculated in terms of polystyrene was 8,300. A molar ratio of repeating units corresponding to the tert-butyl ester of norbornenecarboxylic acid, butyrolactone ester of norbornenecarboxylic acid and maleic anhydride determined from an NMR spectrum was 42/8/50.

Resins (17) to (27) were synthesized in a similar manner to Synthesis Example (2) respectively. The monomer unit composition ratio and weight average molecular weight of each of Resins (17) to (27) are shown in Table 2 below. In Table 2, Alicyclic Olefin Units 1, 2 and 3 denotes the repeating units of Resins (17) to (27) shown below in order from left to right, respectively.

TABLE 2

| Resin | Alicyclic Olefin Unit 1 (mol %) | Alicyclic Olefin Unit 2 (mol %) | Alicyclic Olefin Unit 3 (mol %) | Maleic Anhydride Unit (mol %) | Weight Average Molecular Weight |
|---|---|---|---|---|---|
| 17 | 35 | 15 | — | 50 | 8,200 |
| 18 | 20 | 30 | — | 50 | 8,600 |
| 19 | 36 | 14 | — | 50 | 9,100 |
| 20 | 31 | 19 | — | 50 | 7,900 |
| 21 | 35 | 5 | 10 | 50 | 8,300 |

TABLE 2-continued

| Resin | Alicyclic Olefin Unit 1 (mol %) | Alicyclic Olefin Unit 2 (mol %) | Alicyclic Olefin Unit 3 (mol %) | Maleic Anhydride Unit (mol %) | Weight Average Molecular Weight |
|---|---|---|---|---|---|
| 22 | 33 | 17 | — | 50 | 8,500 |
| 23 | 38 | 12 | — | 50 | 8,900 |
| 24 | 31 | 6 | 13 | 50 | 8,100 |
| 25 | 33 | 7 | 10 | 50 | 9,100 |
| 26 | 40 | 10 | — | 50 | 9,300 |
| 27 | 34 | 16 | — | 50 | 8,800 |

Structures of Resins (16) to (27) are shown below.

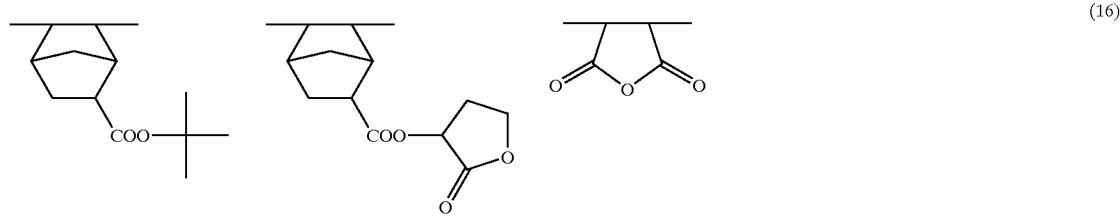

(16)

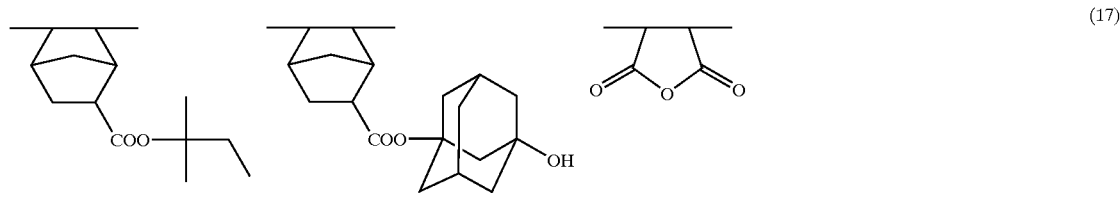

(17)

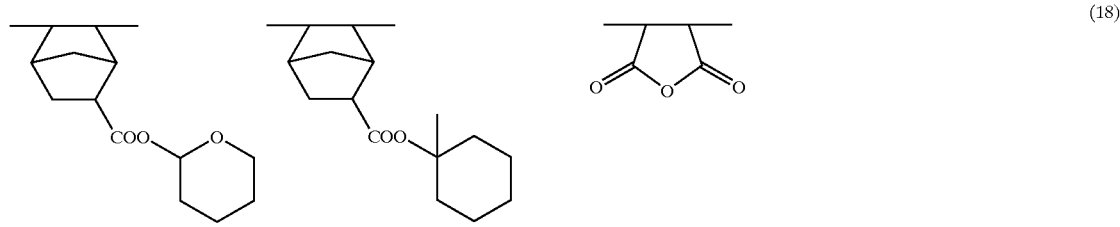

(18)

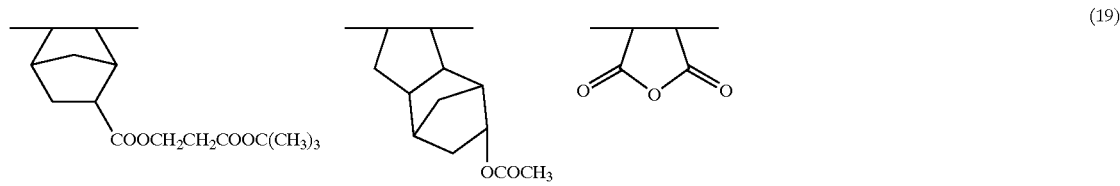

(19)

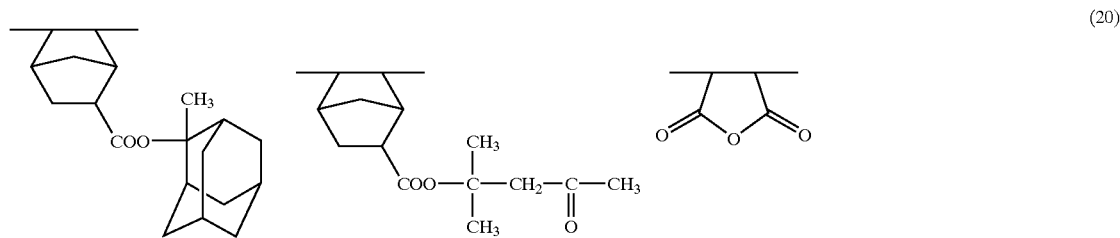

(20)

-continued

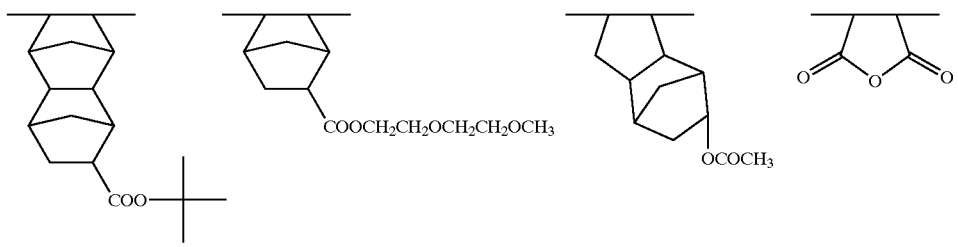 (21)

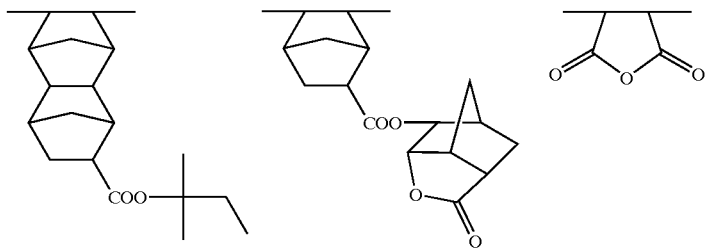 (22)

(23)

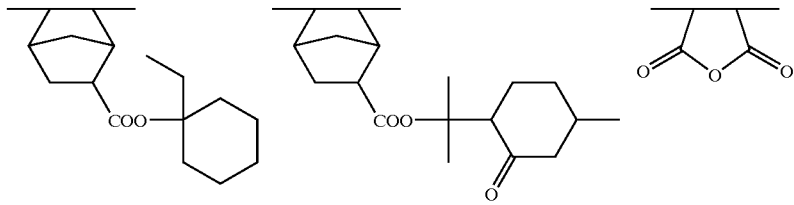 (24)

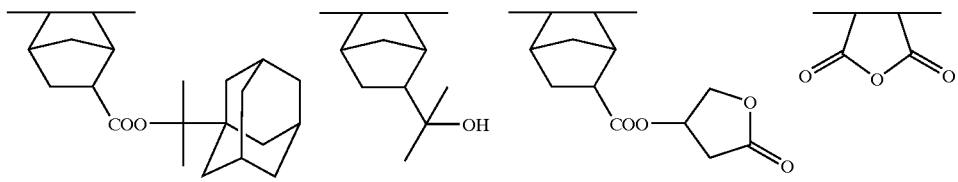 (25)

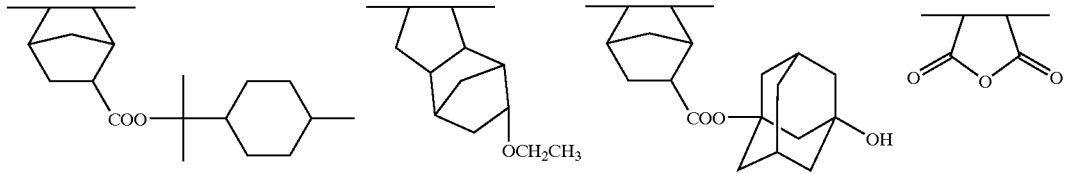 (26)

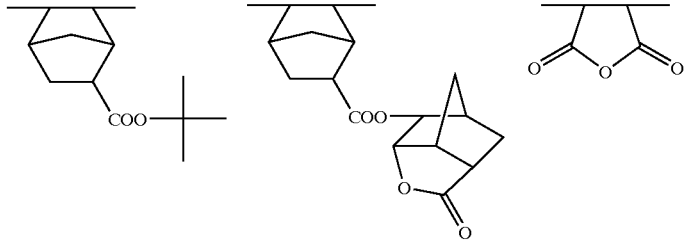 (27)

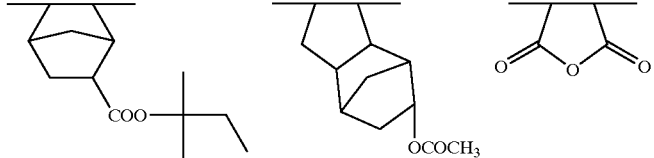

SYNTHESIS EXAMPLE 3
Synthesis of Resin (28) (Hybrid Type)

Into a reaction vessel were put norbornene, maleic anhydride, tert-butyl acrylate and 2-methylcyclohexyl-2-propyl acrylate in a molar ratio of 35/35/20/10 and dissolved in tetrahydrofuran to form a solution having a solid content of 60% by weight, and the solution was heated at 65° C. under a nitrogen gas stream. After the reaction temperature was stabilized, 1% by mole of a radical initiator (V-601 manufactured by Wako Pure Chemical Industries, Ltd.) was added to initiate a reaction. After heating for 8 hours, the reaction mixture was diluted twice with tetrahydrofuran and poured into hexane of five times in volume to deposit white powder. The powder was collected by filtration and dissolved in methyl ethyl ketone and the solution was poured into a mixed solvent of hexane and tert-butyl methyl ether (1/1 by weight) of five times in volume to reprecipitate. The white powder deposited was collected by filtration and dried to obtain Resin (28).

Resin (28) was subjected to molecular weight analysis by a GPC method and it was found that a weight average molecular weight thereof calculated in terms of polystyrene was 12,100. A molar ratio of repeating units corresponding to the norbornene, maleic anhydride, tert-butyl acrylate and 2-methylcyclohexyl-2-propyl acrylate determined from an NMR spectrum was 32/39/19/10.

Resins (29) to (41) were synthesized in a similar manner to Synthesis Example (3) respectively. The monomer unit composition ratio and weight average molecular weight of each of Resins (29) to (41) are shown in Table 3 below. In Table 3, Norbornene Unit, Acid Anhydride Unit and (Meth) acrylate Unit denotes the repeating units of Resins (29) to (41) shown below in order from left to right, respectively.

TABLE 3

| Resin | Norbornene Unit (mol %) | Acid Anhydride Unit (mol %) | (Meth) acrylate Unit (mol %) | Weight Average Molecular Weight |
|---|---|---|---|---|
| 29 | 20/15 | 40 | 15/10 | 11,900 |
| 30 | 32 | 37 | 20/8/3 | 10,500 |
| 31 | 16 | 21 | 36/27 | 13,900 |
| 32 | 15 | 22 | 34/29 | 12,300 |
| 33 | 17 | 20 | 33/30 | 12,400 |
| 34 | 18 | 24 | 32/26 | 13,000 |
| 35 | 15 | 19 | 36/30 | 12,700 |
| 36 | 15 | 20 | 29/10/26 | 13,100 |
| 37 | 17 | 21 | 31/31 | 12,800 |
| 38 | 18 | 17/3 | 30/32 | 13,300 |
| 39 | 16 | 19 | 31/12/11/11 | 12,600 |
| 40 | 20 | 22 | 58 | 14,700 |
| 41 | 23 | 28 | 35/14 | 13,300 |

Structures of Resins (28) to (41) are shown below.

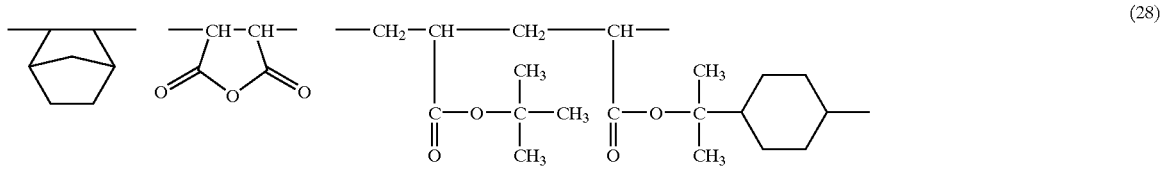

(28)

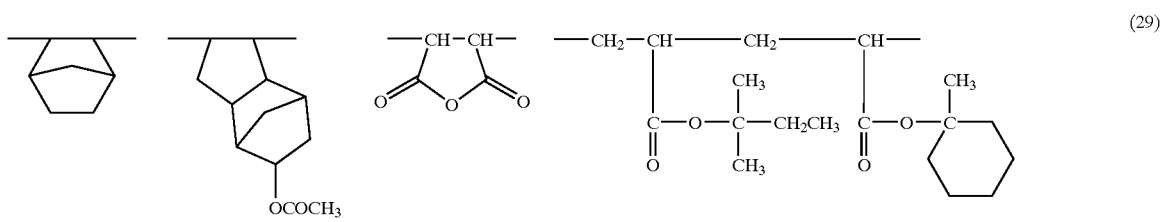

(29)

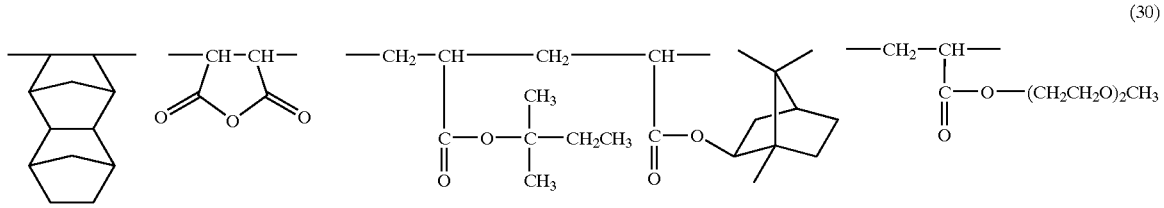

(30)

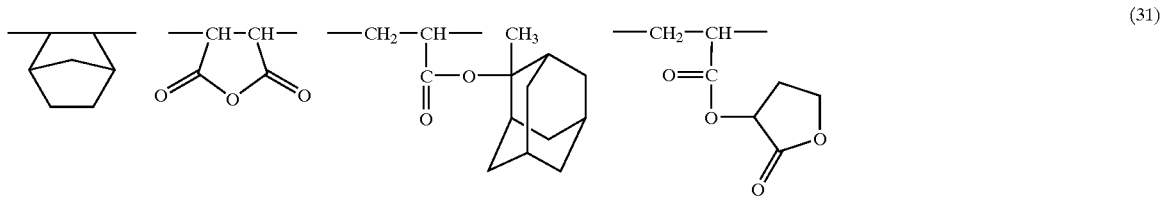

(31)

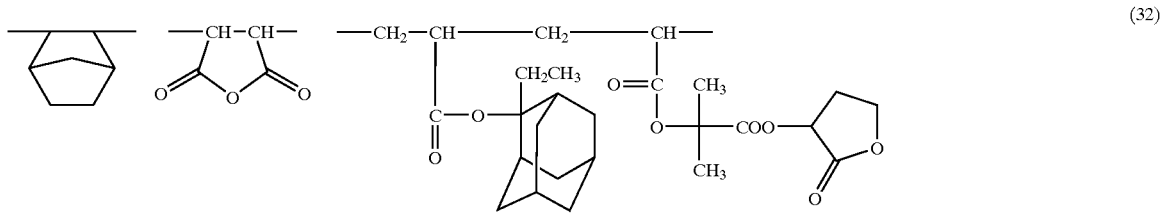

(32)

-continued
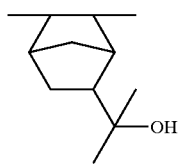 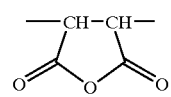 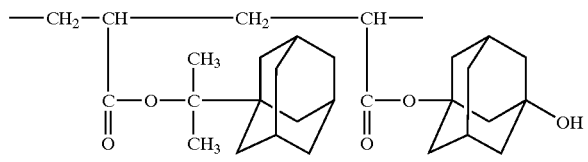 (33)
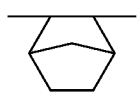 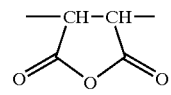 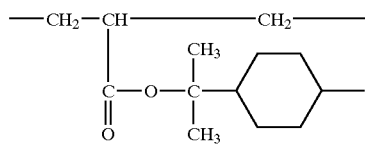 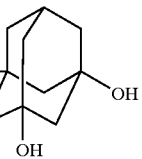 (34)
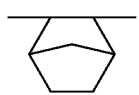 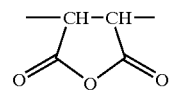 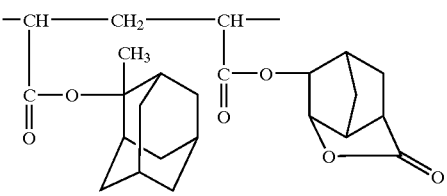 (35)
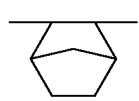 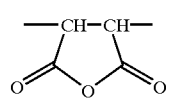 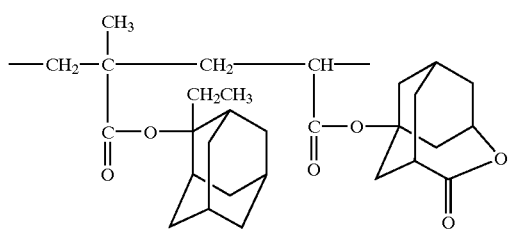 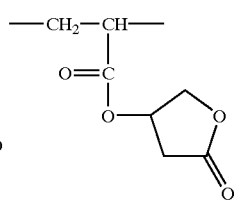 (36)
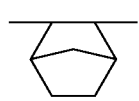 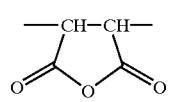 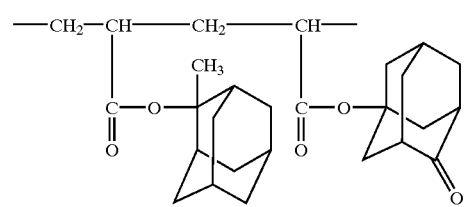 (37)
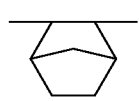 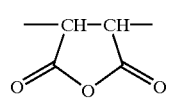 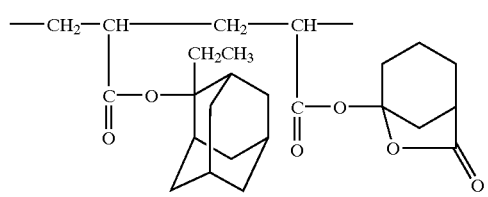 (38)

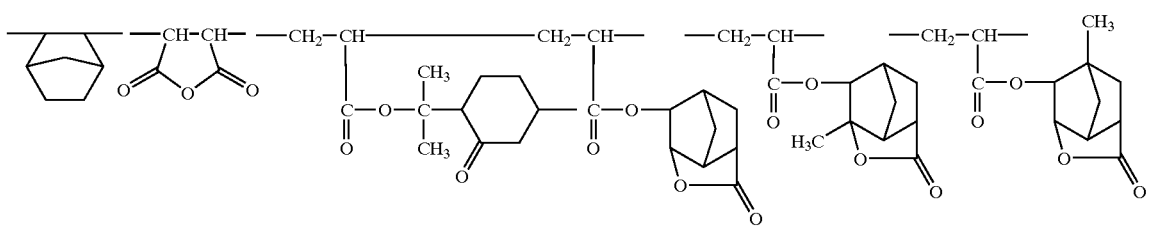

(39)

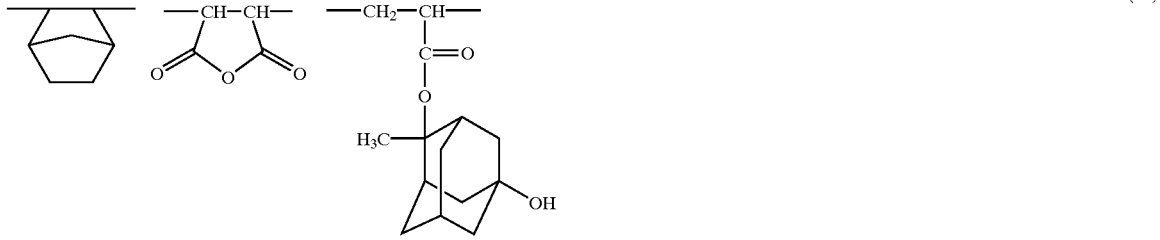

(40)

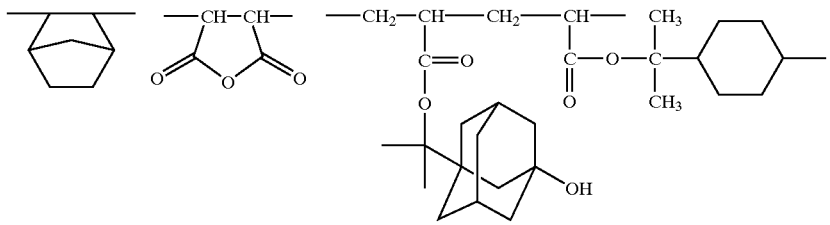

(41)

SYNTHESIS EXAMPLE 4

Synthesis of Resin (42) (Hybrid Type)

Into a reaction vessel were put tert-butyl ester of norbornenecarboxylic acid, maleic anhydride, 2-methyl-2-adamantyl acrylate and norbornenelactone acrylate in a molar ratio of 20/20/35/25 and dissolved in a mixed solvent of methyl ethyl ketone and tetrahydrofuran (1/1 by weight) to form a solution having a solid content of 60% by weight, and the solution was heated at 65° C. under a nitrogen gas stream. After the reaction temperature was stabilized, 3% by mole of a radical initiator (V-601 manufactured by Wako Pure Chemical Industries, Ltd.) was added to initiate a reaction. After heating for 12 hours, the reaction mixture was poured into hexane of five times in volume to deposit white powder. The powder was collected by filtration and dissolved in a mixed solvent of methyl ethyl ketone and tetrahydrofuran (1/1 by weight), the solution was poured into a solvent mixture of hexane and methyl tert-butyl ether of five times in volume to deposit white powder, and the powder was collected by filtration. This procedure was repeated once again and the powder deposited was dried to obtain Resin (42).

Resin (42) was subjected to molecular weight analysis (RI analysis) by a GPC method and it was found that a weight average molecular weight thereof calculated in terms of polystyrene was 11,600. An amount of the remaining monomer was 0.4%. A molar ratio of repeating units corresponding to the tert-butyl ester of norbornenecarboxylic acid, maleic anhydride, 2-methyl-2-adamantyl acrylate and norbornenelactone acrylate may be determined from an NMR spectrum was 18/23/34/25.

Resins (43) to (66) were synthesized in a similar manner to Synthesis Example (4) respectively. The monomer unit composition ratio and weight average molecular weight of each of Resins (43) to (66) are shown in Table 4 below. In Table 4, Alicyclic Olefin Unit, Monomer Unit of Formula (VIII) and Acrylic Monomer Unit denotes the repeating units of Resins (43) to (66) shown below in order from left to right, respectively.

TABLE 4

| Resin | Alicyclic Olefin Unit (mol %) | Monomer of Formula (VIII) (Acid Anhydride) (mol %) | Acrylic Monomer Unit (mol %) | Weight Average Molecular Weight |
|---|---|---|---|---|
| 43 | 24 | 29 | 31/16 | 12,300 |
| 44 | 21 | 28 | 32/29 | 11,100 |
| 45 | 22 | 27 | 28/23 | 11,300 |
| 46 | 27 | 31 | 24/18 | 10,700 |
| 47 | 32 | 38 | 20/10 | 9,700 |
| 48 | 31 | 35 | 21/13 | 9,200 |
| 49 | 29 | 35 | 20/16 | 8,900 |
| 50 | 35 | 39 | 23/3 | 8,700 |
| 51 | 28 | 36 | 22/14 | 10,600 |
| 52 | 28/8 | 44 | 20 | 9,100 |
| 53 | 30/6 | 42 | 22 | 7,700 |
| 54 | 46 | 47/3 | 4 | 6,300 |
| 55 | 37/6 | 48 | 9 | 6,800 |
| 56 | 34/10 | 51 | 5 | 7,400 |
| 57 | 41 | 43 | 10/6 | 6,700 |
| 58 | 39 | 42 | 11/8 | 8,800 |
| 59 | 36 | 42 | 10/12 | 9,300 |
| 60 | 39 | 43 | 14/4 | 9,800 |
| 61 | 38 | 42 | 15/5 | 9,300 |
| 62 | 24 | 27 | 25/24 | 12,600 |
| 63 | 19 | 24 | 40/17 | 9,500 |
| 64 | 29 | 32 | 34/5 | 10,400 |
| 65 | 20 | 25 | 26/5/24 | 13,400 |
| 66 | 16 | 24 | 32/24/4 | 12,700 |

Structures of Resins (42) to (66) are shown below.
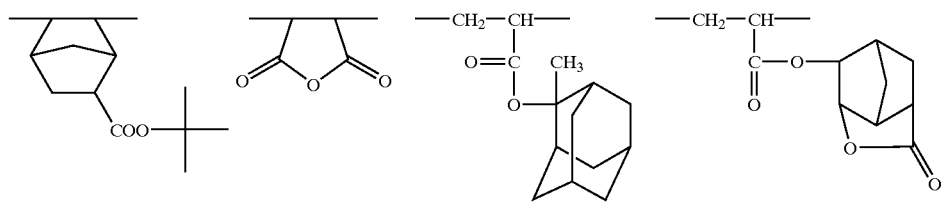
(42)
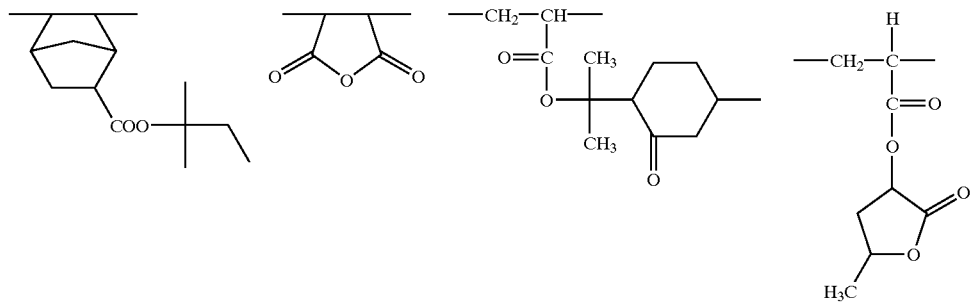
(43)
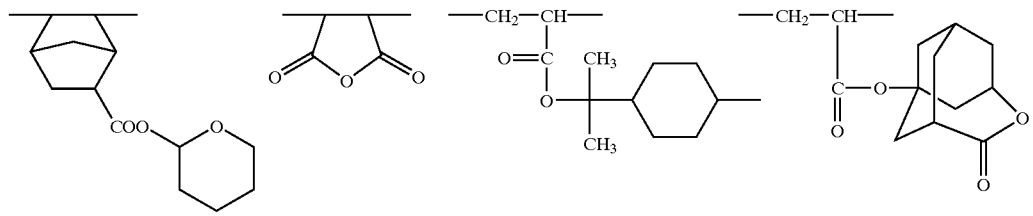
(44)
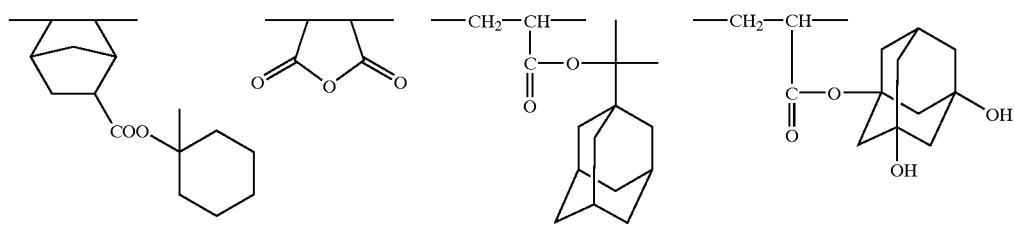
(45)
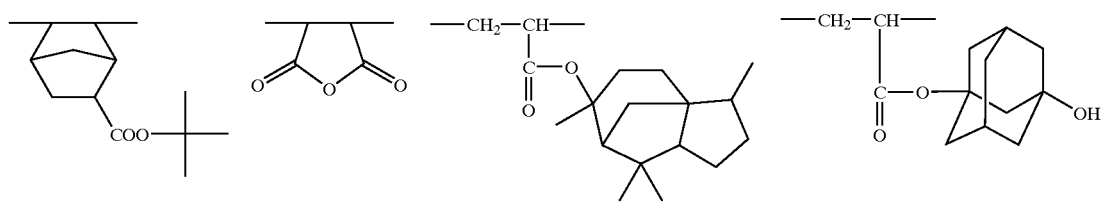
(46)
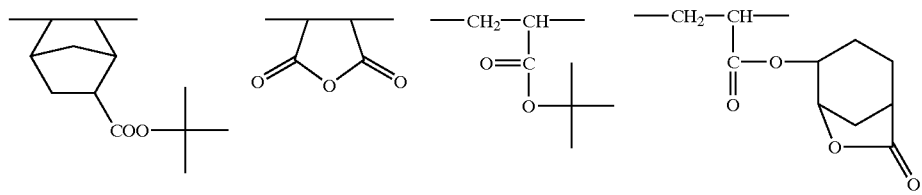
(47)

-continued
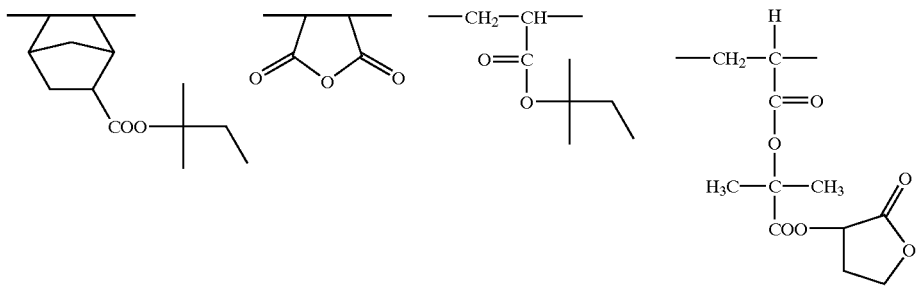
(48)
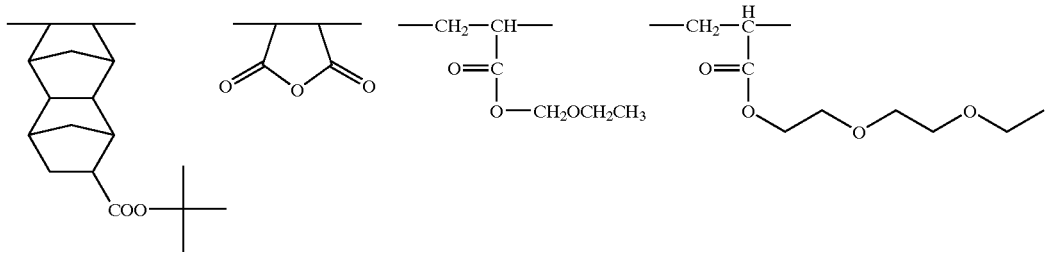
(49)
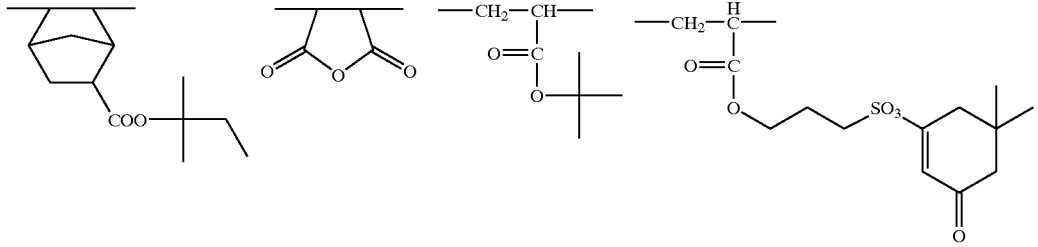
(50)
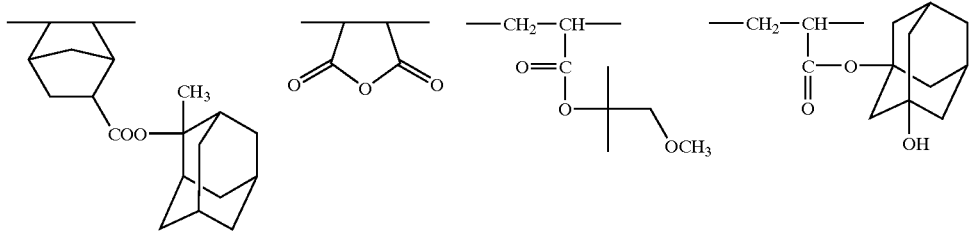
(51)
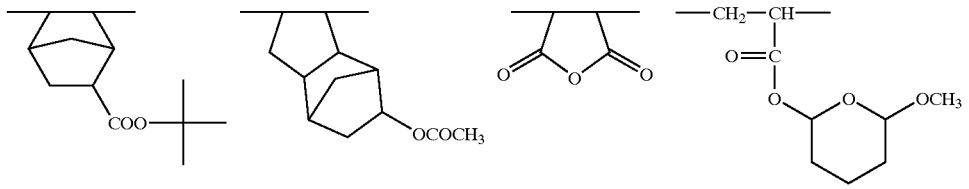
(52)
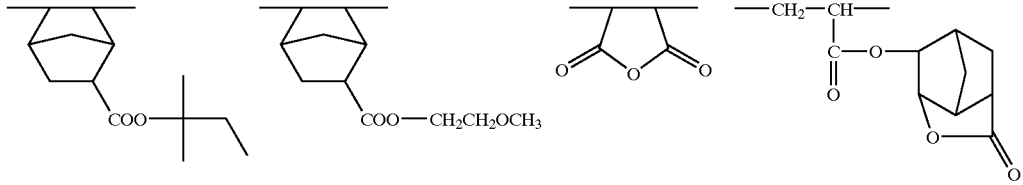
(53)

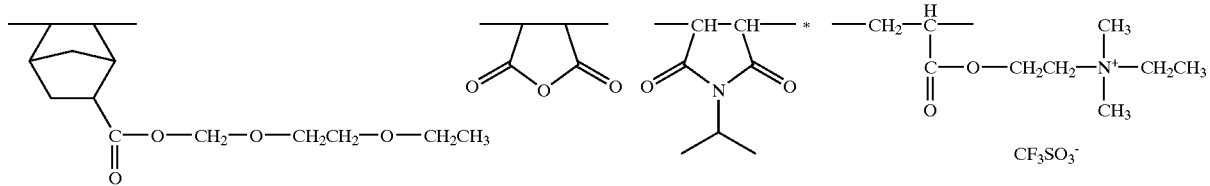
(54)
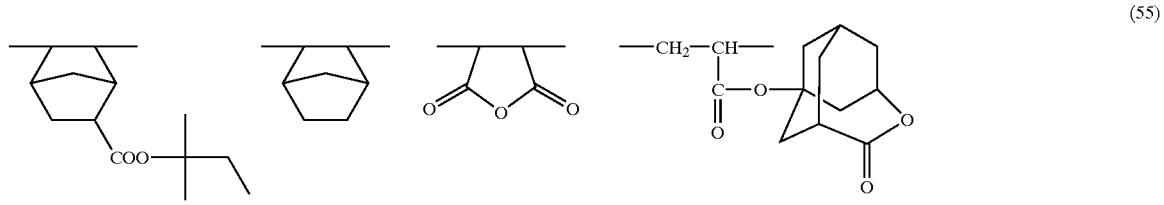
(55)
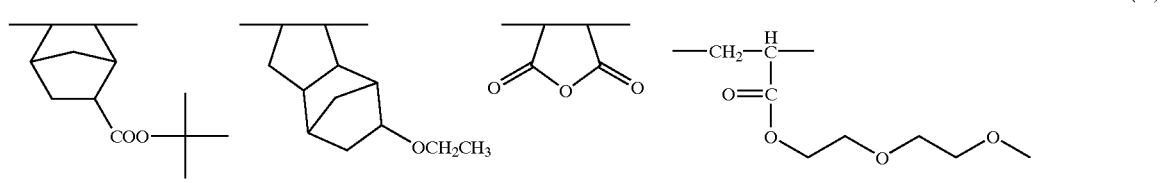
(56)
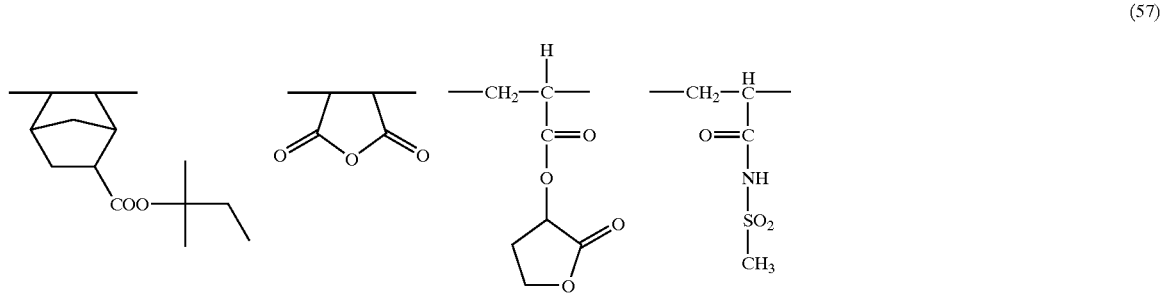
(57)
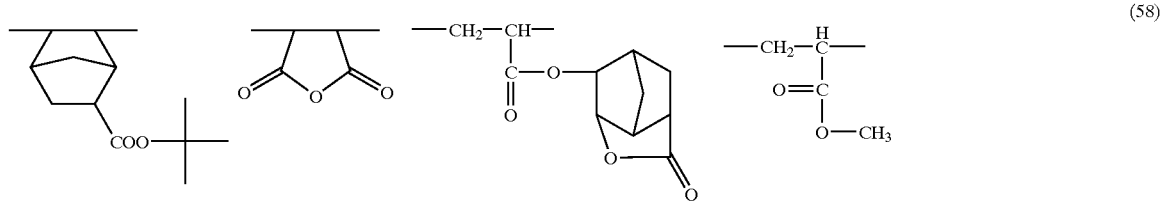
(58)
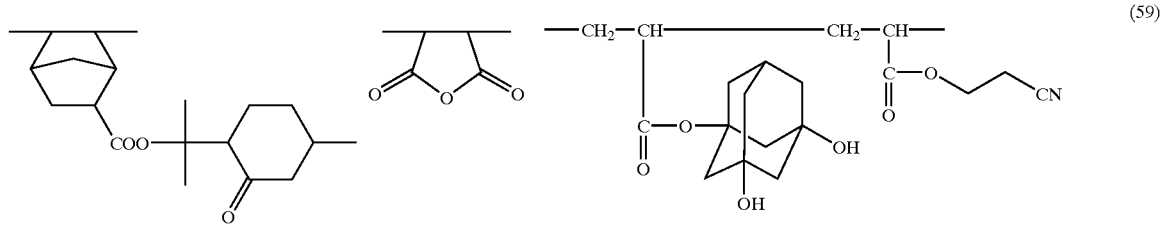
(59)
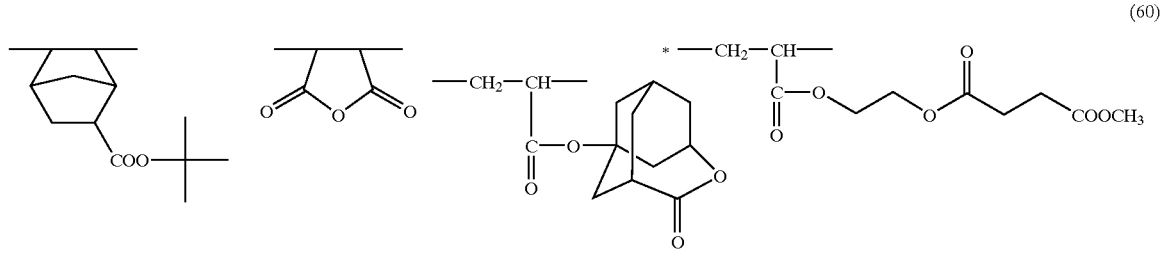
(60)

-continued
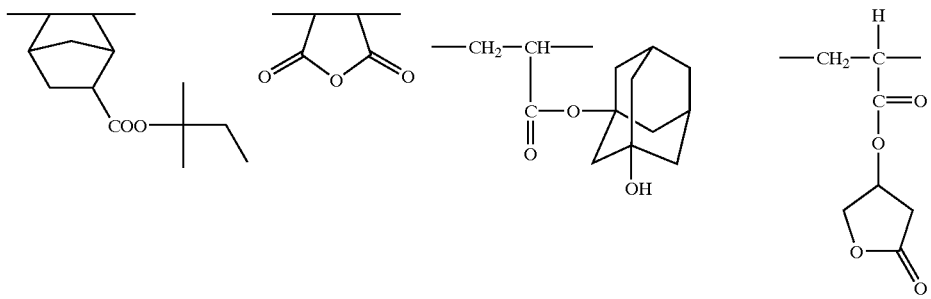
(61)
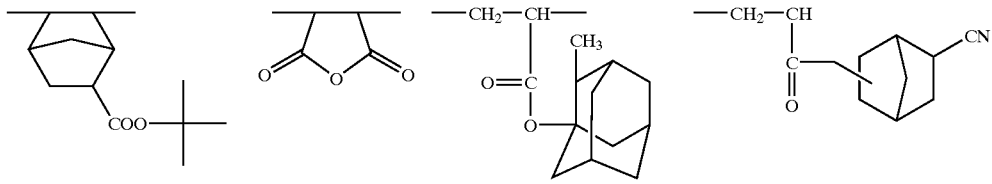
(62)
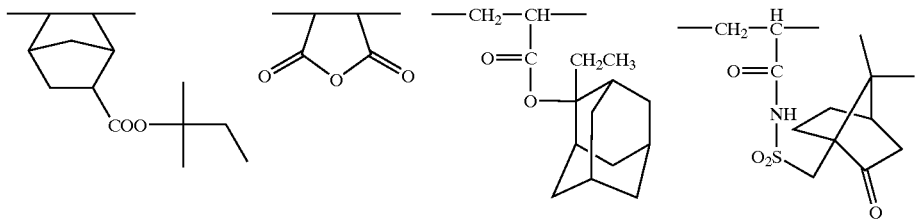
(63)
(64)
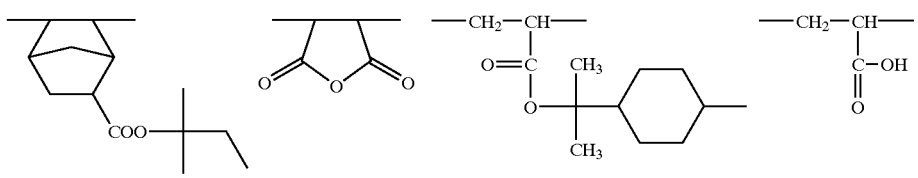
(65)
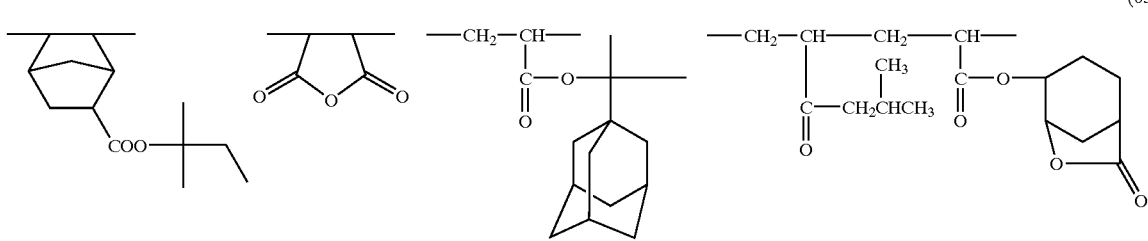
(66)
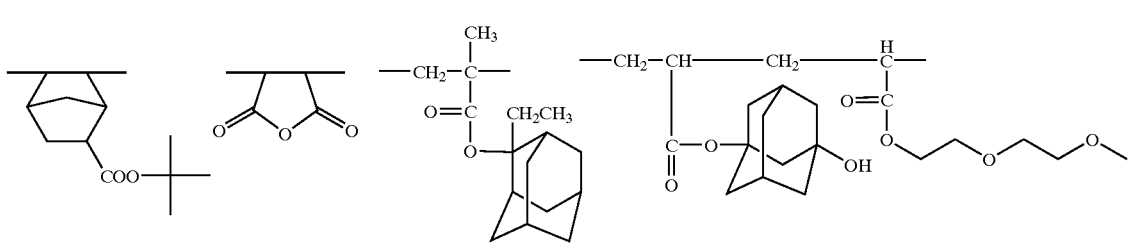

EXAMPLES 1 TO 66 AND COMPARATIVE EXAMPLES 1 TO 3

<Preparation of Resist>

In each of Examples 1 to 66 and Comparative Examples 1 to 3, the components as shown in Tables 5 to 7 below were dissolved to prepare a solution having a solid concentration of 12% by weight. The resulting solution was filtered through a Teflon filter or polyethylene filter having a pore size of 0.1 μm, whereby a positive photosensitive composition was prepared. The photosensitive composition was evaluated by the methods described below. The results obtained are shown in Tables 8 to 10 below.

TABLES 5 TO 7

| Example | Resin (10 g) | Acid Generator of Invention (g) | Other Acid Generator (g) | Other Additive (g) | Basic Compound (g) | Surface Active Agent (0.03 g) | Solvent (weight ratio) |
|---|---|---|---|---|---|---|---|
| 1 | (1) | IA-1 (0.5) | — | — | DBN (0.02) | W-1 | A1 = 100 |
| 2 | (2) | IA-2 (0.3) | — | — | TPI (0.03) | W-1 | A1 = 100 |
| 3 | (3) | IA-3 (0.3) | — | — | TPSA (0.02) | W-2 | A1/B1 = 90/10 |
| 4 | (4) | IA-4 (0.2) | z6 (0.2) | — | HEP (0.01) | W-2 | A3/B2 = 80/20 |
| 5 | (5) | IA-5 (0.4) | z3 (0.15) | — | TPI (0.03) | W-3 | A2/B1 = 90/10 |
| 6 | (6) | IA-6 (0.5) | z7 (0.2) | — | DIA (0.01) | W-3 | A4/B1 = 90/10 |
| 7 | (7) | IA-7 (0.3) | z8 (0.1) | — | DIA (0.007) | W-4 | A1/B1 = 50/50 |
| 8 | (8) | IA-8 (0.7) | z10 (0.05) | — | TOA (0.02) | W-4 | A1/B1 = 90/10 |
| 9 | (9) | IA-9 (0.15) | z11 (0.02) z33 (0.2) | LCB (1) | TPI (0.03) | W-1 | A5/B2 = 90/10 |
| 10 | (10) | IA-10 (0.2) | z30 (0.3) | — | TPI (0.02) | W-1 | A1 = 100 |
| 11 | (11) | IA-11 (0.5) | z2 (0.1) | — | TPI (0.03) | W-2 | A1/B1 = 90/10 |
| 12 | (12) | IA-12 (0.3) | z5 (0.05) | — | TPI (0.03) | W-2 | A1/B1 = 95/5 |
| 13 | (13) | IB-1 (0.3) | z36 (0.7) | — | TPI (0.03) | W-3 | A1/B1 = 95/5 |
| 14 | (14) | IB-2 (0.4) | z35 (0.2) | — | DBN (0.02) | W-3 | A1/B1 = 95/5 |
| 15 | (15) | IB-3 (0.3) | z38 (0.8) | LCB (1) | TPI (0.03) | W-4 | A1 = 100 |
| 16 | (16) | IA-13 (0.4) | z39 (0.2) | — | DIA (0.01) | W-4 | A1/B1 = 80/20 |
| 17 | (17) | IA-14 (0.3) | z37 (0.4) | — | TPI (0.03) | W-4 | A1/B1 = 95/5 |
| 18 | (18) | IA-15 (0.2) | z34 (0.15) | — | DCMA (0.01) | W-4 | A1/B1 = 95/5 |
| 19 | (19) | IA-16 (0.3) | z1 (0.1) | — | TOA (0.02) | W-4 | A1/B1 = 95/5 |
| 20 | (20) | IA-17 (0.4) | z14 (0.2) | — | TPI (0.03) | W-4 | A1 = 100 |
| 21 | (21) | IA-18 (0.5) | z33 (0.1) | — | DBN (0.02) | W-1 | A1/B1 = 95/5 |
| 22 | (22) | IA-19 (0.3) | z31 (0.15) | — | TPI (0.03) | W-1 | A1/B1 = 80/20 |
| 23 | (23) | IA-20 (0.3) | z35 (0.3) | — | TPSA (0.02) | W-2 | A1/B1 = 90/10 |
| 24 | (24) | IA-21 (0.15) | z8 (0.2) | — | HEP (0.01) | W-2 | A3/B2 = 80/20 |
| 25 | (25) | IA-22 (0.3) | z22 (0.2) | — | TPI (0.03) | W-3 | A2/B1 = 90/10 |
| 26 | (26) | IA-23 (0.5) | z29 (0.1) | — | DIA (0.01) | W-3 | A4/B1 = 90/10 |
| 27 | (27) | IA-24 (0.4) | z26 (0.2) | — | DIA (0.007) | W-4 | A1/B1 = 50/50 |
| 28 | (28) | IA-25 (0.3) | z21 (0.3) | — | DBN (0.02) | W-4 | A1/B1 = 90/10 |
| 29 | (29) | IA-26 (0.1) | z23 (0.3) | LCB (1) | TPI (0.03) | W-1 | A5/B2 = 90/10 |
| 30 | (30) | IA-27 (0.5) | z16 (0.2) | — | TPI (0.02) | W-1 | A1/B1 = 95/5 |
| 31 | (31) | IA-28 (0.7) | z20 (0.8) | — | TPI (0.03) | W-2 | A1/B1 = 90/10 |

TABLES 5 TO 7-continued

| Example | Resin (10 g) | Acid Generator of Invention (g) | Other Acid Generator (g) | Other Additive (g) | Basic Compound (g) | Surface Active Agent (0.03 g) | Solvent (weight ratio) |
|---|---|---|---|---|---|---|---|
| 32 | (32) | IA-29 (0.3) | z2 (0.1) | — | TPI (0.03) | W-2 | A1/B1 = 95/5 |
| 33 | (33) | IA-30 (0.15) | z1 (0.1) | — | TPI (0.03) | W-3 | A1/B1 = 95/5 |
| 34 | (34) | IA-33 (0.4) | z4 (0.05) | — | DBN (0.02) | W-3 | A1/B2 = 95/5 |
| 35 | (35) | IA-34 (0.3) | z8 (0.1) | — | TPI (0.03) | W-4 | A1/B1 = 80/20 |
| 36 | (36) | IA-41 (0.2) | z5 (0.05) | — | DIA (0.01) | W-4 | A1/B1 = 80/20 |
| 37 | (37) | IA-42 (0.3) | z39 (0.5) | — | TPI (0.03) | W-4 | A1/B1 = 95/5 |
| 38 | (38) | IA-48 (0.15) | z33 (0.2) | — | DCMA (0.01) | W-4 | A1/B1 = 95/5 |
| 39 | (39) | IB-4 (0.5) | z33 (0.2) | — | TPI (0.02) | W-4 | A1/B1 = 95/5 |
| 40 | (40) | IB-5 (0.4) | z31 (0.3) | LCB (1) | TPI (0.03) | W-4 | A1/B1 = 95/5 |
| 41 | (41) | IB-6 (0.25) | z30 (0.3) | — | DBN (0.02) | W-1 | A1/B1 = 95/5 |
| 42 | (42) | IB-7 (0.3) | z18 (0.02) | — | TPI (0.03) | W-1 | A1/B1 = 80/20 |
| 43 | (43) | IB-8 (0.1) IA-1 (0.5) | z12 (0.01) | — | TPSA (0.02) | W-2 | A1/B1 = 90/10 |
| 44 | (44) | IB-9 (0.7) | z26 (0.3) | — | BEP (0.01) | W-2 | A3/B2 = 80/20 |
| 45 | (45) | IB-10 (0.2) | z22 (0.1) z23 (0.1) | — | TPI (0.03) | W-3 | A2/B1 = 90/10 |
| 46 | (46) | IB-11 (0.3) | z21 (0.5) | — | DIA (0.01) | W-3 | A4/B1 = 90/10 |
| 47 | (47) | IB-12 (0.5) | z21 (1) | — | DIA (0.007) | W-4 | A1/B1 = 50/50 |
| 48 | (48) | IB-15 (0.3) | z11 (0.01) | — | DNB (0.02) | W-4 | A1/B1 = 90/10 |
| 49 | (49) | IB-16 (0.4) | z6 (0.2) | — | TPI (0.03) | W-1 | A5/B2 = 90/10 |
| 50 | (50) | IA-1 (0.5) | z6 (0.1) | — | TPI (0.02) | W-1 | A1/B1 = 95/5 |
| 51 | (51) | IA-2 (0.3) | z3 (0.15) | — | TOA (0.03) | W-2 | A1/B1 = 90/10 |
| 52 | (52) | IA-3 (0.3) | z34 (0.15) | — | TPI (0.03) | W-2 | A1/B1 = 95/5 |
| 53 | (53) | IA-4 (0.2) | z33 (0.1) z31 (0.2) | — | TPI (0.03) | W-3 | A1/B1 = 95/5 |
| 54 | (54) | IA-5 (0.4) | z36 (0.2) | — | DNB (0.02) | W-3 | A1/B1 = 95/5 |
| 55 | (55) | IA-6 (0.5) | z22 (0.2) | — | TPI (0.03) | W-4 | A1/B1 = 80/20 |
| 56 | (56) | IA-7 (0.3) | z26 (0.1) z33 (0.1) | — | DIA (0.01) | W-4 | A1/B1 = 80/20 |
| 57 | (57) | IA-8 (0.7) | z40 (0.1) | — | TPI (0.03) | W-4 | A1/B1 = 95/5 |
| 58 | (58) | IA-9 (0.15) | z37 (0.9) | — | DCMA (0.01) | W-4 | A1/B1 = 95/5 |
| 59 | (59) | IA-10 (0.2) | z33 (0.2) | — | TPI (0.02) | W-4 | A1/B1 = 95/5 |
| 60 | (60) | IA-11 (0.5) | z33 (0.1) | — | TPI (0.03) | W-4 | A1/B1 = 95/5 |
| 61 | (61) | IA-12 (0.3) | z1 (0.1) | — | DBN (0.02) | W-1 | A1/B1 = 95/5 |
| 62 | (62) | IA-16 (0.7) | z12 (0.05) | — | TPI (0.03) | W-1 | A1/B1 = 80/20 |
| 63 | (63) | IA-21 (0.15) | z14 (0.15) | — | TPSA (0.02) | W-2 | A1/B1 = 90/10 |
| 64 | (64) | IA-22 (0.3) | z13 (0.1) | — | HEP (0.01) | W-2 | A3/B2 = 80/20 |
| 65 | (65) | IA-23 (0.5) | z33 (0.05) | — | TPI (0.03) | W-3 | A2/B1 = 90/10 |
| 66 | (66) | IA-24 (0.7) | z33 (0.1) | — | DIA (0.01) | W-3 | A4/B1 = 90/10 |

TABLES 5 TO 7-continued

| Example | Resin (10 g) | Acid Generator of Invention (g) | Other Acid Generator (g) | Other Additive (g) | Basic Compound (g) | Surface Active Agent (0.03 g) | Solvent (weight ratio) |
|---|---|---|---|---|---|---|---|
| Comparative Example 1 | (1) | — | z31 (0.5) | — | DBN (0.02) | W-1 | A1 = 100 |
| Comparative Example 2 | (1) | — | z31 (0.5) | — | TPI (0.03) | W-3 | A1/B1 = 95/5 |
| Comparative Example 3 | (1) | — | z2 (0.5) | — | DBN (0.02) | W-1 | A1 = 100 |

Explanation of the abbreviations in Tables 5 to 7:
DBN: 1,5-Diazabicyclo[4.3.0]non-5-ene
TPI: 2,4,5-Triphenylimidazole
TPSA: Triphenylsulfonium acetate
HEP: N-Hydroxyethylpiperidine
DIA: 2,6-Diisopropylaniline
DCMA: Dicyclohexylmethylamine
TOA: Trioctylamine
LCB: t-butyl lithocholate
W-1: Megafax F176 (manufactured by Dainippon Ink and Chemicals, Inc.) (fluorine-base)
W-2: Megafac R08 (manufactured by Dainippon Ink and Chemicals, Inc.) (fluorine- and silicon-base)
W-3: Polysiloxane Polymer KP-341 (manufactured by Shin-Etsu Chemical Co., Ltd.) (silicon-base)
W-4: Troysol S-366 (manufactured by Troy Chemical Co., Ltd.)
A1: Propylene glycol methyl ether acetate
A2: 2-Heptanone
A3: Ethyl ethoxypropionate
A4: γ-Butyrolactone
A5: Cyclohexanone
B1: Propylene glycol methyl ether
B2: Ethyl lactate <Evaluation of Pattern>

(1) Evaluation of Sensitivity

On a silicon substrate which had been subjected to a hexamethyldisilazane treatment was uniformly coated a reflection preventing film (DUV-42 manufactured by Brewer Science, Inc.) at a thickness of 600 angstroms by a spin coater, dried at 100° C. for 90 seconds on a hot plate, and further dried by heating at 190° C. for 240 seconds. Thereafter, each of the photosensitive compositions described above was coated thereon by a spin coater and dried at 120° C. for 90 seconds to form a resist film having a thickness of 0.03 μm. The resist film was subjected to exposure using an ArF excimer laser stepper (manufacture by ISI Co., Ltd.; NA=0.6) through a mask and heated at 120° C. for 90 seconds on a hot plate immediately after the exposure. Then the resist film was developed with a 2.38% by weight aqueous tetramethylammonium hydroxide solution at 23° C. for 60 seconds, rinsed with pure water for 30 seconds, and dried to obtain a resist line pattern. The sensitivity was expressed by an exposure amount necessary for reproducing a line and space (1/1) pattern of 0.15 μm.

(2) Evaluation of DOF (Defocus Latitude)

On a silicon substrate which had been subjected to a hexamethyldisilazane treatment was uniformly coated a reflection preventing film (ARC 25 manufactured by Brewer Science, Inc.) at a thickness of 600 angstroms by a spin coater, dried at 100° C. for 90 seconds on a hot plate, and further dried by heating at 190° C. for 240 seconds. Thereafter, each of the photosensitive compositions described above was coated thereon by a spin coater and dried at 140° C. for 90 seconds to form a resist film having a thickness of 0.40 μm. The resist film was subjected to exposure using an ArF excimer laser stepper (manufacture by ISI Co., Ltd.; NA=0.6 (sigma=0.75; 2/3 annular illumination)) through a mask and heated at 140° C. for 90 seconds on a hot plate immediately after the exposure. Then the resist film was developed with a 2.38% by weight aqueous tetramethylammonium hydroxide solution at 23° C. for 60 seconds, rinsed with pure water for 30 seconds, and dried to obtain a resist line pattern. The defocus latitude of 0.13 μm in an exposure amount sufficient for reproducing a line and space (1/1) pattern of 0.13 PM was observed.

(3) Evaluation of Sidelobe Margin

On a silicon substrate which had been subjected to a hexamethyldisilazane treatment was uniformly coated a reflection preventing film (ARC 25 manufactured by Brewer Science, Inc.) at a thickness of 600 angstroms by a spin coater, dried at 100° C. for 90 seconds on a hot plate, and further dried by heating at 190° C. for 240 seconds. Thereafter each of the photosensitive compositions described above was coated thereon by a spin coater and dried at 140° C. for 90 seconds to form a resist film having a thickness of 0.40 μm. The resist film was subjected to exposure using an ArF excimer laser stepper (manufacture by ISI Co., Ltd.; NA=0.6) using a halftone phase shift mask having transmittance of 6% and heated at 140° C. for 90 seconds on a hot plate immediately after the exposure. Then the resist film was developed with a 2.38% by weight aqueous tetramethylammonium hydroxide solution at 23° C. for 60 seconds, rinsed with pure water for 30 seconds, and dried to obtain a contact hole pattern.

Taking an exposure amount sufficient for opening a contact hole of 0.18 μm in size through a mask size of 0.20 μm at a duty ratio of 1:2 as the optimum exposure amount Eop, and from a relation thereof to an exposure amount Es at which sidelobe appears upon overexposure in an amount greater than the optimum exposure amount in accordance with the equation described below, a sidelobe margin was determined. The greater the value, the higher the sidelobe resistance.

$$\text{Sidelobe Margin } (\%) = [(E_s - E_{op})/E_{op}] \times 100$$

TABLES 8 TO 10

| Example | Sensitivity (mJ/cm²) | DOF (μm) | Sidelobe Margin (%) |
|---|---|---|---|
| 1 | 12.5 | 0.80 | 30.1 |
| 2 | 14.0 | 0.90 | 33.5 |
| 3 | 16.5 | 0.70 | 28.5 |
| 4 | 15.5 | 0.75 | 29.1 |
| 5 | 17.5 | 0.85 | 28.6 |
| 6 | 14.5 | 0.80 | 30.4 |
| 7 | 13.0 | 0.90 | 32.8 |
| 8 | 18.5 | 0.75 | 26.9 |
| 9 | 14.5 | 0.85 | 28.7 |
| 10 | 15.0 | 0.85 | 31.2 |
| 11 | 15.5 | 0.80 | 30.6 |
| 12 | 15.5 | 0.75 | 27.5 |
| 13 | 15.0 | 0.85 | 32.6 |
| 14 | 17.0 | 0.80 | 31.4 |
| 15 | 13.0 | 0.85 | 32.1 |
| 16 | 12.0 | 0.90 | 31.9 |
| 17 | 14.5 | 0.80 | 29.4 |
| 18 | 18.0 | 0.75 | 28.4 |
| 19 | 12.0 | 0.85 | 33.1 |
| 20 | 12.5 | 0.90 | 32.4 |
| 21 | 14.5 | 0.80 | 30.2 |
| 22 | 14.0 | 0.85 | 31.3 |
| 23 | 15.0 | 0.85 | 28.6 |
| 24 | 17.5 | 0.80 | 27.3 |
| 25 | 15.5 | 0.85 | 33.1 |
| 26 | 15.5 | 0.85 | 31.4 |
| 27 | 17.5 | 0.80 | 30.3 |
| 28 | 15.0 | 0.80 | 32.4 |
| 29 | 15.8 | 0.85 | 30.7 |
| 30 | 18.5 | 0.75 | 26.7 |
| 31 | 17.5 | 0.70 | 25.4 |
| 32 | 19.0 | 0.85 | 33.5 |
| 33 | 14.5 | 0.85 | 32.6 |
| 34 | 12.0 | 0.90 | 34.8 |
| 35 | 13.0 | 0.80 | 31.5 |
| 36 | 13.0 | 0.85 | 32.4 |
| 37 | 14.0 | 0.90 | 33.8 |
| 38 | 15.0 | 0.80 | 30.1 |
| 39 | 16.5 | 0.75 | 27.5 |
| 40 | 15.5 | 0.85 | 29.4 |
| 41 | 14.5 | 0.85 | 28.5 |
| 42 | 16.0 | 0.80 | 29.4 |
| 43 | 16.0 | 0.80 | 30.2 |
| 44 | 17.5 | 0.75 | 31.6 |
| 45 | 18.0 | 0.80 | 29.4 |
| 46 | 15.0 | 0.85 | 32.4 |
| 47 | 14.0 | 0.90 | 33.5 |
| 48 | 13.5 | 0.90 | 32.9 |
| 49 | 16.0 | 0.85 | 31.8 |
| 50 | 16.5 | 0.80 | 30.9 |
| 51 | 18.5 | 0.75 | 30.1 |
| 52 | 17.0 | 0.85 | 31.5 |
| 53 | 17.5 | 0.80 | 30.4 |
| 54 | 15.5 | 0.80 | 29.5 |
| 55 | 15.0 | 0.85 | 32.1 |
| 56 | 12.0 | 0.90 | 31.5 |
| 57 | 15.0 | 0.70 | 28.4 |
| 58 | 15.5 | 0.85 | 29.7 |
| 59 | 16.0 | 0.80 | 30.4 |
| 60 | 11.5 | 0.90 | 32.5 |
| 61 | 14.0 | 0.80 | 27.6 |
| 62 | 15.0 | 0.85 | 28.7 |
| 63 | 13.0 | 0.85 | 30.6 |
| 64 | 16.5 | 0.75 | 28.9 |
| 65 | 14.5 | 0.80 | 31.4 |
| 66 | 14.0 | 0.85 | 32.5 |
| Comparative Example 1 | 25.0 | 0.40 | 13.0 |
| Comparative Example 2 | 30.0 | 0.30 | 15.0 |
| Comparative Example 3 | 15.0 | 0.13 μm was not resolved | 0 |

It is apparent from the results shown in Tables 8 to 10 that the photosensitive compositions of Examples 1 to 66 have high sensitivity, wide defocus latitude and excellent sidelobe resistance. On the contrary, the photosensitive compositions of Comparative Examples 1 to 3 are inferior in the sensitivity, defocus latitude and sidelobe resistance as compared with the photosensitive compositions of Examples 1 to 66.

EXAMPLES 101 TO 166 AND COMPARATIVE EXAMPLES 101 TO 102

<Preparation of Resist>

In each of Examples 101 to 166 and Comparative Examples 101 to 102, the components as shown in Tables 11 to 13 below were dissolved to prepare a solution having a solid concentration of 12% by weight. The resulting solution was filtered through a Teflon filter having a pore size of 0.1 μm, whereby a positive photosensitive composition was prepared. The photosensitive composition was evaluated by the methods described below. The results obtained are shown in Tables 14 to 16 below.

TABLES 11 TO 13

| Example | Resin (10 g) | Acid Generator of Invention (g) | Other Acid Generator (g) | Other Additive (g) | Basic Compound (g) | Surface Active Agent (0.03 g) | Solvent (weight ratio) |
|---|---|---|---|---|---|---|---|
| 101 | (1) | IA-1 (0.5) | — | — | TBA (0.02) | W-1 | A1/B1 = 95/5 |
| 102 | (2) | IA-2 (0.3) | — | — | TMA (0.03) | W-1 | A1 = 100 |
| 103 | (3) | IA-3 (0.3) | — | — | TOA (0.02) | W-2 | A1/B1 = 90/10 |
| 104 | (4) | IA-4 (0.2) | z6 (0.2) | — | TETA (0.01) | W-2 | A3/B2 = 80/20 |
| 105 | (5) | IA-5 (0.4) | z3 (0.015) | — | TMMEA (0.03) | W-3 | A2/B1 = 90/10 |
| 106 | (6) | IA-6 (0.5) | z7 (0.2) | — | TMEEA (0.01) | W-3 | A4/B1 = 90/10 |
| 107 | (7) | IA-7 (0.3) | z8 (0.1) | — | TMEMEA (0.007) | W-4 | A1/B1 = 50/50 |
| 108 | (8) | IA-8 (0.7) | z1 (0.05) | — | DIA (0.02) | W-4 | A1/B1 = 90/10 |
| 109 | (9) | IA-9 (0.15) | z11 (0.02) z33 (0.2) | LCB (1) | TBA (0.03) | W-1 | A5/B2 = 90/10 |
| 110 | (10) | IA-10 (0.2) | z30 (0.3) | — | THA (0.02) | W-1 | A1/B1 = 95/5 |

TABLES 11 TO 13-continued

| Example | Resin (10 g) | Acid Generator of Invention (g) | Other Acid Generator (g) | Other Additive (g) | Basic Compound (g) | Surface Active Agent (0.03 g) | Solvent (weight ratio) |
|---|---|---|---|---|---|---|---|
| 111 | (11) | IA-11 (0.5) | z2 (0.1) | — | TOA (0.03) | W-2 | A1/B1 = 90/10 |
| 112 | (12) | IA-12 (0.3) | z5 (0.05) | — | TETA (0.03) | W-2 | A1/B1 = 95/5 |
| 113 | (13) | IB-1 (0.3) | z36 (0.7) | — | TMMEA (0.03) | W-3 | A1/B1 = 95/5 |
| 114 | (14) | IB-2 (0.4) | z35 (0.2) | — | TMEEA (0.02) | W-3 | A1/B1 = 95/5 |
| 115 | (15) | IB-3 (0.3) | z38 (0.8) | LCB (1) | TMEMEA (0.03) | W-4 | A1/B1 = 80/20 |
| 116 | (16) | IA-13 (0.4) | z39 (0.2) | — | DIA (0.01) | W-4 | A1/B1 = 80/20 |
| 117 | (17) | IA-14 (0.3) | z37 (0.4) | — | TBA (0.03) | W-4 | A1/B1 = 95/5 |
| 118 | (18) | IA-15 (0.2) | z34 (0.15) | — | THA (0.01) | W-4 | A1/B1 = 95/5 |
| 119 | (19) | IA-16 (0.3) | z1 (0.1) | — | TOA (0.02) | W-4 | A1/B1 = 95/5 |
| 120 | (20) | IA-17 (0.4) | z14 (0.2) | — | TETA (0.03) | W-4 | A1/B1 = 95/5 |
| 121 | (21) | IA-18 (0.5) | z33 (0.1) | — | TMMEA (0.02) | W-1 | A1/B1 = 95/5 |
| 122 | (22) | IA-19 (0.3) | z31 (0.15) | — | TMEEA (0.03) | W-1 | A1/B1 = 80/20 |
| 123 | (23) | IA-20 (0.3) | z35 (0.3) | — | TMEMEA (0.02) | W-2 | A1/B1 = 90/10 |
| 124 | (24) | IA-21 (0.15) | z8 (0.2) | — | DIA (0.01) | W-2 | A3/B2 = 80/20 |
| 125 | (25) | IA-22 (0.3) | z22 (0.2) | — | TBA (0.03) | W-3 | A2/B1 = 90/10 |
| 126 | (26) | IA-23 (0.5) | z29 (0.1) | — | THA (0.01) | W-3 | A4/B1 = 90/10 |
| 127 | (27) | IA-24 (0.4) | z26 (0.2) | — | TOA (0.007) | W-4 | A1/B1 = 50/50 |
| 128 | (28) | IA-25 (0.3) | z21 (0.3) | — | TETA (0.02) | W-4 | A1/B1 = 90/10 |
| 129 | (29) | IA-26 (0.1) | z23 (0.3) | LCB (1) | TMMEA (0.03) | W-1 | A5/B2 = 90/10 |
| 130 | (30) | IA-27 (0.5) | z16 (0.2) | — | TMEEA (0.02) | W-1 | A1/B1 = 95/5 |
| 131 | (31) | IA-28 (0.7) | z20 (0.8) | — | TMEMEA (0.03) | W-2 | A1/B1 = 90/10 |
| 132 | (32) | IA-29 (0.3) | z2 (0.1) | — | DIA (0.03) | W-2 | A1/B1 = 95/5 |
| 133 | (33) | IA-30 (0.15) | z1 (0.1) | — | TBA (0.03) | W-3 | A1/B1 = 95/5 |
| 134 | (34) | IA-33 (0.4) | z4 (0.05) | — | TBA (0.02) | W-3 | A1/B2 = 95/5 |
| 135 | (35) | IA-34 (0.3) | z8 (0.1) | — | TOA (0.03) | W-4 | A1/B1 = 80/20 |
| 136 | (36) | IA-41 (0.2) | z5 (0.05) | — | TETA (0.01) | W-4 | A1/B1 = 80/20 |
| 137 | (37) | IA-42 (0.3) | z39 (0.5) | — | TMMEA (0.03) | W-4 | A1/B1 = 95/5 |
| 138 | (38) | IA-48 (0.15) | z33 (0.2) | — | TMEEA (0.01) | W-4 | A1/B1 = 95/5 |
| 139 | (39) | IB-4 (0.5) | z33 (0.2) | — | TMEMEA (0.02) | W-4 | A1/B1 = 95/5 |
| 140 | (40) | IB-5 (0.4) | z31 (0.3) | LCB (1) | DIA (0.03) | W-4 | A1/B1 = 95/5 |
| 141 | (41) | IB-6 (0.25) | z30 (0.3) | — | TBA (0.02) | W-1 | A1/B1 = 95/5 |
| 142 | (42) | IB-7 (0.3) | z16 (0.02) | — | THA (0.03) | W-1 | A1/B1 = 80/20 |
| 143 | (43) | IB-8 (0.1) IA-1 (0.5) | z12 (0.01) | — | TOA (0.02) | W-2 | A1/B1 = 90/10 |
| 144 | (44) | IB-9 (0.7) | z26 (0.3) | — | TETA (0.01) | W-2 | A3/B2 = 80/20 |
| 145 | (45) | IB-10 (0.2) | z22 (0.1) z33 (0.1) | — | TMMEA (0.03) | W-3 | A2/B1 = 90/10 |
| 146 | (46) | IB-11 (0.3) | z21 (0.5) | — | TMEEA (0.01) | W-3 | A4/B1 = 90/10 |
| 147 | (47) | IB-12 (0.5) | z21 (1) | — | TMEMEA | W-4 | A1/B1 = 50/50 |
| 148 | (48) | IB-15 (0.3) | z11 (0.01) | — | DIA (0.02) | W-4 | A1/B1 = 90/10 |
| 149 | (49) | IB-16 (0.4) | z6 (0.2) | — | TBA (0.03) | W-1 | A5/B2 = 90/10 |
| 150 | (50) | IA-1 (0.5) | z6 (0.1) | — | THA (0.02) | W-1 | A1/B1 = 95/5 |
| 151 | (51) | IA-2 (0.3) | z3 (0.15) | — | TOA (0.03) | W-2 | A1/B1 = 90/10 |

TABLES 11 TO 13-continued

| Example | Resin (10 g) | Acid Generator of Invention (g) | Other Acid Generator (g) | Other Additive (g) | Basic Compound (g) | Surface Active Agent (0.03 g) | Solvent (weight ratio) |
|---|---|---|---|---|---|---|---|
| 152 | (52) | IA-3 (0.3) | z34 (0.15) | — | TETA (0.03) | W-2 | A1/B1 = 95/5 |
| 153 | (53) | IA-4 (0.2) | z33 (0.1) z31 (0.2) | — | TMMEA (0.03) | W-3 | A1/B1 = 95/5 |
| 154 | (54) | IA-5 (0.4) | z36 (0.2) | — | TMEEA (0.02) | W-3 | A1/B1 = 95/5 |
| 155 | (55) | IA-6 (0.5) | z22 (0.2) | — | TMEMEA (0.03) | W-4 | A1/B1 = 80/20 |
| 156 | (56) | IA-7 (0.3) | z26 (0.1) z33 (0.1) | — | DIA (0.01) | W-4 | A1/B1 = 80/20 |
| 157 | (57) | IA-8 (0.7) | z40 (0.1) | — | TBA (0.03) | W-4 | A1/B1 = 95/5 |
| 158 | (58) | IA-9 (0.15) | z37 (0.9) | — | THA (0.01) | W-4 | A1/B1 = 95/5 |
| 159 | (59) | IA-10 (0.2) | z33 (0.2) | — | TOA (0.02) | W-4 | A1/B1 = 95/5 |
| 160 | (60) | IA-11 (0.5) | z33 (0.1) | — | TETA (0.03) | W-4 | A1/B1 = 95/5 |
| 161 | (61) | IA-12 (0.3) | z1 (0.1) | — | TMMEA (0.02) | W-1 | A1/B1 = 95/5 |
| 162 | (62) | IA-16 (0.7) | z12 (0.05) | — | TMEEA (0.03) | W-1 | A1/B1 = 80/20 |
| 163 | (63) | IA-21 (0.15) | z14 (0.15) | — | OA (0.02) | W-2 | A1/B1 = 90/10 |
| 164 | (64) | IA-22 (0.3) | z13 (0.1) | — | DOA (0.01) | W-2 | A3/B2 = 80/20 |
| 165 | (65) | IA-23 (0.5) | z33 (0.05) | — | MEEA (0.03) | W-3 | A2/B1 = 90/10 |
| 166 | (66) | IA-24 (0.7) | z33 (0.1) | — | BMEEA (0.01) | W-3 | A4/B1 = 90/10 |
| Comparative Example 101 | (1) | — | z36 (0.7) | — | Aniline (0.02) | W-1 | A1/B1 = 95/5 |
| Comparative Example 102 | (1) | — | z2 (0.5) | — | Dimethyl-aminopyridine (0.02) | W-1 | A1/B1 = 95/5 |

Explanation of the abbreviations in Tables 11 to 13:
OA: Octylamine
DOA: Dioctylamine
TBA: Tributylamine
THA: Trihexylamine
TOA: Trioctylamine
TETA: Triethanolamine
MEEA: Methoxyethoxyethylamine
BMEEA: Bis(methoxyethoxyethyl)amine
TMMEA: Tris(methoxymethoxyethyl)amine
TMEEA: Tris(methoxyethoxyethyl)amine
TMEMEA: Tris(methoxyethoxymethoxyethyl)amine
DIA: 2,6-Diisopropylaniline
LCB: t-Butyl lithocholate
W-1: Megafax F176 (manufactured by Dainippon Ink and Chemicals, Inc.) (fluorine-base)
W-2: Megafac R08 (manufactured by Dainippon Ink and Chemicals, Inc.) (fluorine- and silicon-base)
W-3: Polysiloxane Polymer KP-341 (manufactured by Shin-Etsu Chemical Co., Ltd.) (silicon-base)
W-4: Troysol S-366 (manufactured by Troy Chemical Co., Ltd.)
A1: Propylene glycol methyl ether acetate
A2: 2-Heptanone
A3: Ethyl ethoxypropionate
A4: γ-Butyrolactone
A5: Cyclohexanone
B1: Propylene glycol methyl ether
B2: Ethyl lactate <Evaluation of Pattern>
(1) Evaluation of Sensitivity
On a silicon substrate which had been subjected to a hexamethyldisilazane treatment was uniformly coated a reflection preventing film (DUV-42 manufactured by Brewer Science, Inc.) at a thickness of 600 angstroms by a spin coater, dried at 100° C. for 90 seconds on a hot plate, and further dried by heating at 190° C. for 240 seconds. Thereafter, each of the photosensitive compositions described above was coated thereon by a spin coater and dried at 120° C. for 90 seconds to form a resist film having a thickness of 0.30 μm. The resist film was subjected to exposure using an ArF excimer laser stepper (manufacture by ISI Co., Ltd.; NA=0.6) through a mask and heated at 120° C. for 90 seconds on a hot plate immediately after the exposure. Then the resist film was developed with a 2.38% by weight aqueous tetramethylammonium hydroxide solution at 23° C. for 60 seconds, rinsed with pure water for 30 seconds, and dried to obtain a resist line pattern. The sensitivity was expressed by an exposure amount necessary for reproducing a line and space (1/1) pattern of 0.15 μm.

(2) Evaluation of Edge Roughness
The evaluation of edge roughness was conducted by measuring edge roughness of isolated pattern using a critical dimension scanning electron microscope (CD-SEM).

Specifically, a distance from the standard line where the edge should be present to the edge of the line pattern was measured in 50 points in the area of a length of 5 μm of the line pattern using a CD-SEM (S-8840, manufactured by Hitachi, Ltd.), standard deviation was determined and 3a was calculated. The smaller the value, the better the quality.

TABLES 14 TO 16

| Example | Sensitivity (mJ/cm$^2$) | Edge Roughness (nm) |
| --- | --- | --- |
| 101 | 32 | 4 |
| 102 | 34 | 4 |
| 103 | 29 | 3 |
| 104 | 31 | 4 |
| 105 | 28 | 5 |
| 106 | 33 | 4 |
| 107 | 31 | 4 |
| 108 | 29 | 3 |
| 109 | 30 | 4 |
| 110 | 29 | 4 |
| 111 | 31 | 5 |
| 112 | 28 | 4 |
| 113 | 33 | 4 |
| 114 | 31 | 4 |
| 115 | 29 | 3 |
| 116 | 32 | 4 |
| 117 | 35 | 6 |
| 118 | 31 | 5 |
| 119 | 29 | 4 |
| 120 | 28 | 4 |
| 121 | 32 | 3 |
| 122 | 34 | 4 |
| 123 | 29 | 4 |
| 124 | 31 | 4 |
| 125 | 28 | 4 |
| 126 | 32 | 5 |
| 127 | 31 | 5 |
| 128 | 31 | 4 |
| 129 | 29 | 4 |
| 130 | 30 | 5 |
| 131 | 29 | 4 |
| 132 | 33 | 4 |
| 133 | 31 | 5 |
| 134 | 29 | 4 |
| 135 | 31 | 5 |
| 136 | 29 | 4 |
| 137 | 33 | 4 |
| 138 | 28 | 4 |
| 139 | 31 | 6 |
| 140 | 29 | 4 |
| 141 | 30 | 4 |
| 142 | 33 | 5 |
| 143 | 29 | 4 |
| 144 | 32 | 4 |
| 145 | 29 | 4 |
| 146 | 32 | 4 |
| 147 | 20 | 3 |
| 148 | 31 | 4 |
| 149 | 28 | 4 |
| 150 | 31 | 4 |
| 151 | 33 | 5 |
| 152 | 29 | 4 |
| 153 | 31 | 4 |
| 154 | 29 | 4 |
| 155 | 32 | 5 |
| 156 | 31 | 4 |
| 157 | 33 | 5 |
| 158 | 29 | 3 |
| 159 | 30 | 4 |
| 160 | 32 | 4 |
| 161 | 29 | 4 |
| 162 | 31 | 4 |
| 163 | 29 | 4 |
| 164 | 30 | 4 |
| 165 | 29 | 4 |
| 166 | 31 | 4 |
| Comparative Example 101 | 39 | 19 |
| Comparative Example 102 | 41 | 21 |

It is apparent from the results shown in Tables 14 to 16 that the photosensitive compositions of Examples 101 to 166 have high sensitivity and excellent edge roughness. On the contrary, the photosensitive compositions of Comparative Examples 101 to 102 are inferior in the sensitivity and edge roughness as compared with the photosensitive compositions of Examples 101 to 166.

<Synthesis Example of Resin>

SYNTHESIS EXAMPLE 5

Synthesis of Resin (71) (Acryl Type)

2-Adamantyl-2-propyl methacrylate, butyrolactone methacrylate and a monomer corresponding to a repeating unit of formula (AI) in a molar ratio of 48/22/30 were dissolved in a mixed solvent of methyl ethyl ketone and tetrahydrofuran (9/1 in volume) to prepare 100 ml of a solution having a solid concentration of 35% by weight. To the solution were added 2% by mole of V-65 manufactured by Wako Pure Chemical Industries, Ltd. and 2% by mole of mercaptoethanol, and the solution was added dropwise to 10 ml of methyl ethyl ketone heated at 65° C. under a nitrogen gas stream over a period of 4 hours. After the completion of the addition, the reaction solution was stirred for 4 hours. After the completion of the reaction, the reaction solution was cooled to room temperature and poured into 1.2 liters of a mixed solvent of methanol and isopropyl alcohol (3/1 in volume) to crystallize, and the white powder deposited was collected by filtration and subjected to a slurry treatment with one liter of methanol, thereby recovering Resin (71).

A monomer unit composition ratio of the resin determined by NMR was 49/22/29. A weight average molecular weight thereof measured by GPC method and calculated in terms of standard polystyrene was 8,900.

Resins (72) to (80) were synthesized in a similar manner to Synthesis Example (5) respectively. The monomer unit composition ratio and weight average molecular weight of each of Resins (72) to (80) are shown in Table 17 below. In Table 17, Repeating Units 1, 2 and 3 and Repeating Unit of Formula (AI) denote the repeating units of Resins (72) to (80) shown below in order from left to right, respectively.

TABLE 17

| Resin | Repeating Unit 1 (mol %) | Repeating Unit 2 (mol %) | Repeating Unit 3 (mol %) | Repeating Unit of Formula (AI) (mol %) | Weight Average Molecular Weight |
| --- | --- | --- | --- | --- | --- |
| 72 | 51 | 21 | — | 28 | 8,300 |
| 73 | 40 | 10 | — | 18/8/24 | 7,400 |
| 74 | 47 | 15 | 12 | 26 | 8,300 |
| 75 | 51 | 11 | 25 | 13 | 7,900 |
| 76 | 49 | 9 | 20 | 22 | 8,800 |
| 77 | 51 | 20 | 4 | 25 | 8,100 |
| 78 | 39 | 15 | 10 | 36 | 8,200 |
| 79 | 46 | 28 | 8 | 18 | 8,600 |
| 80 | 48 | 20 | — | 32 | 7,200 |

Structures of Resins (71) to (80) are shown below.
(71)
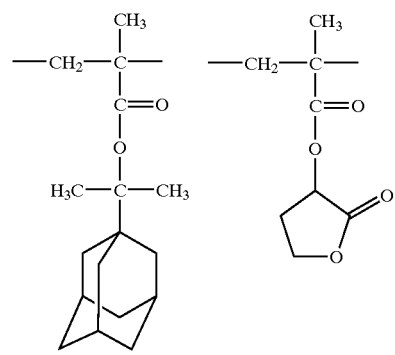
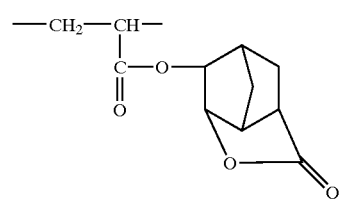
(72)
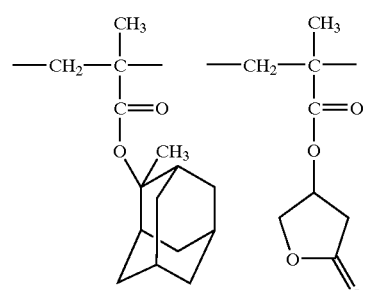
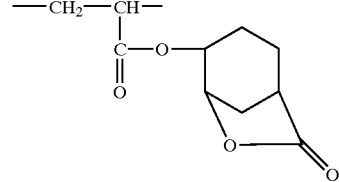
(73)
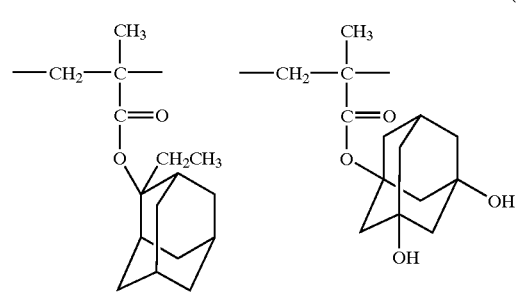
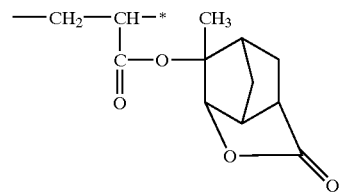
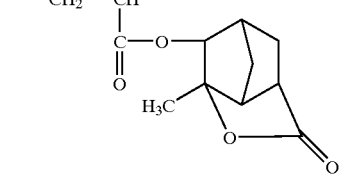
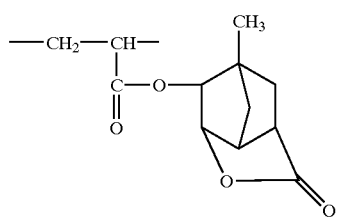
(74)
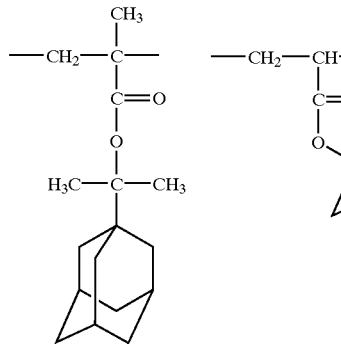
(75)
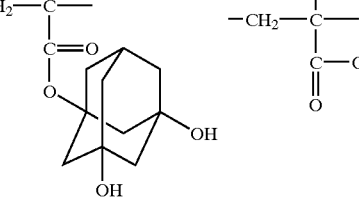
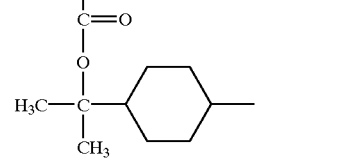
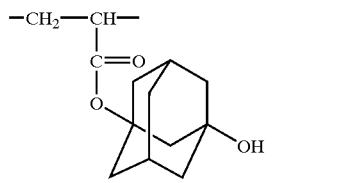

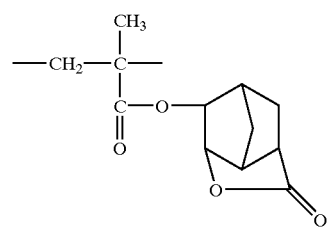
(76)
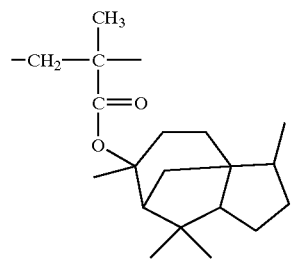
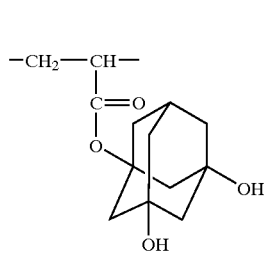
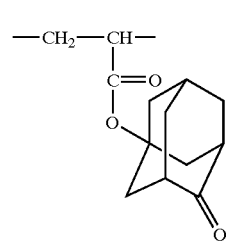
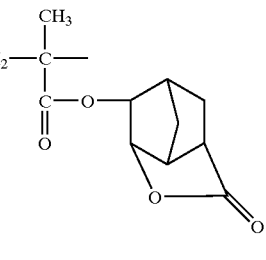
(77)
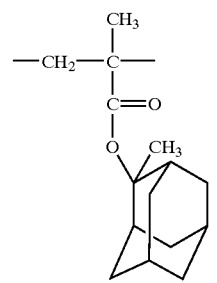
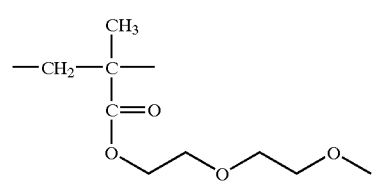
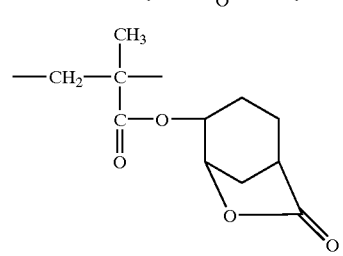
(78)
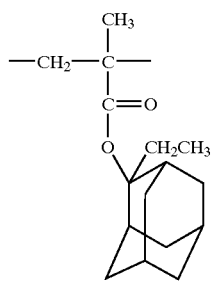
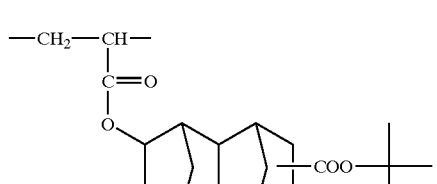
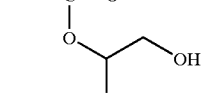
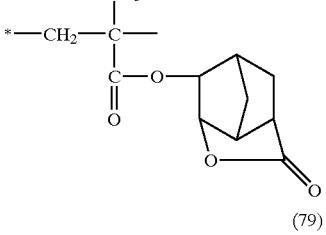
(79)
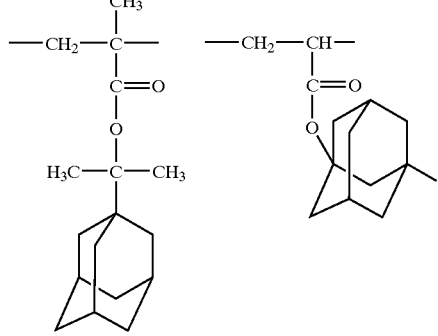
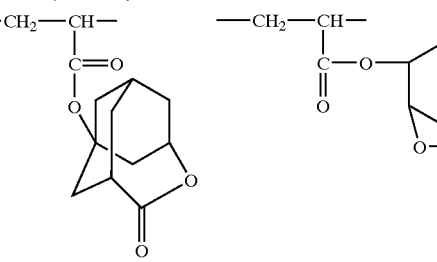
(80)
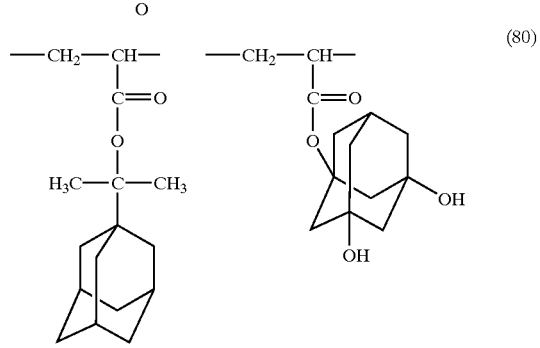

-continued

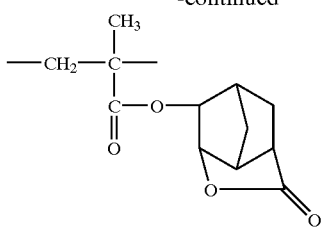

EXAMPLES 201 TO 220 AND COMPARATIVE EXAMPLES 201 AND 202

<Preparation of Positive Resist Composition>

In each of Examples 201 to 220 and Comparative Examples 201 and 202, the components of 2 g of a resin, an acid generator in an amount shown in Table 18 below, 5 mg of a basic compound and 10 mg of a surface active agent as shown in Table 18 below were dissolved in a, solvent mixture of propylene glycol monomethyl ether acetate and γ-butyrolactone (9/1 in volume) to form a solution having a solid content of 14% by weight. The resulting solution was filtered through a microfilter having a pore size of 0.1 μm, whereby a positive photoresist composition was prepared.

In Comparative Example 1, a resin (hereinafter referred to as Resin (90)) having a structure shown below used in Example 6 of JP-A-2001-109154 was used. Similarly, in Comparative Example 2, a resin (hereinafter referred to as Resin (98)) having a structure shown below used in Example 7 of JP-A-2001-109154 was used.

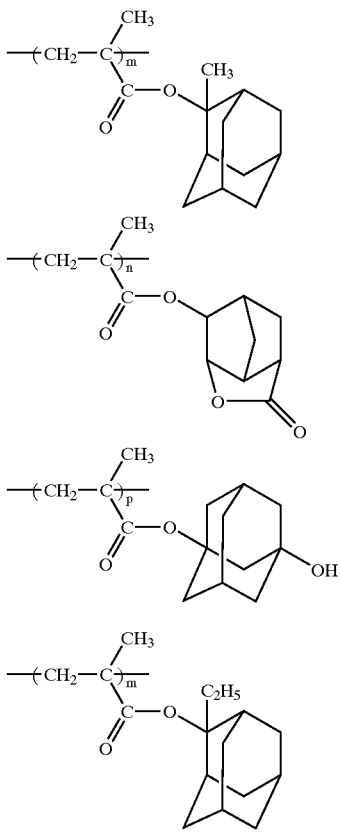

-continued

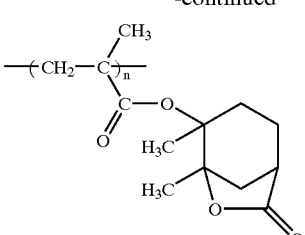

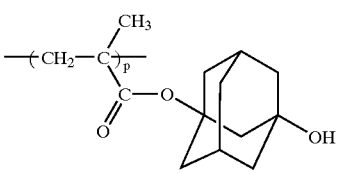

TABLE 18

| Example | Resin (2 g) | Acid Generator (mg) | Basic Compound (5 mg) | Surface Active Agent (10 mg) |
|---|---|---|---|---|
| 201 | 71 | IA-1 (25) PAG4-39 (10) | 4 | W-1 |
| 202 | 72 | IA-3 (60) | 5 | W-1 |
| 203 | 73 | IA-6 (55) | 6 | W-2 |
| 204 | 74 | IA-8 (20) PAG4-52 (12) | 1 | W-3 |
| 205 | 75 | IA-16 (15) PAG4-48 (15) | 2 | W-3 |
| 206 | 76 | IA-18 (58) | 3 | W-4 |
| 207 | 77 | IA-36 (5) PAG4-6 (36) | 3 | W-5 |
| 208 | 78 | IA-44 (3) PAG4-50 (40) | 4 | W-5 |
| 209 | 79 | IA-41 (4) PAG4-52 (38) | 5 | W-5 |
| 210 | 80 | IA-37 (3) PAG4-48 (40) PAG4-77 (10) | 4 | W-5 |
| 211 | 71 | IB-1 (10) PAG4-36 (15) | 6 | W-3 |
| 212 | 72 | IB-6 (34) | 6 | W-1 |
| 213 | 73 | IB-10 (36) | 6 | W-5 |
| 214 | 74 | IB-18 (6) PAG4-45 (40) | 5/6 = 1/1 (weight ratio) | W-5 |
| 215 | 75 | IA-1 (50) IA-35 (3) | 4 | W-1 |
| 216 | 76 | IA-2 (10) PAG4-50 (28) IA-38 (3) | 3 | W-3 |
| 217 | 77 | IA-6 (20) PAG4-6 (10) PAG6-27 (5) | 2 | W-3 |
| 218 | 78 | IA-4 (20) PAG4-17 (20) | 3 | W-2 |
| 219 | 79 | IA-1 (10) PAG4-48 (25) PAG4-80 (20) | 3 | W-5 |
| 220 | 80 | IA-3 (30) PAG4-40 (10) | 2 | W-5 |
| Comparative Example 201 | Resin (90) (JP-A-2001-109154) | PAG3-21 (40) | 1 | W-1 |

TABLE 18

| Example | Exposure Margin | Number of Development Defects |
|---|---|---|
| 201 | 7% | 20 |
| 202 | 9% | 30 |
| 203 | 10% | 35 |
| 204 | 7% | 22 |
| 205 | 8% | 26 |
| 206 | 12% | 40 |
| 207 | 10% | 48 |
| 208 | 10% | 33 |
| 209 | 6% | 19 |
| 210 | 5% | 13 |
| 211 | 7% | 21 |
| 212 | 10% | 32 |
| 213 | 11% | 37 |
| 214 | 7% | 24 |
| 215 | 7% | 27 |
| 216 | 9% | 28 |
| 217 | 9% | 27 |
| 218 | 9% | 29 |
| 219 | 5% | 14 |
| 220 | 6% | 18 |
| Comparative Example 201 | 16% | 280 |
| Comparative Example 202 | 18% | 310 |

TABLE 18-continued

| Example | Resin (2 g) | Acid Generator (mg) | Basic Compound (5 mg) | Surface Active Agent (10 mg) |
|---|---|---|---|---|
| Comparative Example 202 | Resin (98) (JP-A-2001-109154) | PAG4-5 (40) | 1 | None |

Explanation of the abbreviations in Table 18:
W-1: Megafax F176 (manufactured by Dainippon Ink and Chemicals, Inc.) (fluorine-base)
W-2: Megafac R08 (manufactured by Dainippon Ink and Chemicals, Inc.) (fluorine- and silicon-base)
W-3: Polysiloxane Polymer KP-341 (manufactured by Shin-Etsu Chemical Co., Ltd.) (silicon-base)
W-4: Polyoxyethylene nonyl phenyl ether
W-5: Troysol S-366 (manufactured by Troy Chemical Co., Ltd.)
Basic Compound 1: 1,5-Diazabicyclo[4.3.0]-5-nonene (DBN)
Basic Compound 2: Bis (1,2,2,6,6-pentamethyl-4-piperidyl) sebacate
Basic Compound 3: Trioctylamine
Basic Compound 4: Triphenylimidazole
Basic Compound 5: Antipyrine
Basic Compound 6: 2,6-Diisopropylaniline <Evaluation of Resist>

On a silicon wafer was coated a reflection preventing film (DUV30J manufactured by Brewer Science, Inc.) having a thickness of 160 nm by a spin coater and dried. On the reflection preventing film was coated each of the positive photoresist compositions described above by a spin coater and dried at 150° C. for 90 seconds to prepare a positive photoresist film having a thickness of about 0.4 µm. The photoresist film was exposed using an ArF excimer laser beam (193 nm), subjected to a heat treatment at 125° C. for 90 seconds, developed with a 2.38% by weight aqueous tetrarethylammonium hydroxide solution and rinsed with distilled water to obtain a resist pattern profile.

The resist pattern obtained on the silicon wafer was observed by a scanning electron microscope (SEM) and evaluated in the following manner.

The results obtained are shown in Table 19 below.

(1) Evaluation of Exposure Margin

A fluctuation rate (%) of line width of pattern obtained by varying an exposure amount for reproducing a mask line width of an isolate line of 0.13 µm in a range of from −5% to +5% was designated as an index of the exposure margin. The smaller the value, the more preferable the exposure margin.

(2) Evaluation of Development Defect

On a silicon wafer was coated a reflection preventing film (DUV30J manufactured by Brewer Science, Inc.) having a thickness of 160 nm by a spin coater and dried. On the reflection preventing film was coated each of the positive photoresist compositions described above by a spin coater and dried at 150° C. for 90 seconds to prepare a positive photoresist film having a thickness of about 0.5 µm. The photoresist film was exposed using an ArF excimer laser stepper (ArF Exposure Device 9300 manufacture by ISI Co., Ltd.) through a test mask of contact hole pattern of 0.35 µm (hole duty ratio=1:3) and subjected to a heat treatment at 130° C. for 90 seconds. Then, the resist film was subjected to paddle development with a 2.38% by weight aqueous tetramethylammonium hydroxide (TMAH) solution for 60 seconds, wash with pure water for 30 seconds, and spin dry. With the sample thus obtained, a number of development defects occurred was measured by a machine (KLA-2112 manufactured by KLA-Tencor Corp.). The primary datum was designated as the number of development defects.

It is apparent from the results shown in Table 18 that the positive photosensitive compositions according to the present invention exhibit the excellent exposure margin and the low occurrence of development defects.

The positive photosensitive composition according to the present invention has high sensitivity and a broad defocus latitude in case of the pattern formation using an annular illumination, and hardly cause the sidelobe in case of the pattern formation using a halftone phase shift mask. Also, the positive photosensitive composition exhibits the excellent edge roughness, the excellent exposure margin and the low occurrence of development defects. Therefore, the positive photosensitive composition is suitably employed in lithography using exposure of a far ultraviolet ray including an ArF excimer laser beam.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A positive photosensitive composition comprising (A) an acid generator, which generates an acid upon irradiation of an actinic ray or radiation, represented by formula (I) shown below, and (B) a resin that has a monocyclic or polycyclic alicyclic hydrocarbon structure and is decomposed by the action of an acid to increase a solubility rate in an alkali developing solution:

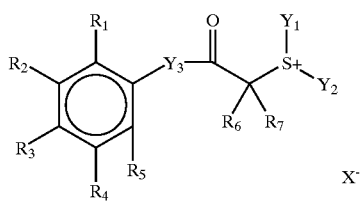

(I)

wherein $R_1$ to $R_5$, which may be the same or different, each represent a hydrogen atom, an alkyl group, an alkoxy group, a nitro group, a halogen atom, an alkoxycarbonyl group or an aryl group, or at least two of $R_1$ to $R_5$ may be combined with each other to form a ring structure; $R_6$ and $R_7$, which may be the same or different, each represent a hydrogen atom, an alkyl group, a cyano group or an aryl group; $Y^1$ and $Y^2$, which may be the same or different, each represent an alkyl group, an aryl group, an aralkyl group or an aromatic group containing a hetero atom, or $Y^1$ and $Y^2$ may be combined with each other to form a ring; $Y^3$ represents a single bond or a divalent connecting group; and X represents a non-nucleophilic anion; provided that at least one of $R_1$ to $R_5$ and at least one of $Y^1$ and $Y^2$ are combined with each other to form a ring or at least one of $R_1$ to $R_5$ and at least one of $R_6$ and $R_7$ are combined with each other to form a ring; and any of $R_1$ to $R_7$ and $Y^1$ to $Y^2$ may be bonded through a connecting group to form a compound having two or more structures represented by formula (I).

2. The positive photosensitive composition as claimed in claim 1, wherein the acid generator of component (A) is a compound represented by the following formula (IA) or (IB):

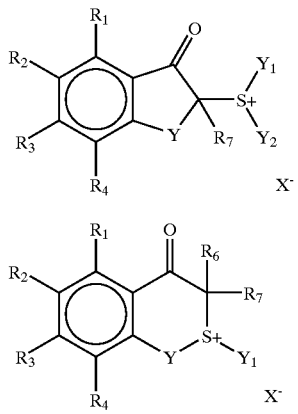

(IA)

(IB)

wherein $R_1$ to $R_4$, $R_6$, $R_7$, $Y^1$, $Y^2$ and X have the same meanings as defined in formula (I), respectively; and Y represents a single bond or a divalent connecting group.

3. The positive photosensitive composition as claimed in claim 1, wherein the positive photosensitive composition further comprises (C) a basic compound.

4. The positive photosensitive composition as claimed in claim 3, wherein the basic compound of component (C) is a compound having a structure selected from an imidazole structure, a diazabicyclo structure, an onium hydroxide structure and an onium carboxylate structure.

5. The positive photosensitive composition as claimed in claim 3, wherein the basic compound of component (C) is a compound selected from a primary aliphatic amine, a secondary aliphatic amine, a tertiary aliphatic amine, a primary oxygen-containing aliphatic amine, a secondary oxygen-containing aliphatic amine, a tertiary oxygen-containing aliphatic amine, an alcoholic nitrogen-containing compound and a substituted aniline.

6. The positive photosensitive composition as claimed in claim 1, wherein the resin of component (B) contains an aliphatic cyclic hydrocarbon group and a repeating unit having a group represented by any one of the following formulae (V-1) to (V-4):

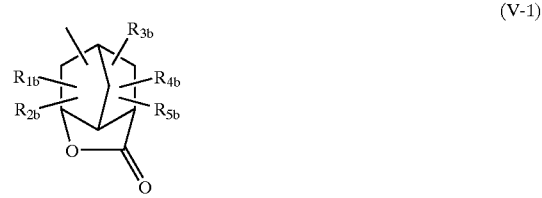

(V-1)

(V-2)

(V-3)

(V-4)

wherein $R_{1b}$, $R_{2b}$, $R_{3b}$, $R_{4b}$ and $R_{5b}$, which may be the same or different, each represent a hydrogen atom, an alkyl group which may be substituted, a cycloalkyl group which may be substituted or an alkenyl group which may be substituted, or two of $R_{1b}$, $R_{2b}$, $R_{3b}$, $R_{4b}$ and $R_{5b}$ may be combined with each other to form a ring.

7. The positive photosensitive composition as claimed in claim 6, wherein the resin of component (B) contains at least one repeating unit selected from a repeating unit having a partial structure including an alicyclic hydrocarbon represented by the following formula (pI), (pII), (pIII), (pIV), (pV) or (pVI):

(pI)

(pII)

-continued (pIII)
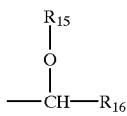

(pIV)
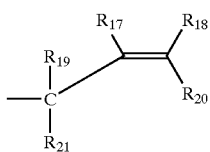

(pV)
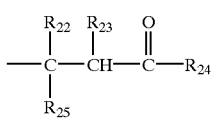

(pVI)
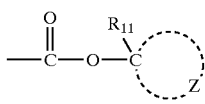

wherein $R_{11}$ represents a methyl group, an ethyl group, an n-propyl group, an isopropyl group, an n-butyl group, an isobutyl group or a sec-butyl group; Z represents an atomic group necessary for forming an alicyclic hydrocarbon group together with the carbon atom; $R_{12}$ to $R_{16}$ each independently represent a straight chain or branched alkyl group having from 1 to 4 carbon atoms or an alicyclic hydrocarbon group, provided that at least one of $R_{12}$ to $R_{14}$, and either $R_{15}$ or $R_{16}$ represents an alicyclic hydrocarbon group; $R_{17}$ to $R_{21}$ each independently represent a hydrogen atom, a straight chain or branched alkyl group having from 1 to 4 carbon atoms or an alicyclic hydrocarbon group, provided that at least one of $R_{17}$ to $R_{21}$ represents an alicyclic hydrocarbon group, and either $R_{19}$ or $R_{21}$ represents a straight chain or branched alkyl group having from 1 to 4 carbon atoms or an alicyclic hydrocarbon group; and $R_{22}$ to $R_{25}$ each independently represent a straight chain or branched alkyl group having from 1 to 4 carbon atoms or an alicyclic hydrocarbon group, provided that at least one of $R_{22}$ to $R_{25}$ represents an alicyclic hydrocarbon group, or $R_{23}$ and $R_{24}$ may be combined with each other to form a ring.

8. The positive photosensitive composition as claimed in claim 1, wherein the positive photosensitive composition further comprises (D) a fluorine and/or silicon surface active agent.

9. The positive photosensitive composition as claimed in claim 1, wherein the positive photosensitive composition further comprises (F) a dissolution inhibiting low molecular weight compound having a group capable of being decomposed by the action of an acid to increase solubility in an alkali developing solution and having a molecular weight of not more than 3,000.

10. The positive photosensitive composition as claimed in claim 1, wherein the positive photosensitive composition further comprises a mixed solvent composed of a solvent containing a hydroxy group and a solvent containing no hydroxy group.

11. The positive photosensitive composition as claimed in claim 1, wherein the resin of component (B) contains a repeating unit having a group represented by the following formula (VII):

(VII)
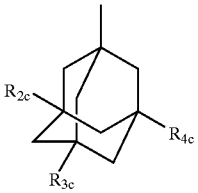

wherein $R_{2c}$, $R_{3c}$ and $R_{4c}$, which may be the same or different, each represent a hydrogen atom or a hydroxy group, provided that at least one of $R_{2c}$, $R_{3c}$ and $R_{4c}$ represents a hydroxy group.

12. The positive photosensitive composition as claimed in claim 1, wherein the resin of component (B) contains a repeating unit having an alicyclic hydrocarbon group and a repeating unit having a group represented by any one of formulae (V-1) to (V-4) shown below and a repeating unit having a group represented by formula (VII) shown below:

(V-1)
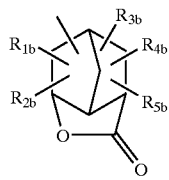

(V-2)
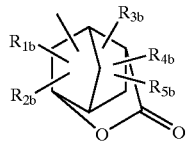

(V-3)
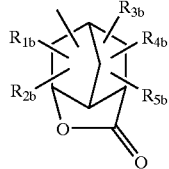

(V-4)
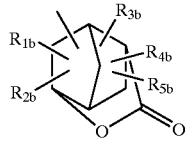

wherein $R_{1b}$, $R_{2b}$, $R_{3b}$, $R_{4b}$ and $R_{5b}$, which may be the same or different, each represent a hydrogen atom, an alkyl group which may be substituted, a cycloalkyl group which may be substituted or an alkenyl group which may be substituted, or two of $R_{1b}$, $R_{2b}$, $R_{3b}$, $R_{4b}$ and $R_{5b}$ may be combined with each other to form a ring,

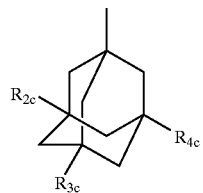

(VII)

wherein $R_{2c}$, $R_{3c}$ and $R_{4c}$, which may be the same or different, each represent a hydrogen atom or a hydroxyl group, provided that at least one of $R_{2c}$, $R_{3c}$ and $R_{4c}$ represents a hydroxy group.

13. The positive photosensitive composition as claimed in claim 10, wherein the solvent containing a hydroxy group is selected from propylene glycol monomethyl ether and ethyl lactate.

14. The positive photosensitive composition as claimed in claim 10, wherein the solvent containing no hydroxy group is selected from propylene glycol monomethyl ether acetate, ethyl ethoxypropionate and 2-heptanone.

* * * * *